US006827411B2

(12) United States Patent
Kubota et al.

(10) Patent No.: US 6,827,411 B2
(45) Date of Patent: Dec. 7, 2004

(54) SOLID SEMICONDUCTOR ELEMENT, INK TANK, INK JET RECORDING APPARATUS PROVIDED WITH INK TANK, LIQUID INFORMATION ACQUIRING METHOD AND LIQUID PHYSICAL PROPERTY CHANGE DISCRIMINATING METHOD

(75) Inventors: Masahiko Kubota, Tokyo (JP); Sadayuki Sugama, Ibaraki (JP); Ichiro Saito, Kanagawa (JP); Hiroyuki Ishinaga, Tokyo (JP); Yoshiyuki Imanaka, Kanagawa (JP); Muga Mochizuki, Kanagawa (JP); Ryoji Inoue, Kanagawa (JP); Maki Nishida, Kanagawa (JP); Takaaki Yamaguchi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 128 days.

(21) Appl. No.: 09/878,946

(22) Filed: Jun. 13, 2001

(65) Prior Publication Data

US 2002/0033855 A1 Mar. 21, 2002

(30) Foreign Application Priority Data

Jun. 16, 2000 (JP) ........................................ 2000/181638
Jun. 16, 2000 (JP) ........................................ 2000/181834
Jun. 16, 2000 (JP) ........................................ 2000/181839
Oct. 6, 2000 (JP) ........................................ 2000/308043

(51) Int. Cl.[7] .......................... B41J 2/195; B41J 29/393; H01L 27/14; H01L 29/82; H01L 29/84

(52) U.S. Cl. ...................... 347/7; 347/2; 347/6; 347/19; 257/414; 257/415; 257/417; 257/419

(58) Field of Search .............................. ; 347/7, 19, 84, 347/85, 86; 257/414, 415, 417, 419; B41J 2/195, 29/393, 3/00, 29/38; H01L 27/14, 29/82, 29/84

(56) References Cited

U.S. PATENT DOCUMENTS 4,130,126 A * 12/1978 Chocholaty et al. ........ 101/364
4,422,085 A * 12/1983 Sumitomo et al. ............ 137/91

(List continued on next page.)

FOREIGN PATENT DOCUMENTS

| | | |
|---|---|---|
| DE | 198 09 855 | 9/1999 |
| EP | 405555 | 1/1991 |
| EP | 412459 | 2/1991 |

(List continued on next page.)

OTHER PUBLICATIONS

N. Kong, "Floating Ink–Density Sensor", IBM Technical Disclosure Bulletin, vol. 21, No. 7, Dec. 1978.

J.W. Haskell, "Ink Concentration Monitor", IBM Technical Disclosure Bulletin, vol. 20, No. 2, Jul. 1977.

*Primary Examiner*—Leonard S. Liang
(74) *Attorney, Agent, or Firm*—Fitzpatrick, Cella, Harper & Scinto

(57) ABSTRACT

There is disclosed a solid semiconductor element which very efficiently detects information about a liquid and bidirectionally exchanges the information with the outside. The solid semiconductor element is disposed in a liquid container, and includes at least energy converting unit, information acquiring unit, and information communicating unit. The energy converting unit converts an electromotive force from the outside to a power, and operates the information acquiring unit and information communicating unit. The information acquiring unit acquires the information about the liquid in which the solid semiconductor element is disposed from the liquid, and the information communicating unit transmits the information acquired by the information acquiring unit to the outside.

9 Claims, 37 Drawing Sheets

U.S. PATENT DOCUMENTS

| | | | | | |
|---|---|---|---|---|---|
| 4,940,997 | A | * | 7/1990 | Hamlin et al. | 347/87 |
| 5,136,309 | A | * | 8/1992 | Iida et al. | 250/231.19 |
| 5,179,389 | A | * | 1/1993 | Arai et al. | 347/14 |
| 5,489,925 | A | * | 2/1996 | Brooks et al. | 347/6 |
| 5,509,140 | A | * | 4/1996 | Koitabashi et al. | 347/100 |
| 5,583,545 | A | | 12/1996 | Pawlowski, Jr. | 347/7 |
| 5,623,290 | A | | 4/1997 | Iida et al. | 347/7 |
| 5,652,610 | A | * | 7/1997 | Kawai et al. | 347/7 |
| 5,729,256 | A | | 3/1998 | Yamanaka et al. | 347/7 |
| 5,735,167 | A | * | 4/1998 | Puukangas et al. | 73/304 C |
| 5,742,308 | A | * | 4/1998 | Cowger et al. | 347/85 |
| 5,743,138 | A | * | 4/1998 | Cheng | 73/322.5 |
| 5,751,319 | A | * | 5/1998 | Robertson et al. | 347/85 |
| 5,841,448 | A | * | 11/1998 | Moriyama et al. | 347/14 |
| 5,877,943 | A | | 3/1999 | Ramamurthi | 361/783 |
| 5,929,885 | A | * | 7/1999 | Nakajima et al. | 347/87 |
| 5,956,061 | A | * | 9/1999 | Ahn | 347/7 |
| 6,010,210 | A | | 1/2000 | Wilson et al. | 347/85 |
| 6,099,101 | A | * | 8/2000 | Maurelli et al. | 347/7 |
| 6,286,921 | B1 | * | 9/2001 | Ochi et al. | 347/7 |
| 6,312,074 | B1 | * | 11/2001 | Walker | 347/7 |
| 6,470,744 | B1 | * | 10/2002 | Usui et al. | 73/290 R |
| 6,652,080 | B2 | * | 11/2003 | Childs et al. | 347/85 |
| 2002/0008724 | A1 | | 1/2002 | Kubota et al. | 347/19 |
| 2002/0030710 | A1 | | 3/2002 | Mochizuki et al. | 347/19 |

FOREIGN PATENT DOCUMENTS

| | | | | | |
|---|---|---|---|---|---|
| EP | 478019 | | | 4/1992 | |
| EP | 585560 | | | 3/1994 | |
| EP | 840098 | | | 5/1998 | |
| EP | 878316 | | | 11/1998 | |
| FR | 2744391 | | | 8/1997 | |
| JP | 56-39414 | | | 4/1981 | |
| JP | 56-80473 | | | 7/1981 | |
| JP | 60-34863 | | | 2/1985 | |
| JP | 62263059 | A | * | 11/1987 | B41J/3/04 |
| JP | 6-143607 | | | 5/1994 | |
| JP | 7-52387 | | | 2/1995 | |
| JP | 11-51861 | | | 2/1999 | |
| JP | 11-138843 | | | 5/1999 | |
| JP | 2000-21838 | | | 1/2000 | |
| JP | 2000-146892 | | | 5/2000 | |
| WO | 97/28001 | | | 8/1997 | |
| WO | 98/04414 | | | 2/1998 | |
| WO | 98/52762 | | | 11/1998 | |

* cited by examiner

SOLID SEMICONDUCTOR ELEMENT, INK TANK, INK JET RECORDING APPARATUS PROVIDED WITH INK TANK, LIQUID INFORMATION ACQUIRING METHOD AND LIQUID PHYSICAL PROPERTY CHANGE DISCRIMINATING METHOD

BACKGROUND OF THE INVENTION

1. Field of the Invention

The present invention relates to a semiconductor element having a function of detecting environmental information, and transmitting/displaying the information to the outside or adjusting environment based on the information, and methods of using this semiconductor element to acquire liquid information and discriminate a physical property change of a liquid.

Moreover, the present invention relates to an apparatus having a function of detecting ink tank inside information (e.g., ink residual amount, pressure, and the like), and transmitting/displaying the information to the outside, an apparatus having a function of adjusting environment based on the information, an ink tank provided with the elements, and ink jet recording apparatuses with the ink tank detachably attachable thereto, such as a facsimile machine, printer and copying machine.

2. Related Background Art

In a conventional ink jet recording apparatus for ejecting an ink via a plurality of jet nozzles disposed in a recording head, scanning a carriage with the recording head mounted thereon with respect to a sheet, and forming an image in a dot pattern, an ink tank with the recording ink contained therein is disposed, and the ink of the ink tank is supplied to the recording head via an ink supply path. Here, an ink residual amount detection apparatus for detecting a residual amount of the ink of the ink tank is brought to practical use, and various proposals have been presented.

For example, as shown in FIG. 1, an apparatus disclosed in Japanese Patent Application Laid-Open No. 6-143607 includes two (pair) of electrodes 702 disposed on an inner bottom surface of an ink tank 701 filled with a nonconductive ink, and a float member 703 floating on an ink surface in the ink tank 701. Two electrodes 702 are connected to a detector (not shown) for detecting a conductive state between the electrodes. Moreover, on the float member 703, an electrode 704 is disposed opposite to the electrode 702. When the ink in the ink tank 701 is consumed, a position of the float member 703 is lowered, and the electrode 704 contacts the electrodes 702. Then, the detector detects the conductive state between the electrodes 702. Thereby, it is detected that there is no ink in the ink tank 701, and an operation of an ink jet recording head 705 is stopped.

Moreover, according to Japanese Patent No. 2947245, an ink jet printer ink cartridge 805 is disclosed. As shown in FIG. 2, a lower portion of the cartridge is formed in a funnel shape toward a bottom surface thereof, two conductors 801, 802 are disposed on the bottom surface, and a metal ball 804 whose specific weight is smaller than that of an ink 803 is disposed in the cartridge. In this constitution, when the ink 803 is consumed and reduced, the liquid surface of the ink 803 is lowered. Accordingly, the position of the metal ball 804 floating on the surface of the ink 803 is lowered. When the liquid surface of the ink 803 is lowered to reach the bottom surface of an ink cartridge housing, the metal ball 804 contacts two conductors 801, 802. Then the conductors 801, 802 become conductive and a current flows therebetween. When the flowing current is detected, an ink end state can be detected. When the ink end state is detected, a user is notified of information indicating the ink end state.

In either one of the aforementioned constitutions, absence of the ink is detected by detecting whether or not there is conduction between the electrodes disposed in the ink tank. Therefore, it is necessary to dispose a detecting electrode in the ink tank. Additionally, while the ink exists in the ink tank, the current is prevented from flowing between the electrodes via the ink. Therefore, a metal ion cannot be used in an ink component, or another restriction is imposed on the ink for use.

Moreover, in the aforementioned constitution, only the presence/absence of the ink can be detected, and other tank inside information cannot be notified to the outside. For example, an ink residual amount, pressure information in the ink tank, ink physical property change, and the like are important parameters for constantly operating an ink jet head with a stable discharge amount. There is a demand for a tank by which an outside ink jet recording apparatus is notified of a tank inner pressure constantly changing with ink consumption in the tank in real time, or the change of the ink physical properties can be transmitted to the outside.

Furthermore, there is a demand for an ink tank by which the detected information in the ink tank is one-directionally transmitted to the outside, and additionally the inner information can bidirectionally be exchanged in response to a request from the outside.

In order to develop the aforementioned ink tank, the present inventor et al. have noted a ball semiconductor, manufactured by Ball Semiconductor Co., Ltd., for forming a semiconductor integrated circuit on a spherical surface of a silicon ball with a diameter of 1 mm. This ball semiconductor has a spherical shape. Therefore, when the semiconductor is contained in the ink tank, the detection of the environmental information and the bi-directional exchange of the information with the outside can expectedly efficiently be performed as a planar shape. However, when the semiconductor having such function is searched, only a technique of connecting the ball semiconductors with each other via an electric wiring, and the like are found (see U.S. Pat. No. 5,877,943). It is therefore necessary to develop an element itself which has the aforementioned function. Moreover, in order to effectively apply the element to the ink tank, there are some inherent problems.

First, a power for activating the element contained in the tank is supplied. When a power source for starting the element is disposed in the ink tank, the tank is enlarged in size. Even when the power source is disposed outside the tank, means for connecting the power source to the element is necessary. A tank manufacturing cost increases, a tank cartridge becomes expensive, and the element has to be started from the outside in a non-contact manner.

Secondly, the element sometimes has to float on the ink surface of the ink tank or in the ink at a given distance from the liquid surface. For example, in order to monitor a fluctuation of a negative pressure amount with time with the ink consumption in the ink tank, the element is preferably positioned on the ink surface. However, since the element is formed of silicon having a specific weight larger than that of water, it is generally difficult to float the element in the ink.

Thirdly, in a color printer, it is requested to individually and independently obtain respective ink tank inside information in response to an inquiry from the outside for respective color ink tanks and transmit the information.

Fourthly, in one mode of the tank for the ink jet head for practical use, a container is divided into a first chamber in which a porous or fibrous negative pressure generating member for generating a desired negative pressure with respect to the ink jet recording head is contained in an atmosphere connection state, and a second chamber in which a recording liquid is contained as it is. A connection path is disposed in a bottom portion of a wall for partitioning the first and second chambers in the container. This tank has a large ink storage amount and can advantageously stabilized the negative pressure with respect to the ink jet recording head as compared with a tank constituted only of the chamber in which the negative pressure generating member is contained. Therefore, there is a demand especially for an ink tank having a function such that the information such as the ink residual amount in the tank, ink physical property change, and inner pressure state can bidirectionally be exchanged with the outside in the aforementioned tank structured of two chambers.

SUMMARY OF THE INVENTION

An object of the present invention is to provide a solid semiconductor element which can very efficiently detect information about a liquid and bidirectionally exchange the information with the outside.

Another object of the present invention is to provide a solid semiconductor element which detects detailed information in an ink tank in real time and can bidirectionally exchange the information with an outside ink jet recording apparatus, an ink tank provided with the semiconductor element, and an ink jet recording apparatus provided with the tank.

Further object of the present invention is to provide a method in which an ink state change (pH change, concentration change, density change) in the ink tank can be detected with time. Moreover, there is provided a method of indicating to the outside that the apparatus cannot be used in the head with the ink supplied thereto and limiting the use of the apparatus.

Furthermore, when the density change is detected, an ink viscosity and surface tension change amount can also be estimated. Therefore, another object of the present invention is to provide a method of setting an optimum head driving condition and keeping a stable discharge property.

Additionally, an object of the present invention is to provide a liquid container provided with a solid semiconductor element in which liquid chemical physical properties information (pH change, concentration change, density change) and physical properties information (liquid viscosity, surface tension, negative pressure amount) are detected, detected information can bidirectionally be exchanged with the outside, and a tank inner state can be adjusted (negative pressure adjustment), and a liquid discharge recording apparatus provided with the liquid container.

To achieve the aforementioned objects, according to the present invention, there is provided a solid semiconductor element disposed in contact with a liquid, the element comprising:

information acquiring (communicating) means for acquiring liquid chemical property information including at least one of a hydrogen ion concentration index, a concentration, and a density of the liquid;

information transmission means for displaying or transmitting the information acquired by the information acquiring means to the outside; and energy converting means for converting an energy applied from the outside to an energy of a type different from the type of the applied energy to operate the information acquiring means and the information transmission means.

The solid semiconductor element of the present invention is disposed in contact with the liquid as an object from which the information is to be acquired. In this state, the information acquiring means acquires the information about the liquid, and the information transmission means transmits the information to the outside. The energy for operating the information acquiring means and information transmission means is obtained by converting the energy from the outside to the different type of energy by the energy converting means. Since the solid semiconductor element has a function of acquiring the information about the liquid and transmitting the information to the outside in this manner, the information can three-dimensionally be acquired and transmitted. Therefore, as compared with use of a planar semiconductor element, since little restriction is imposed on a direction of acquirement and transmission of the information, the information about the liquid can efficiently be acquired and transmitted to the outside.

The element further comprises information storing means for storing information to be compared with the acquired information, and discrimination means for comparing the information stored in the information storing means with the information acquired by the information acquiring means to discriminate a need for transmission of the information to the outside. Therefore, the acquired information is transmitted to the outside if necessary. Furthermore, when receiving means for receiving a signal from the outside is added, the information is acquired in response to the received signal, a result of the comparison with the stored information is transmitted to the outside together with the acquired information, and the signal can bidirectionally be transmitted/received with respect to an outside apparatus.

Examples of the information about the liquid include a pH and pressure of the liquid, and particularly include a residual amount of the liquid in the container when the liquid is contained in the container. To obtain the liquid residual amount, the solid semiconductor element is preferably disposed to float on a liquid surface or in the liquid, and the constitution may also include a hollow portion.

The solid semiconductor element of the present invention is preferably used to obtain the information about a recording ink in a field of ink jet recording. The recording ink is generally contained in the ink tank. It is very important to obtain the information about the ink in the ink tank when a high-quality recording is performed.

Therefore, the ink tank of the present invention contains the ink to be supplied to a discharge head for discharging the ink, and the solid semiconductor element of the present invention is disposed to contact the ink. The number of solid semiconductor elements may be one or plural. When a plurality of solid semiconductor elements are disposed, the respective elements may acquire different information, or exchange the information with one another.

Moreover, according to the present invention there is provided an ink tank which contains an ink to be supplied to an ejection head for ejecting the ink, the ink tank comprising:

information acquiring means for acquiring ink chemical property information including at least one of a hydrogen ion concentration index, a concentration, and a density of the ink;

information transmission means for displaying or transmitting the information acquired by the information acquiring means to the outside; and energy converting means for converting an energy applied from the outside to an energy of a type different from the type of the applied energy to operate the information acquiring means and the information transmission means.

An ink jet recording apparatus of the present invention is provided with an ejection head for ejecting an ink, and the ink tank of the present invention in which the ink to be supplied to the ejection head is contained.

According to the present invention, there is provided a liquid change information acquiring method of using a solid semiconductor element disposed in contact with a liquid, the element comprising:

information acquiring means for acquiring information about the liquid;

information transmission means for displaying or transmitting the information acquired by the information acquiring means to the outside; and energy converting means for converting an energy applied from the outside to an energy of a type different from the type of the applied energy to operate the information acquiring means and the information transmission means.

Furthermore, according to the present invention there is provided a liquid physical property change judging method of using a solid semiconductor element disposed in contact with a liquid, the element comprising:

information acquiring means for acquiring information about the liquid;

discrimination means for discriminating a liquid physical property change based on the information acquired by the information acquiring means and a pre-stored data table;

information transmission means for displaying or transmitting the information acquired by the discrimination means to the outside; and energy converting means for converting an energy applied from the outside to an energy of a type different from the type of the applied energy to operate the information acquiring means, the discrimination means and the information transmission means.

According to the aforementioned method, the liquid physical property change can be detected with time. For example, when a disadvantage is possibly generated by the use, this is notified to the outside to restrict the use. Particularly for use in the ink tank, a viscosity and surface tension change amount of the ink as the liquid are estimated, and an optimum recording head driving condition can be set.

Furthermore, according to the present invention, there is provided a discriminating method of acquiring information about a liquid with time, and estimating a change amount of the liquid from information indicating a change of the information about the liquid with time, wherein abnormal change information about the liquid is discriminated.

For example, the amount of the ink contained in the ink tank usually linearly decreases with consumption, but rapidly increases because of replenishment, or an ink component changes. This can be judged as abnormal change information according to the method.

To achieve the aforementioned objects, according to the present invention, there is provided a solid semiconductor element comprising: receiving and energy converting means for receiving a signal of an electromagnetic wave from the outside in a non-contact manner, and converting the electromagnetic wave to a power by electromagnetic induction; information acquiring means for acquiring outside environmental information; information storing means for storing information to be compared with the information acquired by the information acquiring means; discrimination means for comparing the information acquired by the information acquiring means with the corresponding information stored in the information storing means to discriminate a need for information transmission when the signal of the electromagnetic wave received by the receiving and energy converting means satisfies a predetermined response condition; and information transmission means for displaying or transmitting the information acquired by the information acquiring means to the outside when the discrimination means discriminates the need for the information transmission. The information acquiring means, the information storing means, the discrimination means, and the information transmission means are operated by the power converted by the receiving and energy converting means.

An electromagnetic induction frequency or a communication protocol can be applied as the response condition.

For the information transmission means, the power converted by the receiving and energy converting means is supposedly converted to a magnetic field, a light, a shape, a color, a radio wave, or a sound as the energy for displaying or transmitting the information to the outside.

The receiving and energy converting means having a conductor coil and oscillation circuit for generating the power with an outside resonance circuit by electromagnetic induction can be applied.

In this case, the conductor coil is formed to be wound around an outer surface of the solid semiconductor element.

Moreover, the element preferably comprises a hollow portion for floating the element on a liquid surface or in a predetermined position in the liquid. In this case, a gravity center of the solid semiconductor element floating in the liquid is positioned below a center of the element. The floating element preferably rocks stabily without rotating in the liquid. A metacenter of the solid semiconductor element is preferably constantly positioned above the gravity center of the solid semiconductor element.

Furthermore, according to the present invention there is provided an ink tank in which at least one of solid semiconductor element is disposed.

In this case, the response condition of the solid semiconductor element preferably differs with the ink in the tank. Concretely, the response condition of the solid semiconductor element differs with an ink color, a color material concentration, or a physical property in the ink tank.

Additionally, according to the present invention, there is provided an ink jet recording apparatus in which a plurality of ink tanks are disposed.

In this case, the ink jet recording apparatus preferably comprises communication means for transmitting/receiving an electromagnetic wave with respect to the solid semiconductor element in each ink tank. Furthermore, the communication means having a resonance circuit for emitting the electromagnetic wave can be applied.

Moreover, according to the present invention, there is provided a communication system in which a solid semiconductor element is used, comprising: a plurality of liquid containers in which the respective solid semiconductor elements are disposed; an oscillation circuit formed in the solid semiconductor element and provided with a conductor coil; information acquiring means for acquiring the information in the container; receiving means for receiving a signal from the outside; information transmission means for transmitting the information to the outside when a predetermined response condition is satisfied; an outside resonance circuit, disposed outside the plurality of liquid containers, for generating a power with respect to the oscillation circuit of the solid se miconductor element by electromagnetic induction; and outside communication means for bidirectionally communicating with the receiving means and the information transmission means of the solid semiconductor element.

In this case, the response condition allows the electromagnetic induction frequency or the communication protocol to differ with each container.

Furthermore, the gravity center of the solid semiconductor element floating in the liquid is positioned below the center of the element. The floating element preferably rocks stabily without rotating in the liquid. The metacenter of the solid semiconductor element is preferably constantly positioned above the gravity center of the solid semiconductor element.

As described above, when the signal of the electromagnetic wave is applied to the solid semiconductor element from the outside in the non-contact manner, the receiving and energy converting means converts the electromagnetic wave to the power, and the information acquiring means, discrimination means, information storing means, and information transmission means are started by the converted power. The discrimination means allows the information acquiring means to acquire element environmental information when the signal of the electromagnetic wave received by the receiving and energy converting means satisfies the predetermined response condition, compares the acquired information with the corresponding information stored in the information storing means, and discriminates the need for information transmission. Moreover, when it is judged that the information transmission is necessary, the discrimination means allows the information transmission means to transmit the acquired information to the outside.

In this manner, since the solid semiconductor element has the communication function of acquiring the environmental information and transmitting the information to the outside only when the signal of the electromagnetic wave from the outside satisfies the predetermined response condition, the environmental information of the respective elements are independently acquired. Moreover, since the information can three-dimensionally be acquired/transmitted, the direction of the information transmission is little restricted as compared with the use of the planar semiconductor element. Therefore, the environmental information can efficiently be acquired and transmitted to the outside.

Moreover, since at least one solid semiconductor element is disposed in the ink tank, the information about the ink contained in the ink tank, pressure in the tank, and the like can be transmitted to the outside, for example, to the ink jet recording apparatus in real time. This is advantageous, for example, in stabilizing ink jet ejection by controlling the negative pressure amount in the tank, which changes with ink consumption every moment.

Particularly, for the plurality of ink tanks with the respective solid semiconductor elements disposed therein, only when the received electromagnetic wave signal satisfies the predetermined response condition, the information is acquired in response to the received signal, and a result of comparison/discrimination with the stored information is transmitted to the outside together with the acquired information. Therefore, when the response condition is changed for each tank, the information for the respective ink tanks can independently be obtained. Therefore, a user can replace the ink tank in which the ink is used up without mistake.

Furthermore, the power for operating the solid semiconductor element is supplied in the non-contact manner in the constitution. Therefore, it is unnecessary to dispose a power source for starting the element in the ink tank or to connect a power supplying wiring to the element. The constitution can be used in a place where it is difficult to dispose a wiring directly connected to the outside.

For example, when the conductor coil of the oscillation circuit is formed to be wound around the outer surface of the solid semiconductor element, the power is generated in the conductor coil by electromagnetic induction with respect to the outside resonance circuit, and the power can be supplied to the element in the non-contact manner.

In this case, since the coil is wound around the outer surface of the element, a size of inductance of the coil changes in accordance with an ink residual amount, ink concentration, and ink pH in the ink tank. Therefore, since an oscillation frequency of the oscillation circuit is changed in accordance with the inductance change, the ink residual amount, and the like in the ink tank can also be detected based on the change of the oscillation frequency.

Moreover, since the solid semiconductor element has the hollow portion for floating in the liquid and the gravity center of the element is positioned below the center of the element, for example, the recording head and ink tank mounted on the ink jet recording apparatus serially operate. Even when the ink in the ink tank vertically and horizontally rocks, the element floats steadily in the ink in the ink tank, and the information about the ink, pressure in the tank, and the like can precisely be detected. Additionally, the coil of the oscillation circuit formed on the element is held in a stable position with respect to the coil of the outside resonance circuit, and stable bidirectional communication is also constantly enabled.

Moreover, according to the present invention, there is provided a liquid container in which an ink to be supplied to a liquid ejection head for ejecting a liquid droplet is contained, the liquid container comprising: a first chamber which is partially connected to atmosphere and in which an absorber for absorbing a liquid is contained; a second chamber which is closed from the outside and in which the liquid is contained; a connection path, disposed in the vicinity of a bottom portion of the container, for connecting the first chamber to the second chamber; and a supply port which is disposed in the first chamber, and via which the liquid is supplied to the liquid ejection head. First monitor means for monitoring a liquid amount of the first chamber is disposed in the first chamber. A flow rate adjustment apparatus for adjusting a flow rate of the connection path in accordance with information from the first monitor means is disposed in the connection path.

In this case, second monitor means for monitoring the liquid amount of the second chamber is disposed in the second chamber, and the flow rate adjustment apparatus is preferably controlled in accordance with the information from the second monitor means.

As the first monitor means, a first solid semiconductor element is preferably used which comprises: pressure detection means for detecting a pressure fluctuation of the liquid; information transmission means for transmitting pressure information obtained by the pressure detection means to the flow rate adjustment apparatus; and energy converting means for converting an energy applied from the outside to an energy different from the applied energy to operate the pressure detection means and the information transmission means. The solid semiconductor element requires no power wiring, and can freely be disposed in any position without being restricted.

Particularly, the first solid semiconductor element is preferably disposed above a liquid surface of the first chamber when a liquid supply to the first chamber from the second chamber is possibly interrupted, and in a position in which the fluctuation of the pressure can be detected. When the element is disposed in such position, the interruption of the liquid supply can be detected beforehand.

The flow rate adjustment apparatus is preferably a second solid semiconductor element which comprises: at least receiving means for receiving the pressure information from the first monitor means; an open/close valve which operates in response to the received pressure information; and energy converting means for converting an energy applied from the outside to an energy different from the applied energy to operate the receiving means and the open/close valve. Because no power wiring is required, and the element can be disposed even in a narrow position.

Moreover, the second monitor means is preferably a third solid semiconductor element which comprises: at least residual amount detection means for detecting a liquid residual amount; information transmission means for transmitting residual amount information obtained by the residual amount detection means to the flow rate adjustment apparatus; and energy converting means for converting an energy applied from the outside to an energy different from the applied energy to operate the residual amount detection means and the information transmission means. Because the element can be disposed without requiring any power wiring.

Furthermore, according to the present invention, there is provided a liquid ejection recording apparatus comprising: a liquid ejection head for ejecting a recording liquid droplet; and a liquid container in which the liquid to be supplied to the liquid ejection head is contained. In this case, the liquid ejection head preferably ejects the liquid droplet via a nozzle utilizing a film boiling caused when the heat energy is applied to the liquid. However, the present invention is not limited to the aforementioned mode. In another mode of the liquid ejection head of the present invention, an electric signal is inputted to a thin film element, the thin film element is minutely displaced, and the liquid is ejected via the nozzle.

Additionally, the "metacenter" described herein indicates an intersection of an action line of a balanced weight with an action line of a buoyancy during tilting.

Moreover, examples of a "solid shape" of the "solid semiconductor element" include various cubical shapes such as a triangle pole, sphere, hemisphere, square pole, rotary ellipse, and uniaxial rotator.

DETAILED DESCRIPTION OF THE PREFERRED EMBODIMENTS

Embodiments of the present invention will be described hereinafter with reference to the drawings. Particularly, the embodiment in which respective solid semiconductor elements are disposed in respective color ink tanks will be described in detail. Additionally, the element is not contained only in the ink tank. Even when the element is disposed and used in another object, a similar effect is obtained.

(First Embodiment)

Figure 1:
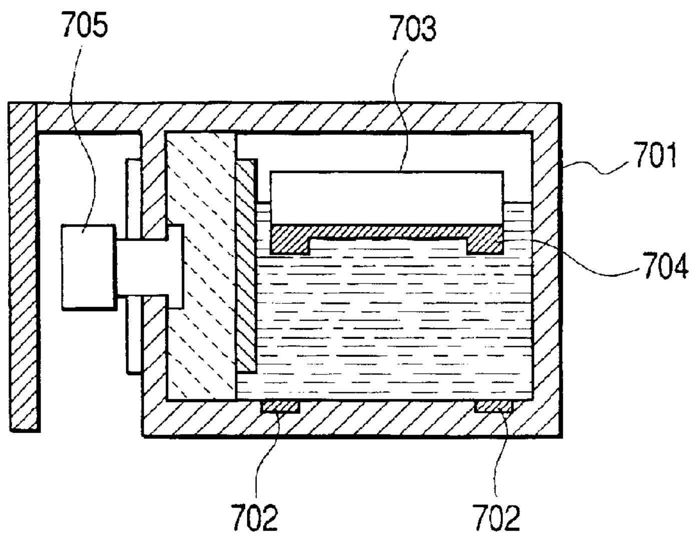
FIG. 1 is a diagram showing one example of a conventional ink residual amount detection apparatus.
Figure 2:
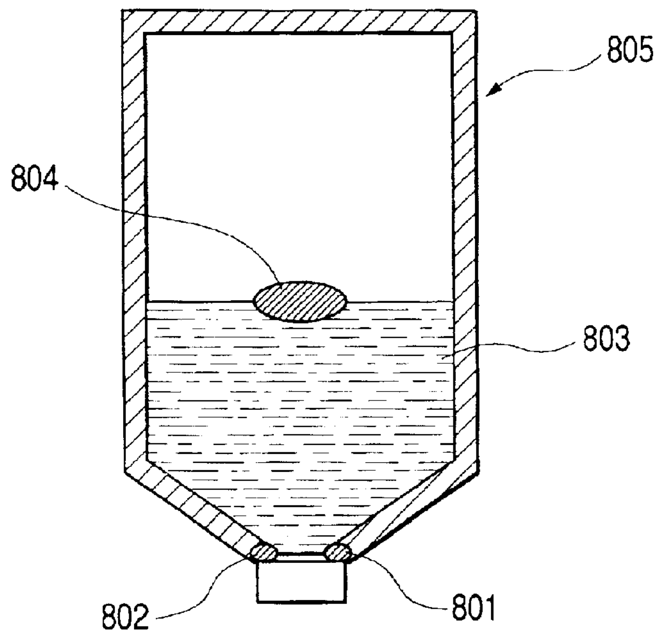
FIG. 2 is a diagram showing another example of the conventional ink residual amount detection apparatus.
Figure 3:
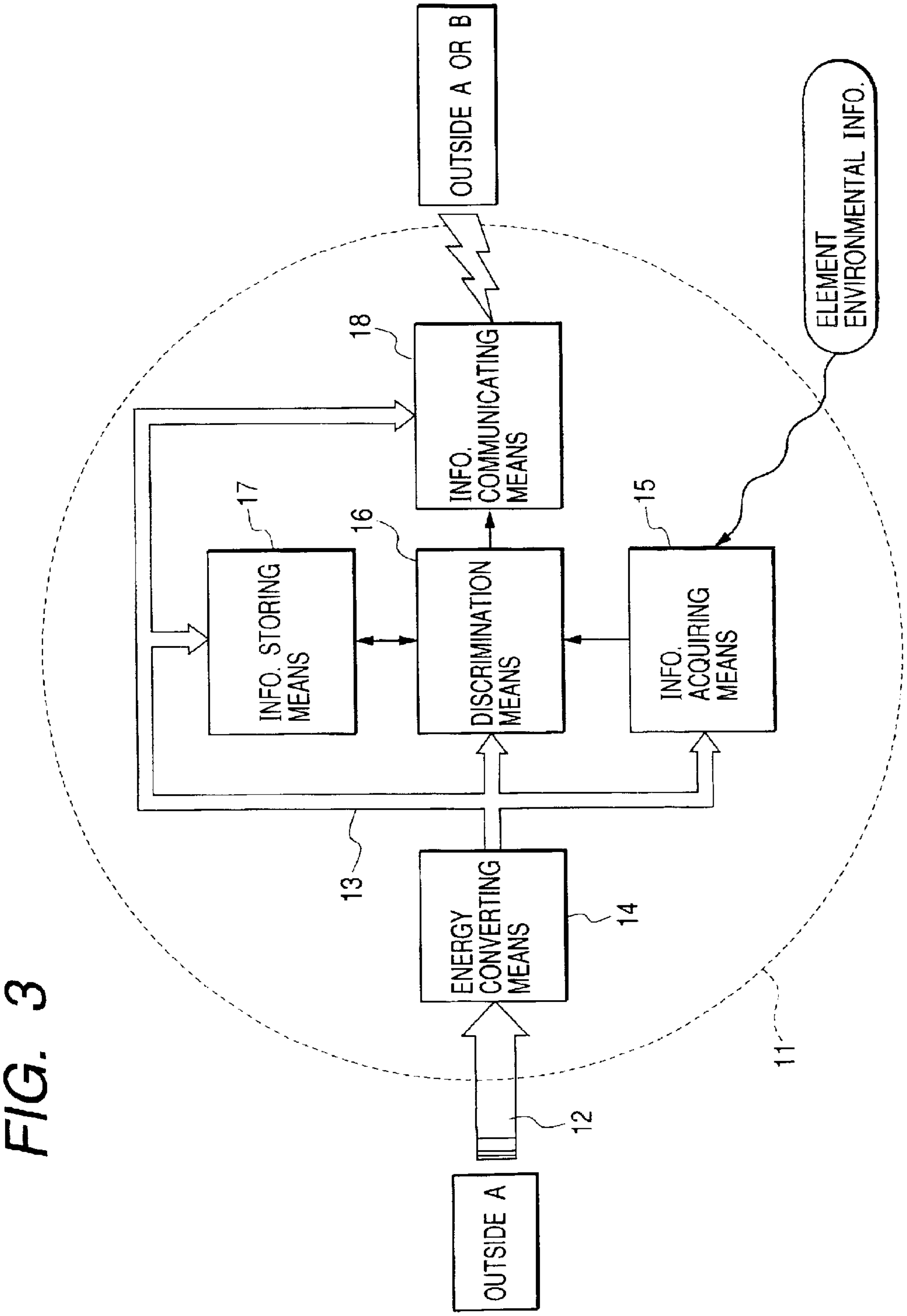
FIG. 3 is a block diagram showing an inner constitution of a solid semiconductor element according to a first embodiment of the present invention and an exchange of the element with the outside.

FIG. 3 is a block diagram showing an inner constitution of the solid semiconductor element according to a first embodiment of the present invention and an exchange of the element with the outside. A solid semiconductor element (hereinafter referred to only as an "element" 11 shown in FIG. 3 is disposed in an ink tank, and includes energy converting means 14 for converting an electromotive force 12 supplied to the element 11 from an outside A to a power 13, information acquiring means 15 started by the power 13 converted by the energy converting means 14, discrimination means 16, information storing means 17, and information communicating electromagnetic induction, heat, light, ray, and the like can be applied to the electromotive force supplied to operate the element 11. Moreover, at least the energy converting means 14 and information acquiring means 15 are preferably formed on the surface of the element 11 or in the vicinity of the surface.

The information acquiring means 15 acquires information (ink information) about the ink in the ink tank as environmental information of the element 11, and outputs the information to the discrimination means 16. The discrimination means 16 compares the ink information obtained from the information acquiring means 15 with information stored in the information storing means 17, and judges whether or not it is necessary to transmit the acquired ink information to the outside. The information storing means 17 stores various conditions for comparison with the obtained ink information and ink information itself obtained from the information acquiring means 15 as a data table. The information communicating means 18 converts the power applied by the energy converting means 14 to an energy for transmitting the ink information to the outside A or an outside B, and transmits the ink information to the outside A or B based on a command from the discrimination means 16. Here, the outside B is an object different from the outside A as a supply source of the electromotive force 12, and includes an ink jet recording apparatus on which the ink tank with the element 11 contained therein is mounted, and additionally organs of human senses of sight and hearing.

Figure 4:
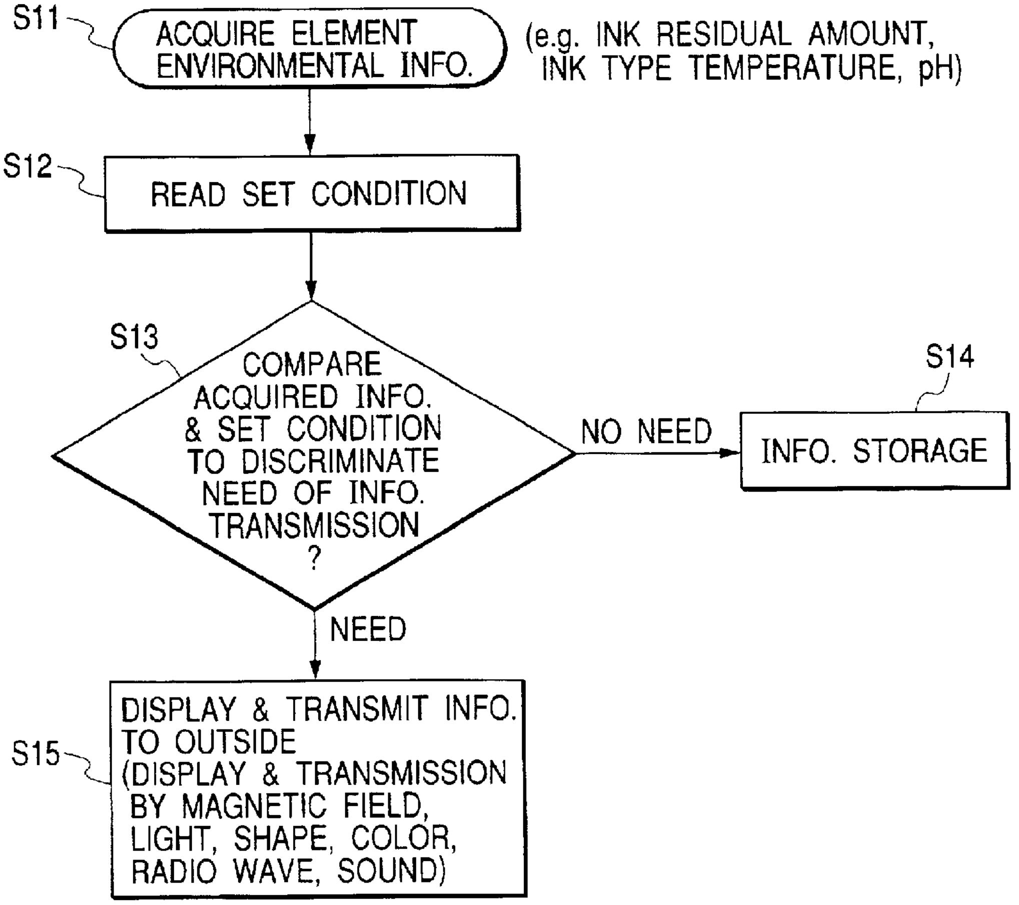
FIG. 4 is a flowchart showing an operation of the solid semiconductor element shown in FIG. 3.

FIG. 4 is a flowchart showing an operation of the element shown in FIG. 3. Referring to FIGS. 3 and 4, when the electromotive force 12 is applied to the element 11 from the outside A, the energy converting means 14 converts the electromotive force 12 to the power 13, and the information acquiring means 15, discrimination means 16, information storing means 17, and information communicating means 18 are started by the power 13.

The started information acquiring means 15 acquires the ink information in the ink tank as the environmental information of the element 11, such as an ink residual amount, ink type, temperature, and pH (step S11 of FIG. 4). Subsequently, the discrimination means 16 reads a condition for referring to the acquired tank inside information from the information storing means 17 (step S12 of FIG. 4), and compares the read condition with the acquired tank inside information, and discriminates a need for information transmission (step S13 of FIG. 4). Here, for discrimination based on the condition preset in the information storing means 17, for example, the need for tank replacement is discriminated when a raw ink residual amount is 2 ml or less, or when the ink pH largely changes.

In the step S13, the discrimination means 16 judges that it is unnecessary to transmit the tank inside information to the outside, and the existing ink tank inside information is stored in the information storing means 17 (step S14 of FIG. 4). Additionally, when the information acquiring means 15 next acquires the ink tank inside information, the discrimination means 16 may compare the acquired information with the stored information.

Moreover, in the step S13, the discrimination means 16 judges that it is necessary to transmit the ink tank inside information to the outside, and further the information communicating means 18 converts the power 13 converted by the information acquiring means 15 to the energy for transmitting the ink tank inside information to the outside. A magnetic field, light, shape, color, radio wave, sound, and the like can be used as the transmitting energy. For example, when it is judged that the ink residual amount is 2 ml or less, a sound is emitted to transmit the need for tank replacement to the outside B (e.g., ink jet recording apparatus) (step S15 of FIG. 4). Moreover, a transmission destination is not limited to the ink jet recording apparatus, and particularly the light, shape, color, sound, and the like may be transmitted to the human senses of sight and hearing. Furthermore, when it is judged that the raw ink residual amount is 2 ml or less, the sound is emitted. When the ink pH largely changes, light is emitted. A transmission method may be changed in accordance with the information in this manner.

For use in a serial type ink jet recording apparatus, examples of a preferable position in which means for supplying the electromotive force as the outside energy to the element 11 is disposed include a recording head, carriage, recording head recovery position, carriage return position, and the like. Alternatively, when an apparatus having the means for supplying the electromotive force is used, an inside state of the ink tank can be known without the ink jet recording apparatus. For example, a quality of the ink tank can be tested without actually attaching the ink tank to the ink jet recording apparatus in a factory or a store.

According to the first embodiment, since the element 11 includes the information acquiring means 15, it is unnecessary to connect an electric wiring directly to the outside. The element 11 can be used even in a position in which it is difficult to connect the electric wiring directly to the outside, for example, in the ink as described later with reference to FIG. 13 to FIGS. 16A to 16C or any position in the object. When the element 11 is disposed in the ink, the ink state can accurately be grasped in real time.

Moreover, since the element 11 includes the information acquiring means 15, it is unnecessary to dispose means (power source in the present embodiment) for storing the electromotive force for operating the element 11 in the element 11. Therefore, the element 11 can be miniaturized, and used even in a narrow position, in the ink as described later with reference to FIG. 13 to FIGS. 16A to 16C, or in any position in the object. Additionally, the electromotive force is supplied to the element 11 in the non-contact manner with respect to the element 11 in the first embodiment. However, after the electromotive force is supplied by temporary contact with the outside, the outside may be disconnected.

Here, for the energy converting means 14, an example in which electromagnetic induction is utilized to generate the power will be described.

Figure 5:
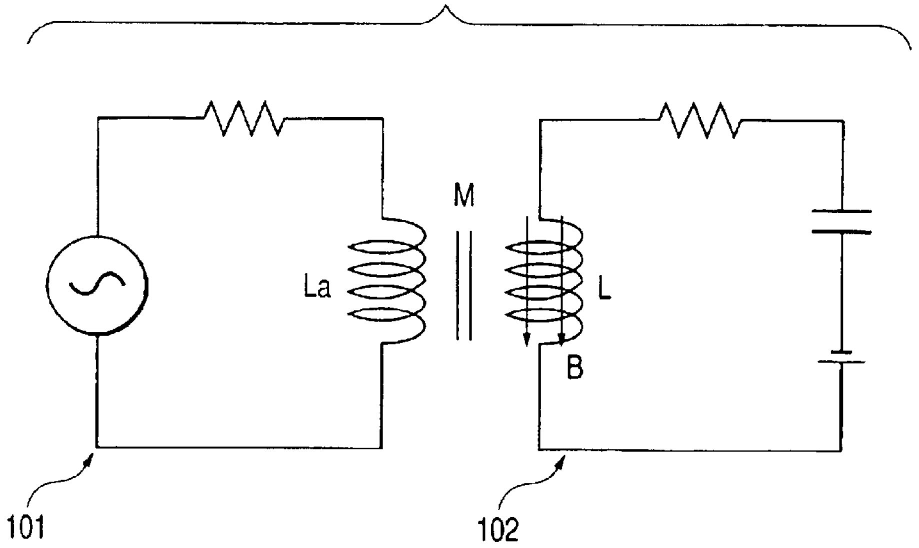
FIG. 5 is an explanatory view showing a power generation principle of energy converting means as a constituting element of the solid semiconductor element of the present invention.

FIG. 5 is an explanatory view showing a power generation principle of the energy converting means as a constituting element of the solid semiconductor element of the present invention.

In FIG. 5, an outside resonance circuit 101 having a coil $L_a$, and oscillation circuit 102 having a coil L are disposed while the opposite coils $L_a$, L are adjacent to each other. When a current $I_a$ is passed through the coil $L_a$ via the outside resonance circuit 101, a magnetic flux B is generated through the coil L of the oscillation circuit 102 by the current $I_a$. Here, when the current $I_a$ is changed, the magnetic flux B through the coil L changes, and an induced electromotive force V is generated in the coil L. Therefore, the oscillation circuit 102 is formed as the energy converting means in the element 11. For example, in the ink jet recording apparatus outside the element 11, the outside resonance circuit 101 is disposed in such a manner that the coil L of the element-side oscillation circuit 102 is adjacent to the coil $L_a$ of the resonance circuit 101. Thereby, the power for operating the element 11 can be generated by the induced electromotive force by electromagnetic induction from the outside.

Since the magnetic flux B passed through the coil L of the oscillation circuit 102 formed as the energy converting means in the element 11 is proportional to a product of a winding number $N_a$ and current $I_a$ of the outside resonance circuit 101, the magnetic flux is represented as follows, using a proportional constant k.

$$B=kN_aI_a \tag{1}$$

Moreover, when the winding number of the coil L is N, the electromotive force V generated in the coil L is as follows.

$$\begin{aligned} V &= -N\frac{dB}{dt} \\ &= kN_aN\frac{dI_a}{dt} \\ &= -M\frac{dI_a}{dt} \end{aligned} \tag{2}$$

Here, when a permeability of a magnetic center of the coil L is $\mu_a$, magnetic field is H, and a distance between the coil $L_a$ of the outside resonance circuit 101 and the coil L formed in the element 11 is z, the magnetic flux B is represented as follows.

$$\begin{aligned} B &= \mu_a H(z) \\ &= \frac{\mu_a N_a I_a r_a^2}{2(r_a^2+z^2)^{3/2}} \end{aligned} \tag{3}$$

Moreover, a mutual inductance M of the equation (2) is represented as follows.

$$\begin{aligned} M &= \frac{\mu N}{\mu_a I_a}\int_s B\cdot dS \\ &= \frac{\mu\mu_a r_a^2 N_a NS}{2\mu_0(r_a^2+z^2)^{3/2}} \end{aligned} \tag{4}$$

Here, $\mu_o$ is a permeability in vacuum.

Moreover, an impedance Z of the oscillation circuit 102 formed in the element 11 is represented as follows.

$$Z(\omega) = R + j\left(\omega L - \frac{1}{\omega L}\right) \tag{5}$$

An impedance $Z_a$ of the outside resonance circuit 101 is represented as follows.

$$Z_a(\omega_0) = R_a + j\omega L_a - \frac{\omega^2 M^2}{Z(\omega)} \tag{6}$$

Here, J denotes magnetization.

When the outside resonance circuit 101 resonates (current value: $I_a$ is maximized), an impedance $Z_o$ is represented as follows.

$$Z_0(\omega_0) = R_a + jL_a\omega_a - \frac{\omega_0^2 M^2}{R} \tag{7}$$

A phase delay of ϕ of the oscillation circuit 102 is as follows.

$$\tan\phi = \frac{jL_a\omega_0 - \frac{\omega_0^2 M^2}{R}}{R} \tag{8}$$

Furthermore, a resonance frequency $f_o$ of the outside resonance circuit 101 is obtained by equation (9).

$$f_0 = \frac{1}{2\pi\sqrt{LC}} \tag{9}$$

From the above relation, when the impedance Z of the oscillation circuit 102 formed in the element 11 changes in accordance with the ink change in the ink tank, the frequency of the outside resonance circuit 101 changes, and the ink change is reflected in an amplitude and phase difference of the impedance $Z_a$ of the outside resonance circuit 101. Furthermore, the phase difference and amplitude also include the ink residual amount (i.e., change of Z).

For example, when the resonance frequency $f_o$ of the outside resonance circuit 101 is changed, the output (impedance Z) from the oscillation circuit 102 formed in the element 11 changes in accordance with an environmental change. Therefore, when dependence on the frequency is detected, the presence/absence of the ink or the ink residual amount can be detected.

Therefore, the oscillation circuit 102 formed in the element 11 serves not only as the energy converting means 14 for generating the power but also as a part of the information acquiring means 15 for detecting the ink change in the ink tank from the relation between the oscillation circuit 102 and the outside resonance circuit 101.

An constitution example of the aforementioned ink tank containing the element 11 to which the power is supplied from the outside resonance circuit 101 as the element for detecting the ink information will be described with reference to FIG. 6.

Figure 6:
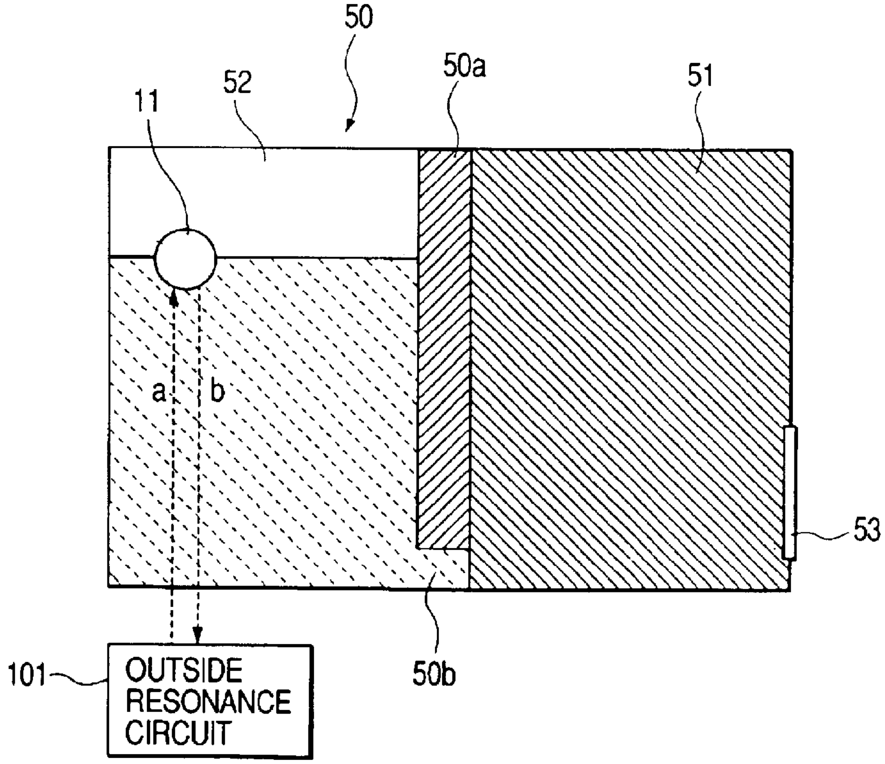
FIG. 6 is a schematic view of an ink tank in which lath the solid semiconductor element shown in FIG. 3 is contained.

FIG. 6 is a schematic view of the ink tank in which the element shown in FIG. 3 is contained. An ink tank 50 shown in FIG. 6 includes a negative pressure generation chamber 51 and ink chamber 52 partitioned from each other via a partition wall 50*a*. A lower end of the partition wall 50*a* forms a connection path 50*b*, and the negative pressure generation chamber 51 is connected to the ink chamber 52 via the connection path 50*b*. In the negative pressure generation chamber 51, a negative pressure generating member constituted of a fibrous or porous material is contained. The ink is held and absorbed by the negative pressure generating member in the negative pressure generation chamber 51. Moreover, in the negative pressure generation chamber 51, an ink supply port 53 for supplying the ink of the negative pressure generation chamber 51 to the outside such as the ink jet recording apparatus (not shown), and an atmosphere connection port (not shown) for connecting the inside of the negative pressure generation chamber 51 to the atmosphere are disposed. The ink chamber 52 is a substantially closed structure excluding the connection path 50*b*, and holds the ink as it is, and the element 11 is floated on the liquid surface of the ink held in the ink chamber 52. Such structure for floating the element 11 will be described later. The oscillation circuit (not shown) described with reference to FIG. 5 is formed in the element 11. The element 11 generates the power by the induced electromotive force generated by the electromagnetic induction from the outside resonance circuit 101 disposed under the ink tank 50, further generates the resonance frequency, and transmits the ink information in the ink tank 50 to the outside. In FIG. 6, a denotes electromagnetic induction, and b denotes oscillation.

According to the ink tank 50 constituted as described above, with ink consumption via the ink supply port 53, gas (gas introduced via the atmosphere connection port) is discharged to the ink chamber 52 from the negative pressure generation chamber 51 via the connection path 50*b*, and the corresponding amount of ink is introduced to the negative pressure generation chamber 51 from the ink chamber 52. Thereby, the ink amount held in the negative pressure generation chamber 51, that is, the negative pressure in the negative pressure generation chamber 51 is held to be substantially constant.

Figure 7:
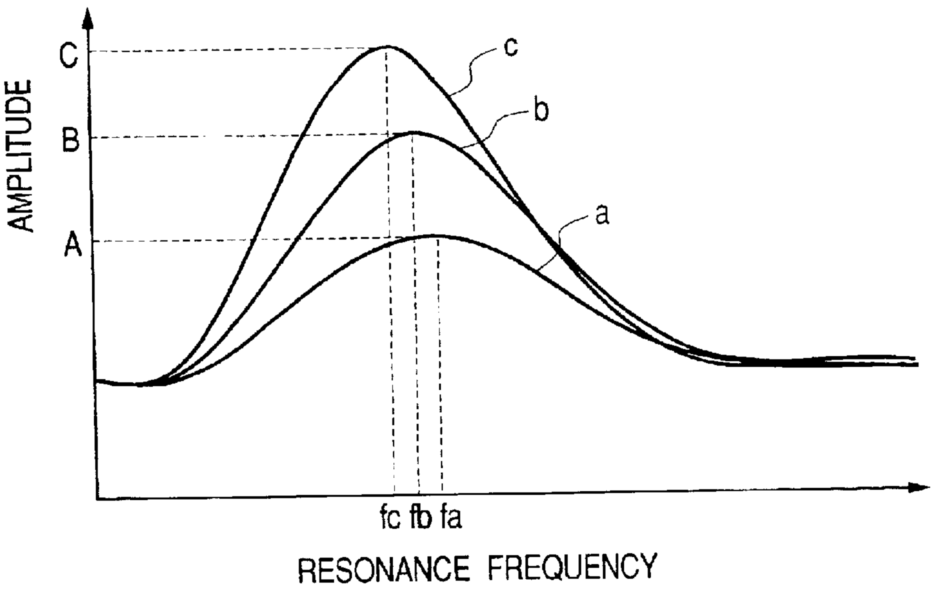
FIG. 7 is a diagram showing an output from an oscillation circuit shown in FIG. 5 in a relation between resonance frequency and amplitude.
Figure 8A:
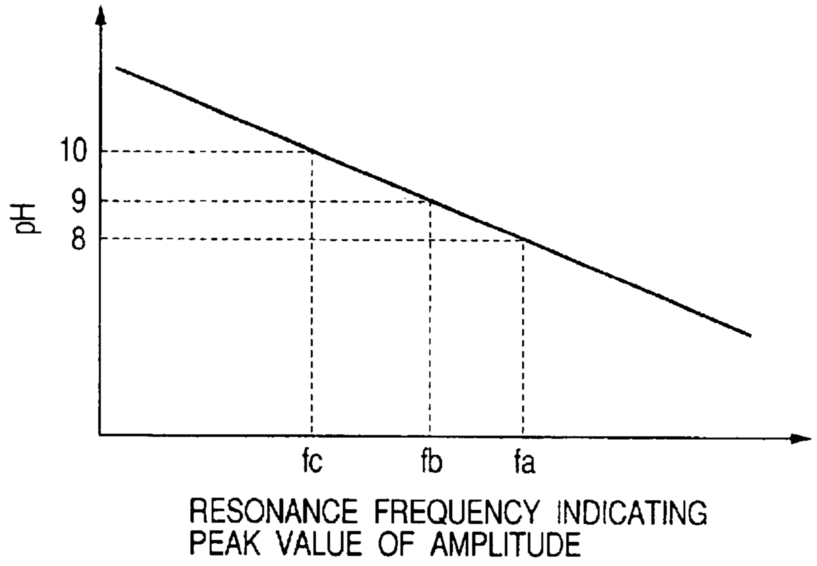
FIGS. 8A and 8B are diagrams showing a relation between a peak value of the output amplitude from the oscillation circuit shown in FIG. 5 and pH of an ink.

Here, an example of an output generated by the oscillation circuit disposed in the element 11 is shown as a relation between the resonance frequency and the amplitude in FIG. 7. In FIG. 7, as shown by a to c, the output generated by the oscillation circuit indicates a difference in the resonance frequency indicating an amplitude peak value and the amplitude in the peak value in accordance with an ink situation in the ink tank 50 (accurately the ink chamber 52). Concretely, as shown in FIG. 8A, resonance frequencies $f_a$, $f_b$, $f_c$ indicating the amplitude peak values have correlation with the ink pH. When the relation shown in FIG. 8A is measured beforehand, the ink pH change can be detected. Also for an ink concentration, a similar relation is seen in a different frequency area band. When the relation is measured beforehand, an ink concentration change can be detected.

Figure 8B:
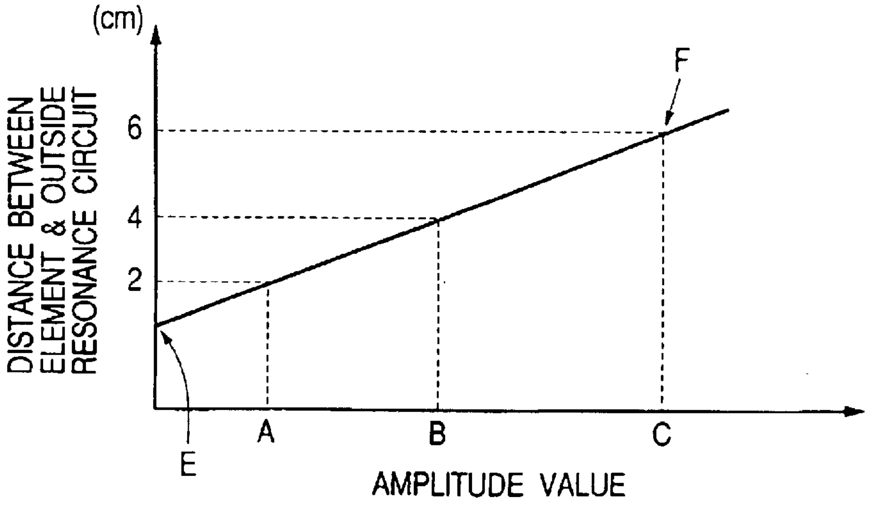

Moreover, amplitude value changes A, B, C in a resonance frequency range shown in FIG. 7 have correlation with a distance between the element and the outside resonance circuit 101 as shown in FIG. 8B. Therefore, the amplitude value of a point at which the tank is filled with the ink (F) or at which the tank is empty (E) is measured beforehand. Thereby, the position of the element 11 in the ink tank 50, that is, the ink residual amount can be detected.

Moreover, a liquid density can also be approximated using the following state equation:

$$PV=nRT \tag{10}$$

(Here, P: pressure, V: volume, n: gram molecular weight, R: gas constant, T: absolute temperature).

In the equation (10), when T is constant, density n is represented as follows:

$$\rho = \frac{MP}{nRT} \tag{11}$$

(Here, M: molecular weight). That is, when a liquid pressure and temperature can be detected, a liquid density state change can also be measured.

The liquid pressure will be described later in detail. A pressure sensor is constituted by forming a diaphragm of a polysilicon film, and utilizing a resistance value change with diaphragm displacement caused by a pressure change, and formed in the element 11 of the first embodiment so that the pressure can be detected.

Moreover, for the liquid temperature, for example, when a diode sensor, described in Japanese Patent Application Laid-Open No. 52387/1995, for detecting a recording head temperature is formed in the element 11 of the first embodiment, the temperature can be detected.

As described above, when the pressure and temperature sensors are formed in the element 11, the ink density can be detected. When a change with time can similarly be detected, a change of a liquid viscosity/surface tension can also be estimated.

For the liquid viscosity, a liquid viscosity change can be estimated in accordance with a density change from Orik Arbor equation:

$$ln\frac{\eta}{\rho M} = A + \frac{B}{T} \tag{12}$$

(Here, $\eta$: viscosity, A: constant, B: constant).

There is a relation equation by Macleod between the liquid surface tension and density.

$$\gamma=\{C(\rho_o-\rho)\}^{4.0} \tag{13}$$

(Here, $\gamma$: surface tension, C: constant determined by liquid.) the liquid surface tension change can be estimated in accordance with the density change from the equation (13).

As described above, when the element 11 is applied to the ink tank 50, the ink information such as the ink pH, concentration and density can be detected with time and transmitted to the outside of the ink tank 50. Therefore, for example, when the used ink tank is replaced with another tank, another ink is injected into the ink tank 50, and an ink amount abnormally increases or an ink component changes, these can accurately be detected as abnormalities. Moreover, since the change of the ink viscosity and surface tension can also be estimated, these information are transmitted to a recording head controller, and a driving condition for keeping a stable ejection property can also be set.

Additionally, in FIG. 6, the element 11 having the constitution shown in FIG. 3 is used, but the discrimination means 16 and information storing means 17 may be disposed outside the ink tank 50, not in the element 11.

Additionally, as described above, the element 11 is floated on the ink surface in the ink tank 50 shown in FIG. 6. The element 11 floating on the ink surface will be described hereinafter together with a manufacturing method.

FIG. 9A to 9G are diagrams of a series of steps showing one example of a method of using a spherical silicon as a base of the aforementioned ball semiconductor to manufacture the floating element 11 shown in FIG. 6. Additionally, FIGS. 9A to 9G shows respective steps in a sectional view along a center of the spherical silicon. Moreover, the gravity center of spherical silicon is formed below the center, and an inner upper portion of a sphere is formed to be hollow. Furthermore, the hollow portion is held to be hermetic. The manufacturing method will be described as an example.

Figure 9A:
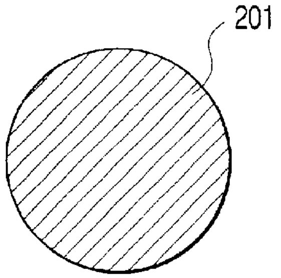
FIGS. 9A, 9B, 9C, 9D, 9E, 9F and 9G are diagrams showing a series of steps according to one example of a manufacturing method of a floating solid semiconductor element shown in FIG. 6.
Figure 9B:
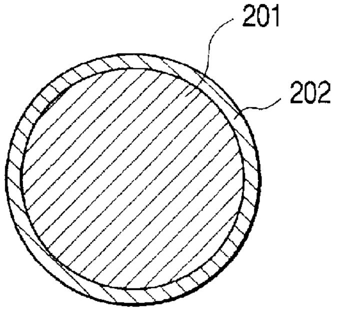
Figure 9C:
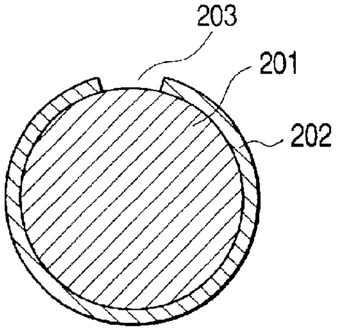

First, as shown in FIG. 9B, a thermally oxidized $SiO_2$ film 202 is formed on the whole surface of a spherical silicon 201 shown in FIG. 9A. Subsequently, when an opening 203 is formed in a part of the $SiO_2$ film 202 as shown in FIG. 9C, a photolithography process is used to pattern the film.

Figure 9D:
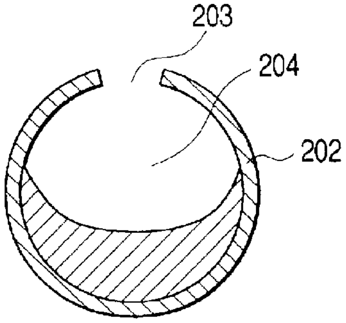
Figure 9E:
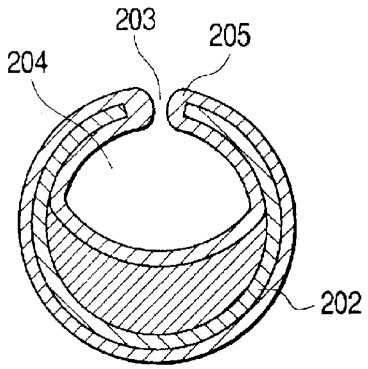

Subsequently, as shown in FIG. 9D, an upper half of the spherical silicon 201 is removed by anisotropic etching using a KOH solution via the opening 203, and a hollow portion 204 is formed. Thereafter, as shown in FIG. 9E, an LPCVD process is used to coat a whole exposed surface of the spherical silicon 201 and $SiO_2$ film 202 including an inner surface of the hollow portion 204 with an SiN film 205.

Figure 9F:
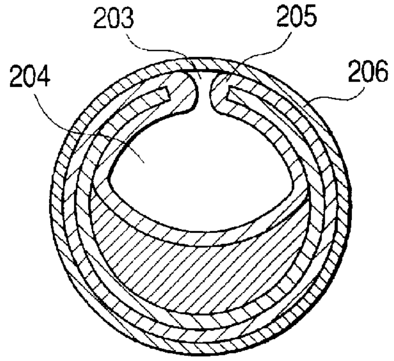
Figure 9G:
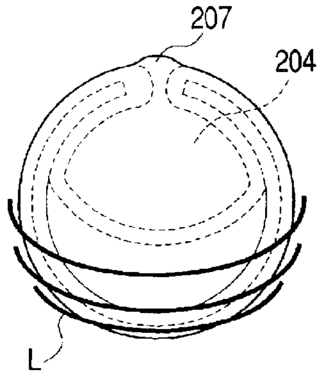

Furthermore, as shown in FIG. 9F, a metal CVD process is used to form a Cu film 206 on the outer surface of the SiN film 205. Subsequently, as shown in FIG. 9G, a known photolithography process is used to pattern the Cu film 206, and the conductor coil L as a part of the oscillation circuit 102 (see FIG. 3) is formed with the winding number N. Thereafter, the cubical element with the conductor coil L formed thereon is extracted to the atmosphere from the vacuum apparatus, the upper opening 203 is closed by a seal member 207 such as a resin and stopper, and the hollow portion 204 inside the sphere is brought to a sealed state. When the element is manufactured in this manner, the element itself formed of silicon can have buoyancy.

Figure 10:
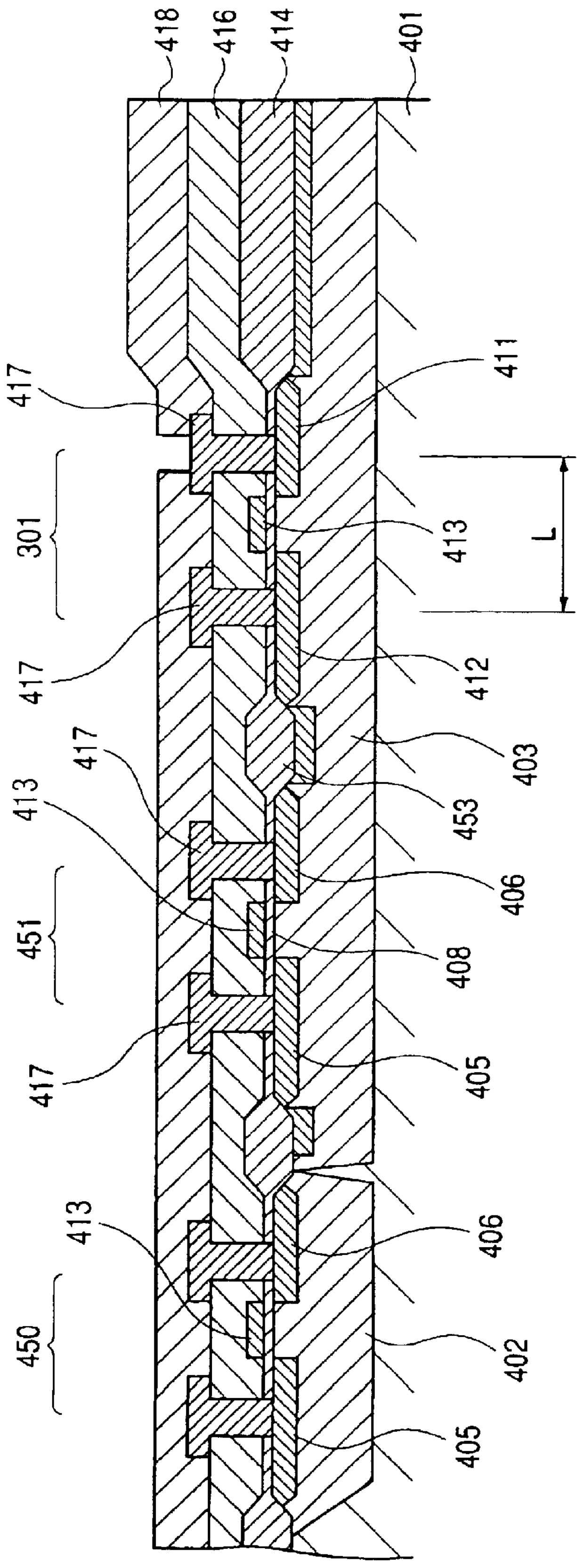
FIG. 10 is a schematic longitudinal sectional view showing an N-MOS circuit element for use in the solid semiconductor element of the present invention.

Moreover, an N-MOS circuit element is used in driving circuit elements formed beforehand in the spherical silicon, excluding the coil L, before manufacturing the floating type solid semiconductor element. FIG. 10 is a schematic longitudinal sectional view showing the N-MOS circuit element.

According to FIG. 10, a P-MOS 450 is constituted in an N-type well region 402 by using a general MOS process to plant ions or introduce and diffuse other impurities in a P-conductor Si substrate 401, and an N-MOS 451 is constituted in a P-type well area 403. The P-MOS 450 and N-MOS 451 are each constituted of a gate wiring 415 formed by polysilicon deposited in a thickness of 4000 to 5000 $\mu$m in a CVD process, and a source region 405, drain region 406, and the like with N-type or P-type impurities introduced therein via a gate insulating film 408 with a thickness of several hundreds of micrometers. A C-MOS logic is constituted by the P-MOS 450 and N-MOS 451.

An N-MOS transistor 301 for driving the element is constituted of a drain region 411, source region 412 and gate wiring 413 in the P-type well substrate 402 by the impurities introducing and diffusing steps.

Here, when the N-MOS transistor 301 is used as an element driver, a distance L between drain and gate constituting one transistor is about 10 $\mu$m at minimum. The value of 10 $\mu$m includes widths of source and drain contacts 417. The width is 2×2 $\mu$m, but actually the half also serves as the adjacent transistor, and the width is therefore the half, that is, 2 $\mu$m. The value also includes a distance between the contact 417 and the gate 413, that is 2×2 $\mu$m=4 $\mu$m and a width of the gate 413, that is, 4 $\mu$m. Therefore, the total distance L is 10 $\mu$m.

An oxide film separating region 453 with a thickness of 5000 to 10000 $\mu$m is formed between the elements by field oxidation, and the elements are separated from each other. This field oxide film acts as a first layer of regenerator layer 414.

After the respective elements are formed, an interlayer insulating film 416 is deposited as PSG, BPSG films, and the like in a thickness of about 7000 $\mu$m by the CVD process. The film is subjected to a heat treatment, that is, a flatting treatment, and the like, and wired via a contact hole by an Al electrode 417 as a first wiring layer. Thereafter, an interlayer insulating film 418 of an $SiO_2$ film is deposited in a thickness of 10000 to 15000 $\mu$m by the plasma CVD process, and further a through hole is formed.

The N-MOS circuit is formed before the floating element is formed. Subsequently, the circuit is connected to the oscillation circuit as the energy converting means of the present invention via the through hole.

In the example shown in FIG. 6, the electromagnetic induction by the coil is utilized in the outside energy for supplying the power to start the element 11, but additionally light brightness/darkness may be utilized. To convert the light brightness/darkness to the electric signal, a material whose resistance value changes with light irradiation (e.g. photoconductor) can be used to generate the power by a photoconductive effect. Examples of the photoconductor include two-dimensional/three-dimensional alloys such as CdS, InSb and $Hg_{0.8}Cd_{0.2}Te$, and GaAs, Si, Va-Si, and the like. When heat is used as the electromotive force, the power can be generated from a material radiation energy by quantum effect.

(Second Embodiment)

Figure 11:
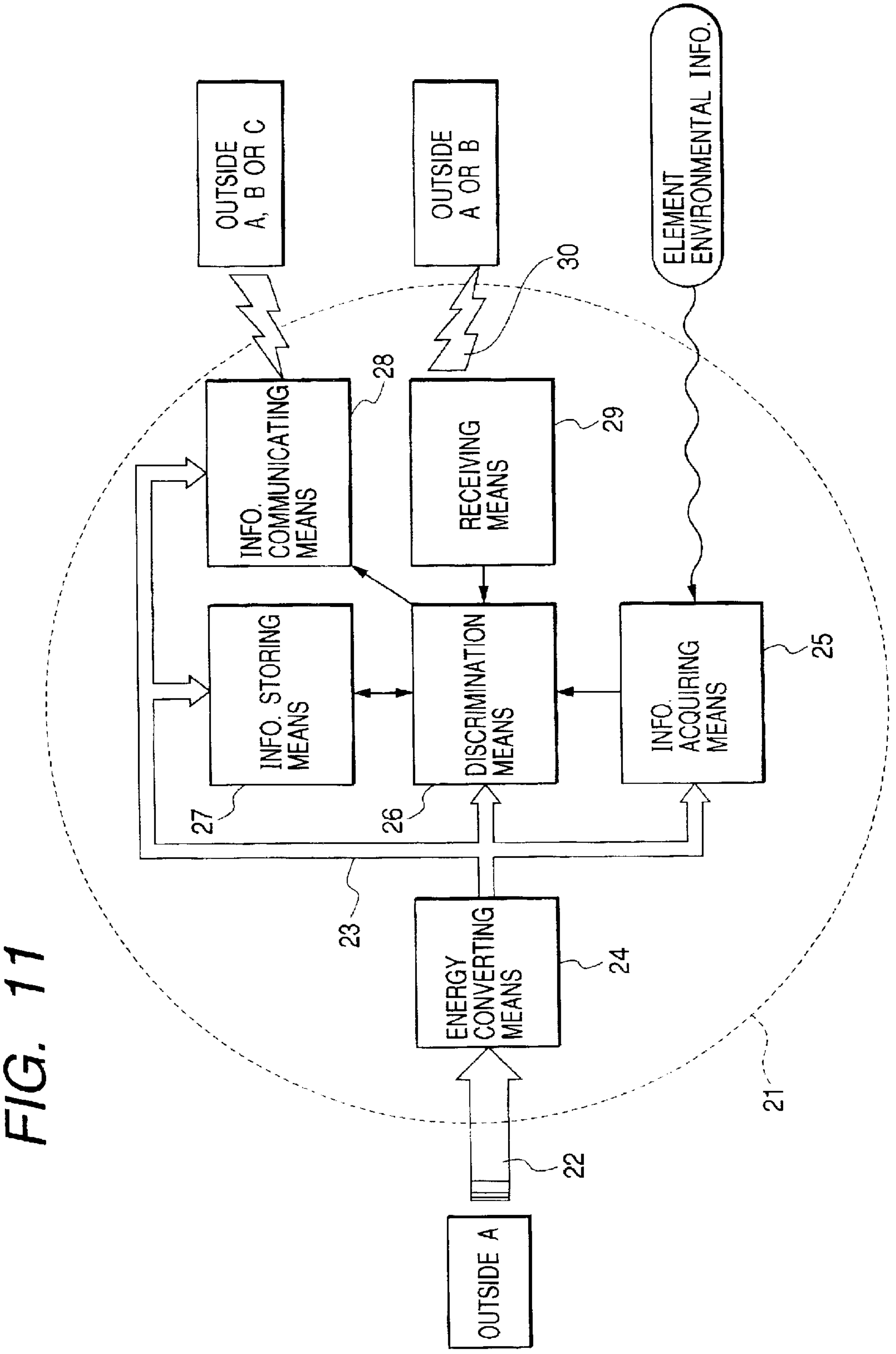
FIG. 11 is a block diagram showing the inner constitution of the solid semiconductor element according to a second embodiment of the present invention and the exchange of the element with the outside.

FIG. 11 is a block diagram showing the inner constitution of the solid semiconductor element according to a second embodiment of the present invention, and the exchange of the element with the outside. A solid semiconductor element (hereinafter referred to simply as the "element") 21 shown in FIG. 11 is disposed in the ink tank, and includes energy converting means 24 for converting an electromotive force 22 supplied to the element 21 from the outside A to a power 23, information acquiring means 25 started by the power converted by the energy converting means 24, discrimination means 26, information storing means 27, information communicating means 28, and receiving means 29. The second embodiment is different from the first embodiment in that the element has a receiving function, that is, the receiving means 29, and similar to the first embodiment in other respects. The electromagnetic induction, heat, light, ray, and the like can be applied to the electromotive force 22 supplied to operate the element 21. Moreover, at least the energy converting means 24, information acquiring means 25 and receiving means 29 are preferably formed on the surface of the element 21 or in the vicinity of the surface.

The information acquiring means 25 acquires the ink information in the ink tank as the environmental information of the element 21. The receiving means 29 receives an input signal 30 from the outside A or B. The discrimination means 26 allows the information acquiring means 25 to acquire the ink information in response to an input signal from the receiving means 29, compares the acquired ink information with the information stored in the information storing means 27, and judges whether or not the acquired ink information satisfies the predetermined condition. The information storing means 27 stores various conditions for comparison with the obtained ink information and ink information itself obtained from the information acquiring means 25 as the data table. The information communicating means 28 converts the power to the energy for transmitting the ink information to the outside A, B or C, and displays and transmits a discrimination result obtained by the discrimination means 26 to the outside A, B or C in response to a command from the discrimination means 26.

Figure 12:
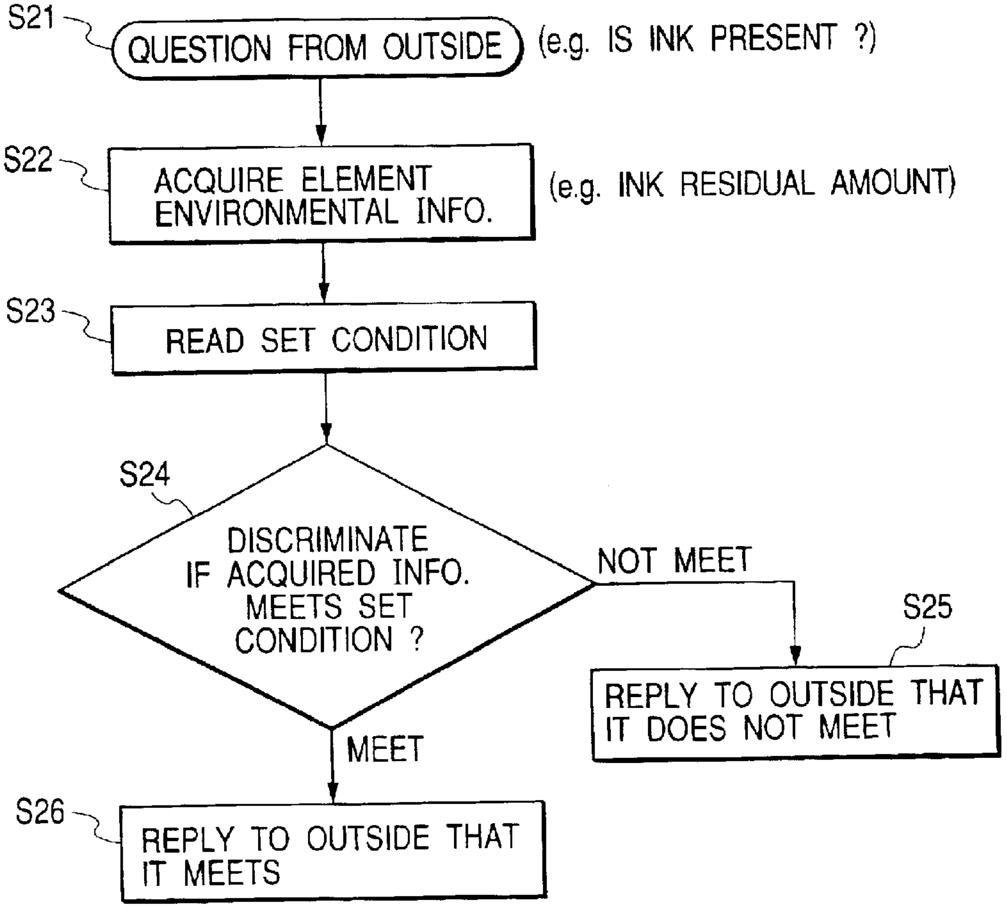
FIG. 12 is a flowchart showing the operation of the solid semiconductor element shown in FIG. 11.

FIG. 12 is a flowchart showing the operation of the element shown in FIG. 11. Referring to FIGS. 11 and 12, when the electromotive force 22 is applied to the element 21 from the outside A, the energy converting means 24 converts the electromotive force 22 to the power 23, and the information acquiring means 25, discrimination means 26, information storing means 27, information communicating means 28 and receiving means 29 are started by the power.

In this state, the outside A or B transmits the signal 30 to the element 21 to ask for the ink tank inside information. The input signal 30 is a signal for asking the element 21, for example, whether or not the ink still remains in the ink tank, and received by the receiving means 29 (step S21 of FIG. 12). Then, the discrimination means 26 allows the information acquiring means 25 to acquire the ink information in the ink tank such as the ink residual amount, ink type, temperature, and pH (step S22 of FIG. 12), reads the condition for referring to the acquired ink information from the information storing means 27 (step S23 of FIG. 12), and judges whether the acquired ink information satisfies a set condition (step S24 of FIG. 12).

In the step S24, when it is judged that the acquired information does not satisfy the set condition, or when it is judged that the acquired information satisfies the set condition, this is transmitted to the outside A, B or C (steps S25, S26). In this case, the acquired information may be transmitted together with the judgment result. The information is transmitted when the information communicating means 28 converts the power obtained by energy conversion to the energy for transmitting the ink information in the ink tank to the outside. The magnetic field, light, shape, color, radio wave, sound, and the like can be used as the transmitting energy, and the energy is changed in accordance with the judgment result. In accordance with a question content to be judged (for example, whether the ink residual amount is 2 ml or less, or the ink pH changes), the transmission method may be changed.

Additionally, the electromotive force may also transmitted to the element 21 together with the input signal 30 from the outside A or B. For example, when the electromotive force is electromagnetic induction, the signal for asking the ink residual amount is transmitted. When the electromotive force is light, the signal for asking pH is transmitted. The signal may be transmitted in accordance with information type in this manner.

According to the second embodiment, the element has a function of receiving the signal from the outside. Therefore, in addition to the effect of the first embodiment, questions transmitted from the outside via various types of signals can be answered, and the element can exchange the information with the outside.

(Third Embodiment)

Figure 13:
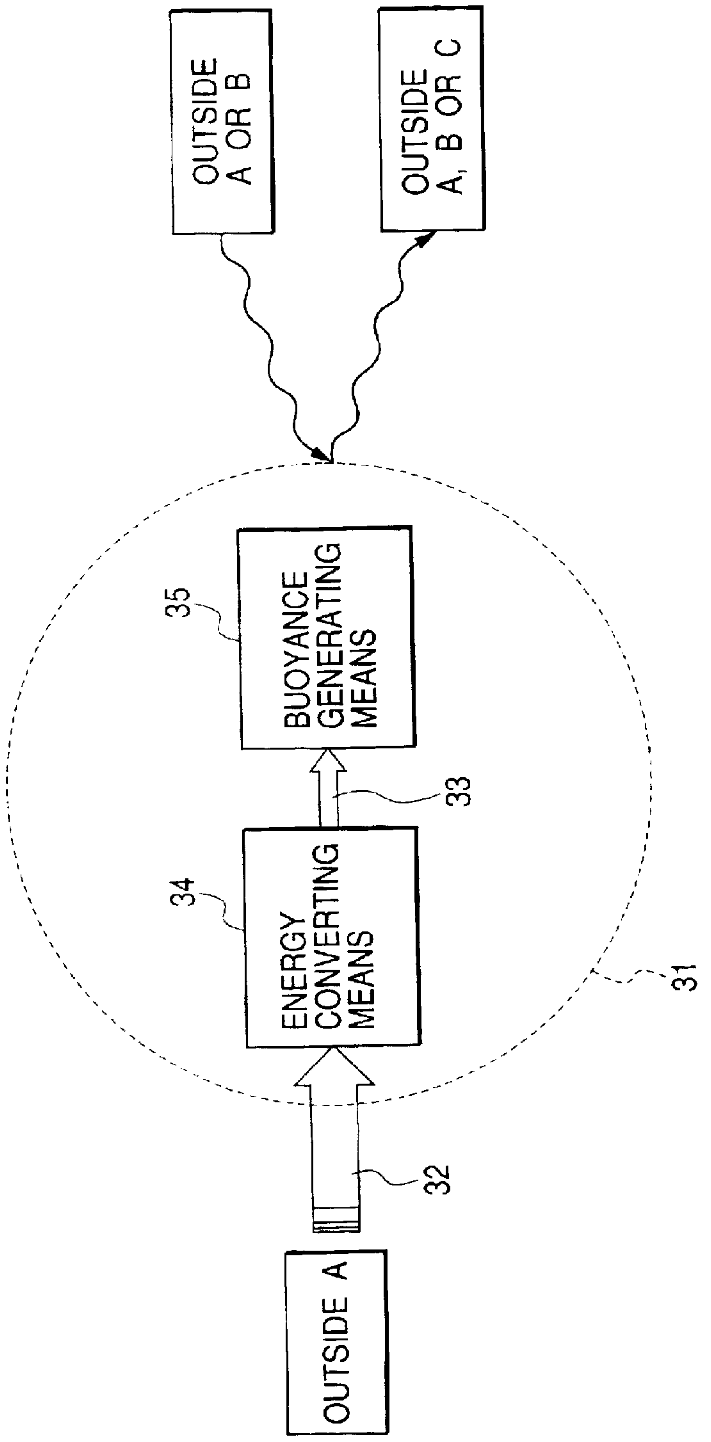
FIG. 13 is a block diagram showing the inner constitution of the solid semiconductor element according to a third embodiment of the present invention and the exchange of the element with the outside.

FIG. 13 is a block diagram showing the inner constitution of the solid semiconductor element according to a third embodiment of the present invention and the exchange with the outside. A solid semiconductor element (hereinafter referred to simply as the "element") 31 shown in FIG. 13 is disposed in the ink tank, and includes energy converting means 34 for converting an electromotive force 32 supplied to the element 31 from the outside A to a power 33, and buoyancy generating means 35 for using the power converted by the energy converting means 34 to generate buoyancy.

In the third embodiment, when the electromotive force 32 is applied to the element 31 from the outside A, the energy converting means 34 converts the electromotive force 32 to the power 33, the buoyancy generating means 35 uses the power 33 to generate the buoyancy of the element 31, and the element 31 is floated on the ink surface. By the buoyancy, the element 31 may be positioned not only on the ink surface but also at a constant distance below the ink surface in order to prevent the ink from being ejected in an empty state.

Figure 14A:
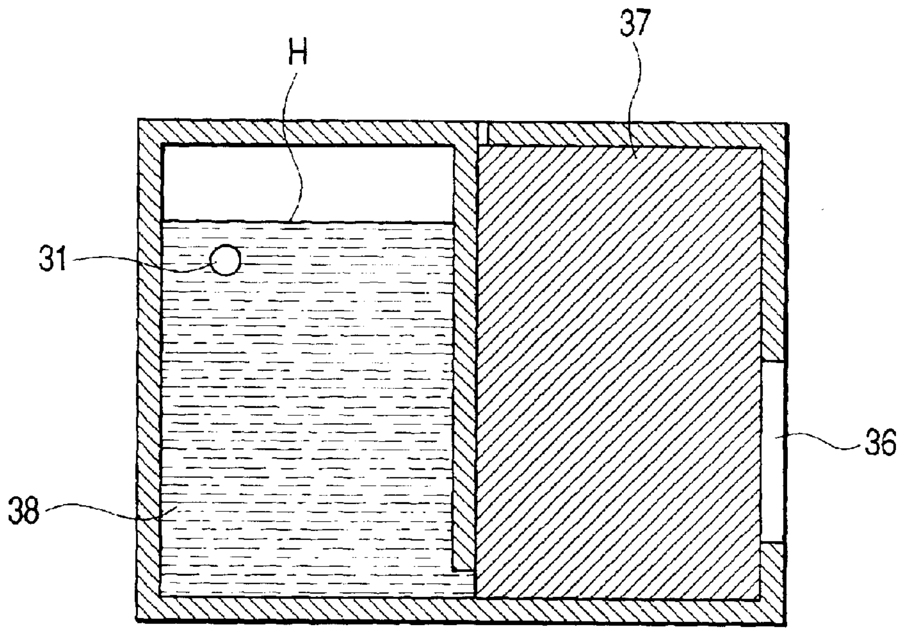
FIGS. 14A and 14B are diagrams showing a position of the element floated in the ink of the ink tank and constituted as shown in FIG. 11, together with an ink consumption change.
Figure 14B:
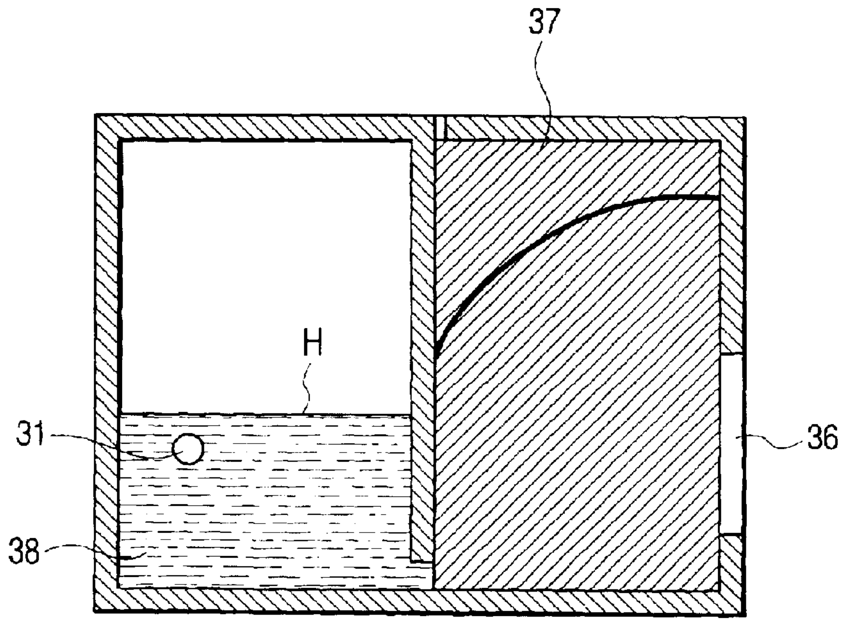

FIGS. 14A and 14B shows a position of the element floated in the ink of the ink tank together with the ink consumption change. Additionally, since the ink tank shown in FIGS. 14A and 14B is similar in constitution to the ink tank shown in FIG. 6, description thereof is omitted.

In the ink tank shown in FIGS. 14A and 14B, when the ink of a negative pressure generating member 37 is discharged to the outside via an ink supply port 36, the consumed amount of ink is introduced to the negative pressure generating member 37 from the ink chamber. Thereby, the element 31 in the ink 38 in the ink chamber exists at a given distance from an ink surface H, and moves as the position of the ink surface is lowered with the ink consumption.

Figure 15:
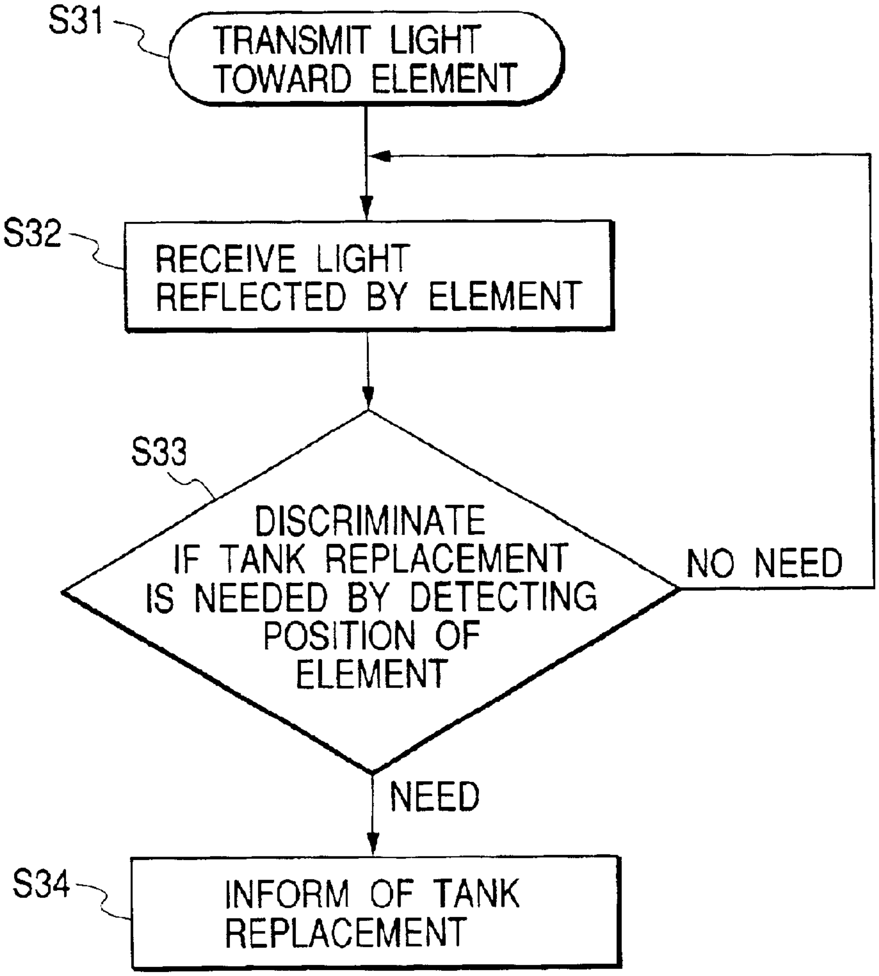
FIG. 15 is a flowchart for checking the position of the element having the constitution shown in FIG. 11, and judging a need for tank replacement.

FIG. 15 is a flowchart for checking the position of the element 31, and discriminating a need for tank replacement. Referring to steps S31 to S34 of FIGS. 13 and 15, the outside A or B (e.g., the ink jet recording apparatus) transmits light to the element 31. When the outside A or B (e.g., the ink jet recording apparatus) or C receives the light, the position of the element 31 is detected. The ink jet recording apparatus judges, in accordance with the detected position of the element 31, whether or not it is necessary to replace the ink tank. If necessary, the tank replacement is notified via sound, light, or the like.

Examples of a method of detecting the position of the element 31 include a method of using the oscillation circuit 102 shown in FIG. 5 as the energy converting means 34, disposing the circuit and outside resonance circuit 101 outside the ink tank, and detecting the position based on the output from the oscillation circuit 102 similarly as the first embodiment. Moreover, the examples include: a method of disposing light emitting means opposite to light receiving means in a position in which the element 31 passes with displacement of the ink surface, shielding the light emitted from the light emitting means by the element 31, and detecting the position of the element 31; a method of reflecting the light emitted from the light emitting means by the element 31, and detecting the position of the element 31 by the reflected light; and the like.

According to the third embodiment, the element 31 can be floated without disposing the hollow portion in the element described in the first embodiment with reference to FIGS. 9A to 9G. Additionally, even when the buoyancy or the like necessary for the element 31 changes by a change of liquid specific weight or another environment for using the element 31, the energy converting means 34 converts the electromotive force 32 from the outside, and the element can constantly be set and disposed in a desired position. Therefore, the element 31 can be used irrespective of the environment where the element 31 is disposed.

Additionally, the third embodiment can also appropriately be combined with the aforementioned first and second embodiments.

(Fourth Embodiment)

In a fourth embodiment, a function of transmitting the information to another element is imparted to the element having the constitution similar to that of the first or second embodiment, and a plurality of elements are disposed in the object.

Figure 16A:
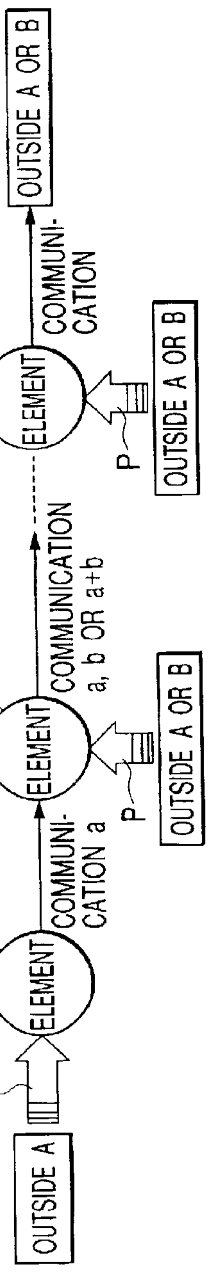
FIGS. 16A, 16B and 16C are explanatory views showing a concept of a fourth embodiment of the present invention.
Figure 16B:
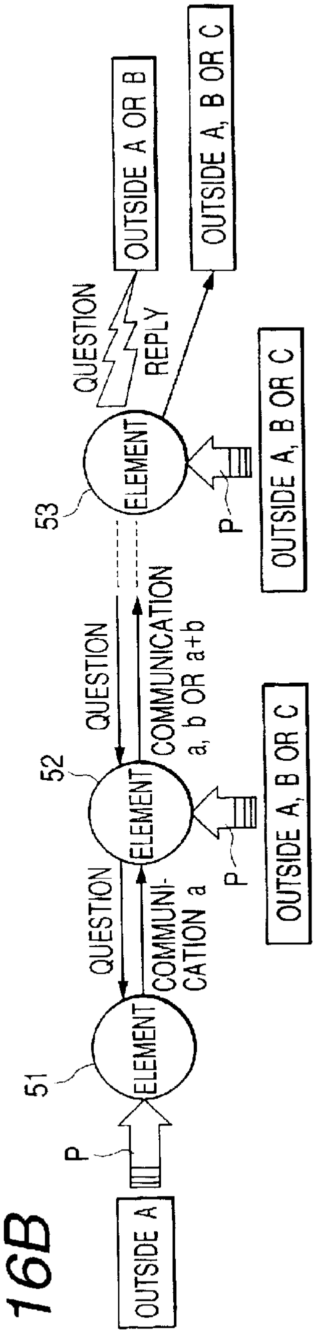
Figure 16C:
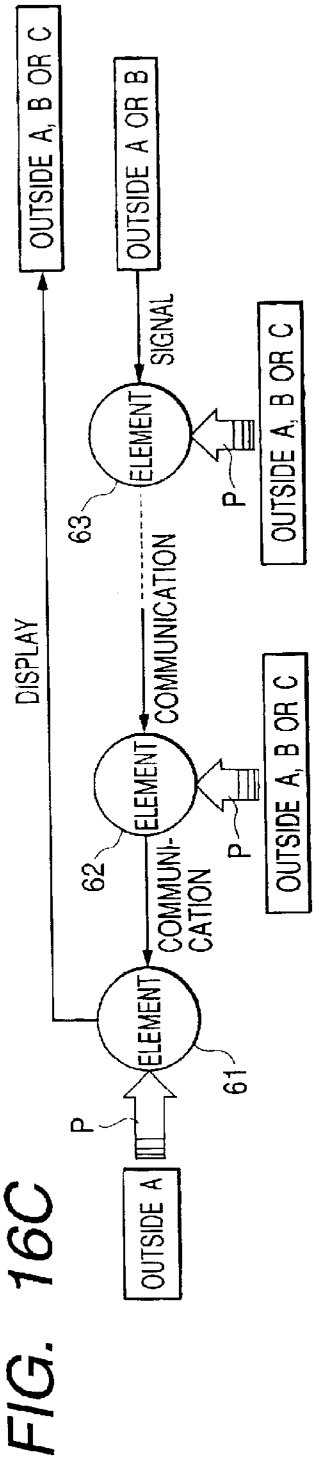

First, a concept of the fourth embodiment will be described with reference to FIGS. 16A to 16C. FIGS. 16A to 16C are explanatory views showing the concept of the fourth embodiment of the present invention.

In an example shown in FIG. 16A, a plurality of elements 41, 42, . . . 43 constituted similarly as the first embodiment are disposed in the object. When an electromotive force P is supplied to the respective elements 41, 42, . . . 43 from the outside A or B, the respective elements 41, 42, . . . 43 obtain the environmental information. Subsequently, acquired information a of the element 41 is transmitted to the element 42, and the acquired information a, b of the elements 41, 42 are successively transmitted to the next element. The last element 43 transmits all the acquired information to the outside A or B.

Moreover, in an example shown in FIG. 16B, a plurality of elements 51, 52, . . . 53 constituted similarly as the second embodiment are disposed in the object. The electromotive force P is supplied to the respective elements 51, 52, . . . 53 from the outside A, B or C. For example, when a predetermined question is inputted to the element 53 from the outside A or B via the signal, the element 51 or 52 acquires the corresponding information and answers the question. The question/reply of the element 51 or 52 is successively transmitted to another element, and the desired element 53 answers the question to the outside A, B or C.

Furthermore, in an example shown in FIG. 16C, a plurality of elements 61, 62, . . . 63 constituted similarly as the second embodiment are disposed in the object. The electromotive force P is supplied to the respective elements 61, 62, . . . 63 from the outside A, B or C. For example, when a certain signal is inputted to the element 63 from the outside A or B, the signal is successively transmitted to the elements 62 and 61. The element 61 displays the signal to the outside A, B or C.

Additionally, in the examples of FIGS. 16A to 16C, one of the plurality of elements may be provided with the buoyancy generating means similarly as the third embodiment.

Figure 17:
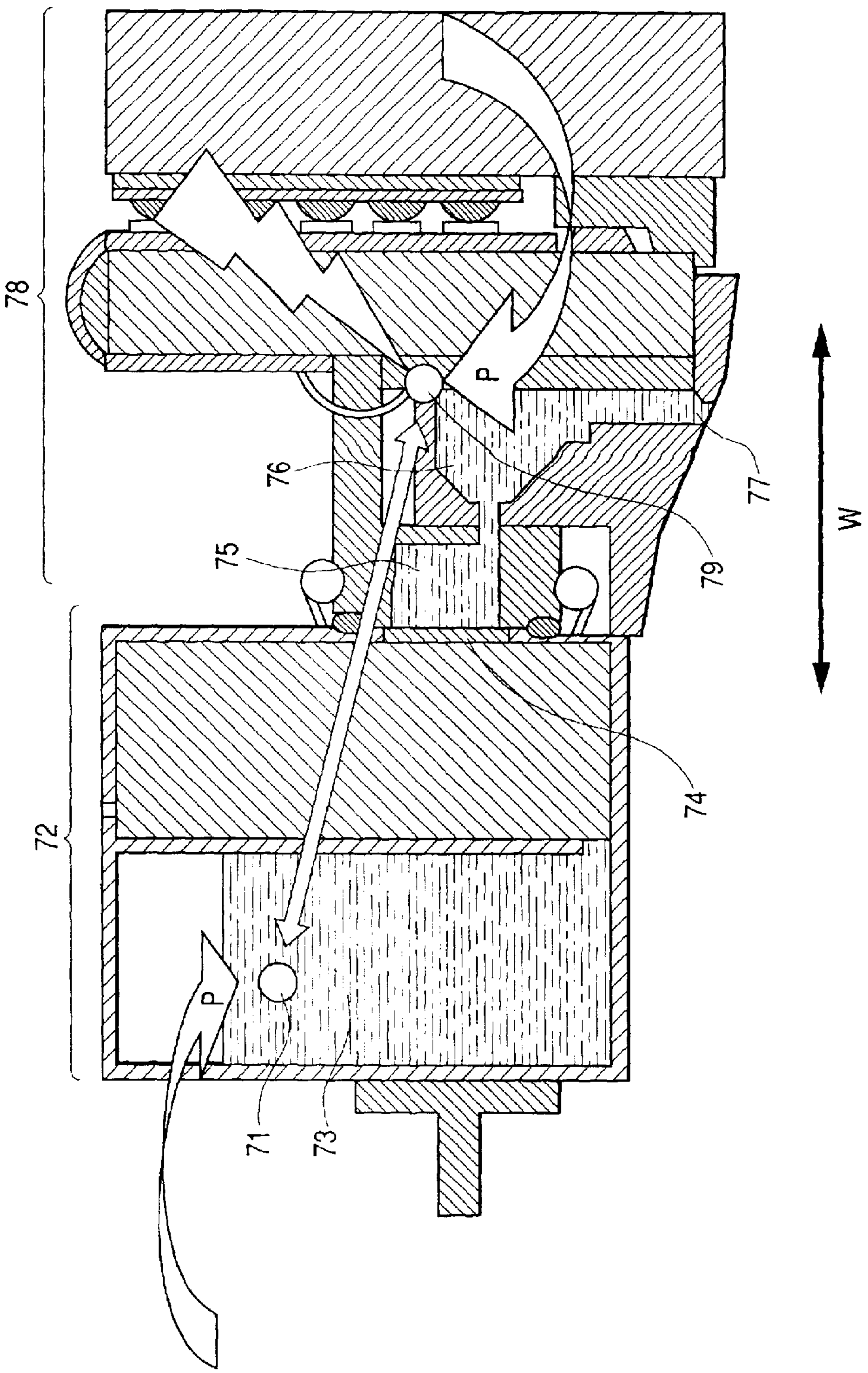
FIG. 17 is a diagram showing an example in which the solid semiconductor element constituted by appropriately combining the first, second and third embodiments is disposed in the ink tank and an ink jet head connected to the tank.
Figure 18:
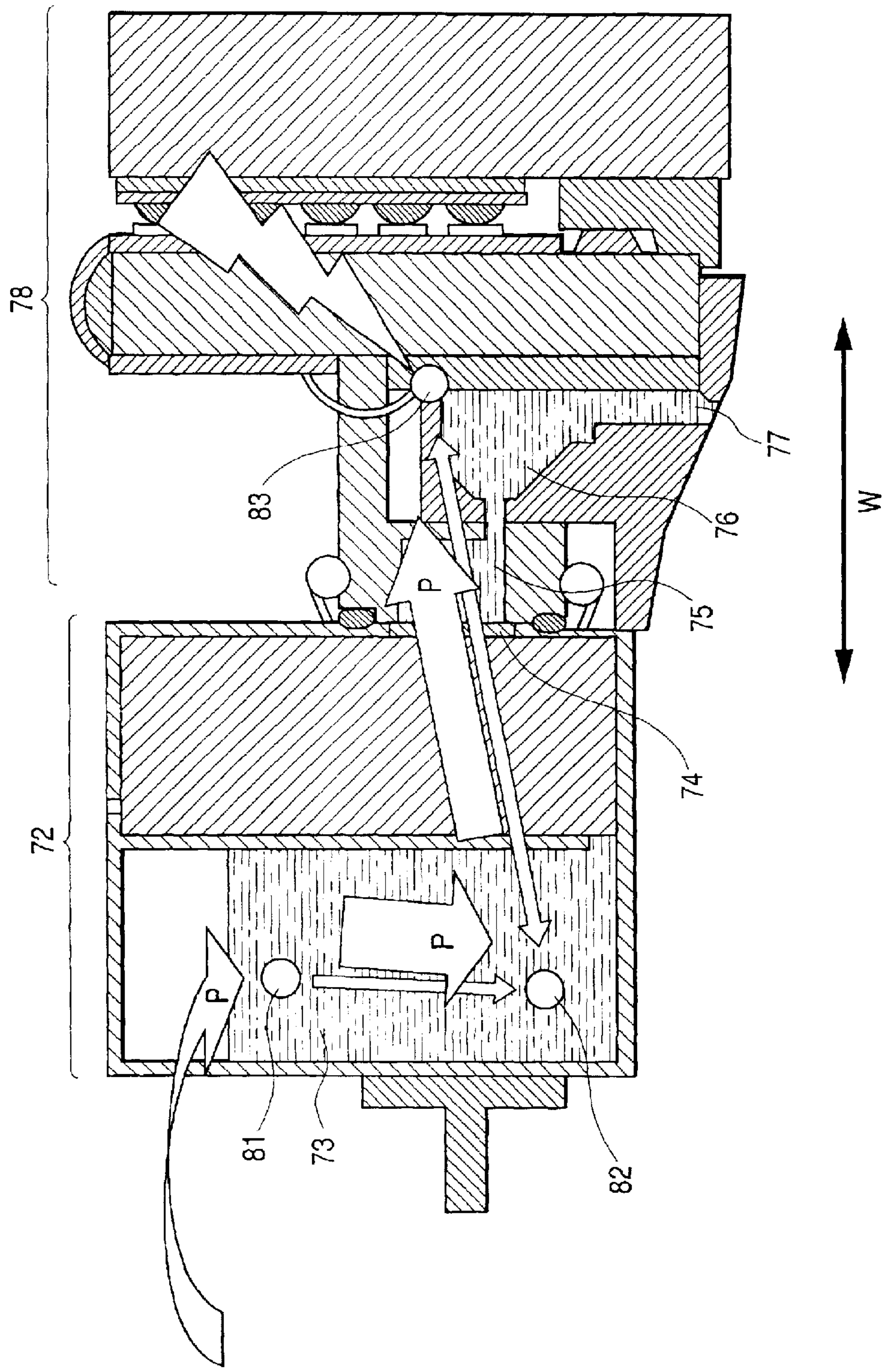
FIG. 18 is a diagram showing a constitution example in which an electromotive force supplied to a certain solid semiconductor element is successively transmitted to another solid semiconductor element together with the information in the ink tank and connected ink jet head.

The concept of the fourth embodiment has been described above. The detection of the ink information based on the aforementioned concept according to the fourth embodiment will be described hereinafter with reference to FIGS. 17 and 18. In FIGS. 17 and 18, W denotes a printing scanning direction, and P denotes the electromotive force.

FIG. 17 shows an example in which the element constituted by appropriately combining the first, second and third embodiments is disposed in the ink tank and an ink jet recording head connected to the tank. In this example, an element 71 is constituted by adding the buoyancy generating means of the third embodiment and function of transmitting the information to another element 79 to the first embodiment, and disposed in a desired position in an ink 73 in an ink tank 72. On the other hand, the element 79 constituted similarly as the second embodiment and having an ID function (identification function) is disposed in a recording head 78 for ejecting, via an ejection port 77, a printing ink supplied via a liquid path 75 and liquid chamber 76 connected to the ink tank 72 via an ink supply port 74. The power may be supplied to the element 79 by bringing an electrode portion disposed on the element surface in contact with a contact portion on an electric substrate for driving the recording head 78.

Subsequently, when the electromotive force is supplied to the respective elements 71, 79 from the outside, the element 71 in the ink 73 acquires the ink information such as ink residual amount information, and the element 79 on a recording head 78 side transmits the ID information for judging the ink residual amount for tank replacement to the element 71. Then, the element 71 compares the acquired ink residual amount with ID, and instructs the element 79 to inform the outside of the tank replacement only when these meet with each other. The element 79 receives this, and transmits a signal indicating the tank replacement to the outside or outputs sound, light, and the like to human eyes and sense of hearing.

When a plurality of elements are disposed in the certain object, a complicated information condition can be set.

Moreover, in the example shown in FIGS. 16 and 17, the electromotive force is supplied to the respective elements, but this constitution is not limited, and the electromotive force supplied to the certain element may successively be transmitted to another element together with the information.

For example, as shown in FIG. 18, an element 81 is constituted by adding the buoyancy generating means similar to that of the third embodiment and functions of transmitting the information and supplying the electromotive force to another element to the constitution of the first embodiment. An element 82 is constituted by adding the buoyancy generating means similar to that of the third embodiment and function of transmitting the information and supplying the electromotive force to another element to the constitution of the second embodiment. These elements are disposed in the desired positions in the ink 73 in the ink tank 72 similarly as in FIG. 17. On the other hand, an element 83 constituted similarly as the second embodiment and having the ID function (identification function) is disposed in the recording head 78 connected to the ink tank 72. The power may be supplied to the element 83 by bringing the electrode portion disposed on the element surface in contact with the contact portion on the electric substrate for driving the recording head 78.

Subsequently, when the electromotive force is supplied to the element 81 from the outside, one element 81 in the ink 73 acquires the ink information such as the ink residual amount information, and compares the information with an internal defined condition. The element transmits the acquired ink residual amount information to the other element 82 together with the electromotive force for operating the element 82, when the information needs to be transmitted to the other element 82. The other element 82 with the electromotive force supplied thereto receives the ink residual amount information transmitted from the element 81, acquires the ink information such as ink pH information, and transmits the electromotive force for operating the element 83 to the element 83 on the recording head 78 side. Then, the recording head 78 side element 83 with the electromotive force supplied thereto transmits the ID information for judging the ink residual amount or the ink pH for the tank replacement to the element 82. Subsequently, the element 82 compares the acquired ink residual amount information and pH information with the ID information, and instructs the element 83 to inform the outside of the tank replacement only when these information meet with each other. The element 83 receives this, and transmits the signal for informing the outside of the tank replacement or outputs the sound, light, and the like to human eyes and sense of hearing. A method of supplying the electromotive force together with the information to the other element from the certain element in this manner is also considered.

Additionally, for the recording head 78, the ink is bubbled by heat of electricity/heat converting elements such as a heater in the liquid path, and the ink is supposedly ejected via a micro opening connected to the liquid path by a bubble growth energy.

Other embodiments to which the aforementioned respective embodiments can be applied will be described hereinafter.

<Information Input Means>

In addition to the information about the ink and information acquiring means described above in the respective embodiments, examples of the information acquiring means for acquiring the information include: (1) a sensor (ion sensor) for detecting ink pH, in which the $SiO_2$ film or the SiN film is formed as an ion sensitive film; (2) a pressure sensor having a diaphragm structure for detecting a pressure change in the tank; (3) a sensor for detecting the existing position of a photodiode, and the ink residual amount, in which the photodiode for converting light to the heat energy and producing a pyroelectric effect; (4) a sensor for using a conductive effect of the material to detect the presence/absence of the ink in accordance with a moisture amount in the tank; and the like.

A case in which the ion sensor is used as the information acquiring means will be described hereinafter in detail.

Figure 19:
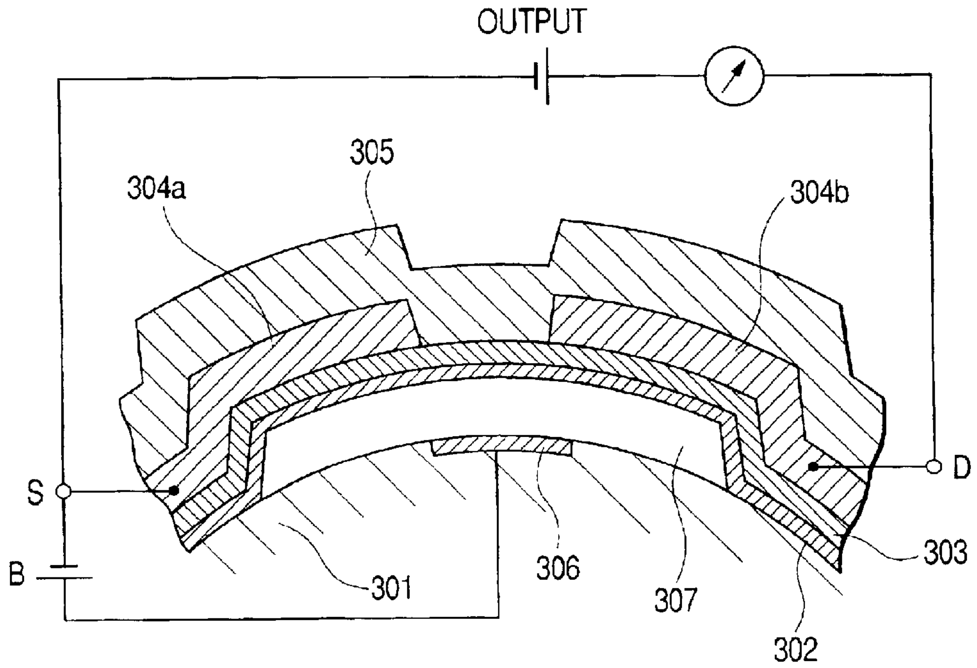
FIG. 19 is an explanatory view of an ion sensor as one example of information acquiring means constituting the solid semiconductor element of the present invention.

FIG. 19 is a sectional view of the ion sensor disposed in the solid semiconductor element of the present invention. In FIG. 19, S denotes a source, B denotes a bias, and D denotes a drain.

As shown in FIG. 19, an ion sensitive film 302 formed of SiN or $SiO_2$ is formed on the surface of a spherical silicon 301 as a base of the solid semiconductor element, and a part of the film is disposed at an interval from the spherical silicon 301 via a gap 307. A gate insulating film 303 is formed on the surface of the ion sensitive film 302. Furthermore, an N-type well layer constituted of a source region 304*a* with N-type impurities introduced therein and N-type well layer formed of a drain region 304*b* are formed on the surface of the gate insulating film 303, and further a P-type well layer 305 is formed on the layers. Moreover, a reference electrode 306 is formed on a part of the surface of the spherical silicon 301 in a region in which the gap 307 is formed. This constitutes an ion sensor 300 as an ion selective field effect transistor (FET).

The gap 307 can be formed by forming a sacrifice layer to cover the reference electrode 306 before forming the ion sensitive film 302, and the like on the surface of the spherical silicon 301 with the reference electrode 306 formed thereon, subsequently forming the P-type well region 305, and subsequently etching/removing the sacrifice layer. Moreover, the gap 307 is connected to the outside of the ion sensor 300 via a connection portion (not shown). While the solid semiconductor element is disposed in the ink, the ink can freely move in the gap 307 via the connection portion.

When the ion sensitive film 302 contacts the ink, an interface state potential is generated between the ion sensitive film 302 and the ink in accordance with the ion type and concentration in the ink. When a predetermined bias voltage is applied between source and drain of the ion sensor 300, a drain current flows in accordance with the interface state potential. During measurement, an appropriate bias is applied between the reference electrode 306 and the source, and an output (drain current) corresponding to a sum of the interface state potential and bias is observed. Alternatively, the ion sensor 300 is constituted as a source follower circuit, and the output may be obtained as the potential via a resistance.

Figure 20A:
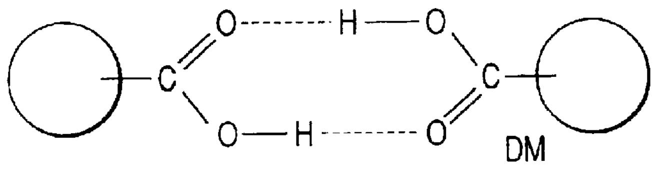
FIGS. 20A and 20B are explanatory views of an associated state of dye ion in the ink.
Figure 20B:
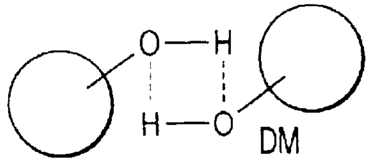

Additionally, the ink for use in the ink jet recording apparatus is generally formed by solving or dispersing dye or pigment in water as a solvent. Examples of the ink include a dye ion having a carboxyl group or a hydroxide group, a pigment set to be hydrophilic by a dispersant having the group, and pigment particles to which the groups are attached and which are dissolved or dispersed in water. As shown in FIGS. 20A and 20B, the dye or the pigment forms an associated state (a state of assembly) by a hydrogen bond or another relatively weak bond in the ink as an aqueous solution. When the associated state occurs among several tens/hundreds of molecules, a polymeric color material molecule is virtually formed, an ink dynamic viscosity is lowered, and as a result the ejection property of the recording head is deteriorated. In FIGS. 20A and 20B, DM denotes a dye molecule.

When the aforementioned associated state is formed, an activity of the carboxyl group or the hydroxide group as the ion is apparently lowered, and an effective molecular weight of the ion itself increases. Therefore, the detected potential in the ion sensor 300 is changed. The solid semiconductor element of the present example is disposed, for example, in contact with the recording head ink, the associated state of the dye ion in the ink is detected by the ion sensor 300, a recovering operation of the recording head is performed if necessary, and the ink in the recording head is brought to a constant dissociated state.

Figure 21A:
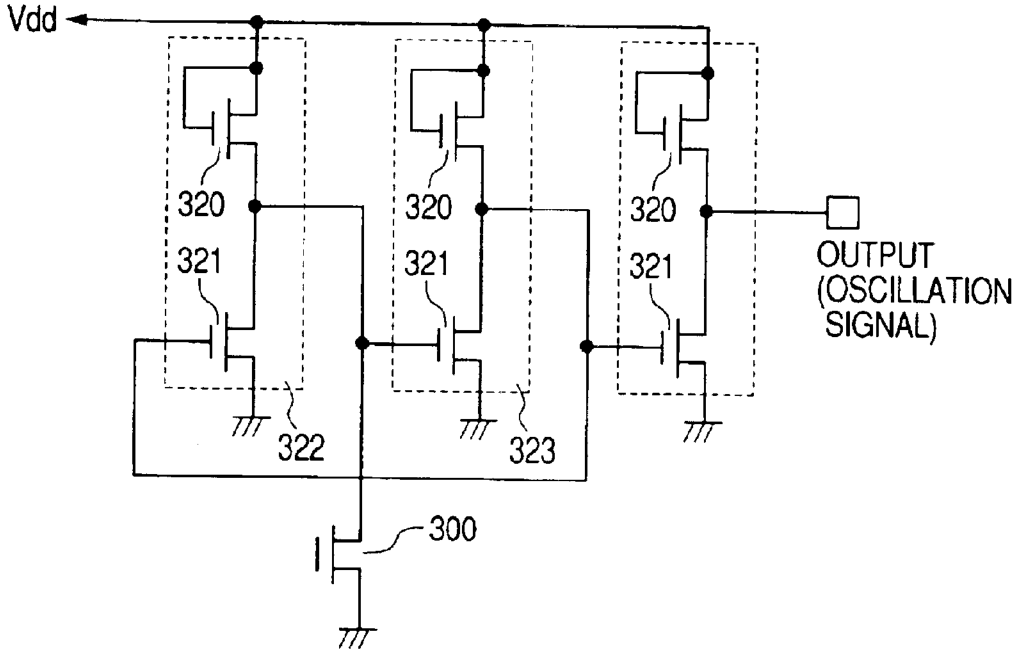
FIGS. 21A and 21B are diagrams showing one example of a circuit for outputting a detection result in the ion sensor shown in FIG. 19.
Figure 21B:
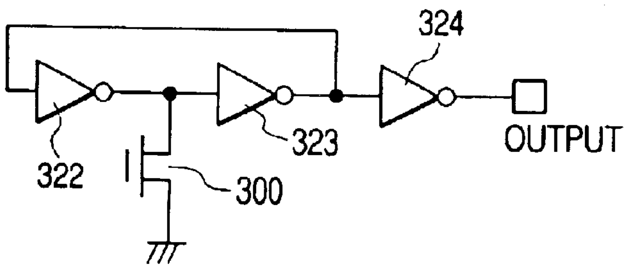

FIG. 21A is a diagram showing one example of a circuit for outputting a detection result in the ion sensor, and FIG. 21B shows the circuit of FIG. 21A as a logic circuit. Here, the oscillation circuit whose oscillation frequency changes in accordance with the ion concentration will be described.

In an example of FIGS. 21A and 21B, MOS transistors 320, 321 are connected in series with each other to constitute inverter circuits 322, 323. These inverter circuits 322, 323 are connected in a two-stages annular shape to constitute the oscillation circuit. Furthermore, the output of the inverter circuit 323 is extracted as the oscillation output via the first-stage inverter circuit 322 as a buffer. The ion sensor 300 is inserted between the output of the inverter circuit 322 (i.e., the input of the inverter circuit 323) and a ground point. According to the circuit, the oscillation frequency changes in accordance with the detected potential in the ion sensor 300. Therefore, when the oscillation frequency is detected, the ink ion concentration can be detected.

When the solid semiconductor element of the present invention is disposed in the ink of the ink tank, particularly in the vicinity of the liquid surface, as described above, the color material molecules in the ink are associated, the polymer state is virtually formed, and the molecules settle in the vicinity of the bottom surface. Generation of a concentration distribution and pH distribution in the ink in the ink tank can be detected. When the result is transmitted to the outside, an operation for removing these distributions can be performed.

A detected voltage value in the ion sensor 300 is governed by Nernst equation, and is therefore a function of temperature. To eliminate an influence of temperature, for example, the temperature sensor is also separately disposed, so that a measured value of ion concentration can be corrected in accordance with the measured value of temperature. When the temperature sensor is disposed in this manner, the ion sensor and temperature sensor may be formed in the same element, or may be formed in separate elements. With the separate elements, as in the fourth embodiment, the information acquired by the element with the temperature sensor formed therein may be transmitted to the element with the ion sensor formed therein.

Moreover, according to Stokes' law derived from hydrodynamics, an ion molar concentration λ is represented by the following equation:

$$\lambda = \frac{|Z| \cdot F^2}{6\pi N \eta r} \qquad (14)$$

(here, Z: ion charge number, F: Faraday constant, N: molecule number per unit area, η: viscosity, r: ion radius). Moreover, an ion diffusion coefficient D is represented by the following equation:

$$D = \frac{RT\lambda}{|Z| \cdot F^2} \qquad (15)$$

(here, R: gas constant, T: absolute temperature). It is assumed that this Stokes' law of hydrodynamics can be applied to ion movement in the ink. In this case, an ink molar conductivity λ and diffusion coefficient D are measured and stored in the information storing means disposed in the element or a memory disposed beforehand outside the element, before the ink is injected to an ink cartridge or the ink tank.

When only the color material component (dye or pigment) in the ink is noted, the ion radius r, viscosity η, and charge number Z are variable parameters.

Furthermore, a dipole moment $\mu$ of the noted ion is represented by the following equation.

$$\mu = \frac{\lambda}{F} \qquad (16)$$

An ink dielectric constant ε is represented by the following equation:

$$\varepsilon = 2\pi N \frac{\mu^2 g}{kT} \qquad (17)$$

(here, g: amount determined by relative orientation of adjacent molecules, k: Boltzmann constant).

The aforementioned ion sensor is used. The detected potential change is considered to be proportional to (ion charge number Z/ion radius r). A change of viscosity η can relatively be estimated from the equation (10). It is considered that a pulse control for setting the ejection property to be constant in accordance with the change of the viscosity η can be remarkably effective means.

<Constitution of Ink Tank>

Some constitution examples of the ink tank to which the solid semiconductor element of the aforementioned embodiments can be applied are shown in FIG. 22 to FIG. 25.

Figure 22:
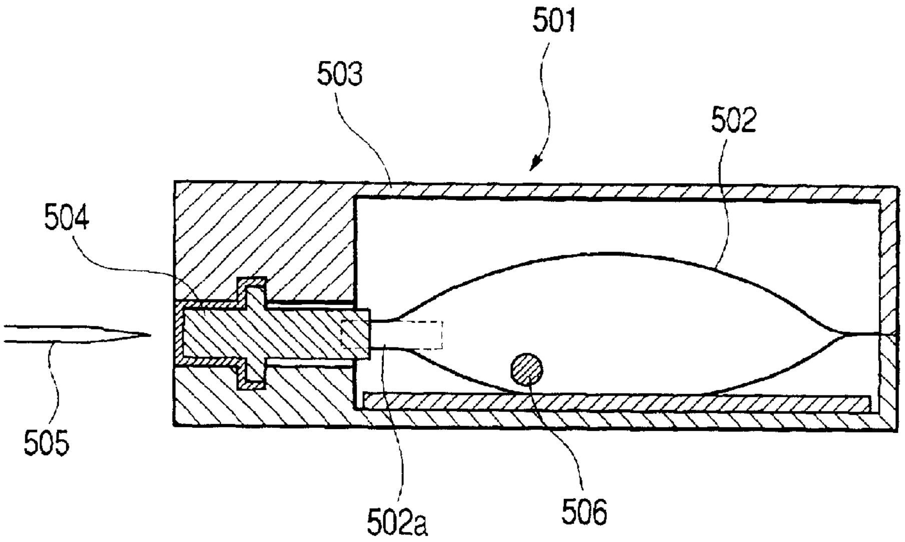
FIG. 22 is a diagram showing an example of the preferred ink tank in which the solid semiconductor element is disposed according to various embodiments of the present invention.

In an ink tank 501 shown in FIG. 22, a flexible ink bag 502 with the ink contained therein is disposed in a housing 503, a bag inlet 502*a* is closed by a rubber stopper 504 fixed to the housing 503, a hollow needle 505 for deriving the ink is stuck through the bag via the rubber stopper 504, and the ink is supplied to an ink jet head (not shown). A solid semiconductor element 506 of the present invention is disposed in the ink bag 502 of the ink tank 501, and the information of the ink contained in the ink bag 502 can be detected.

Figure 23:
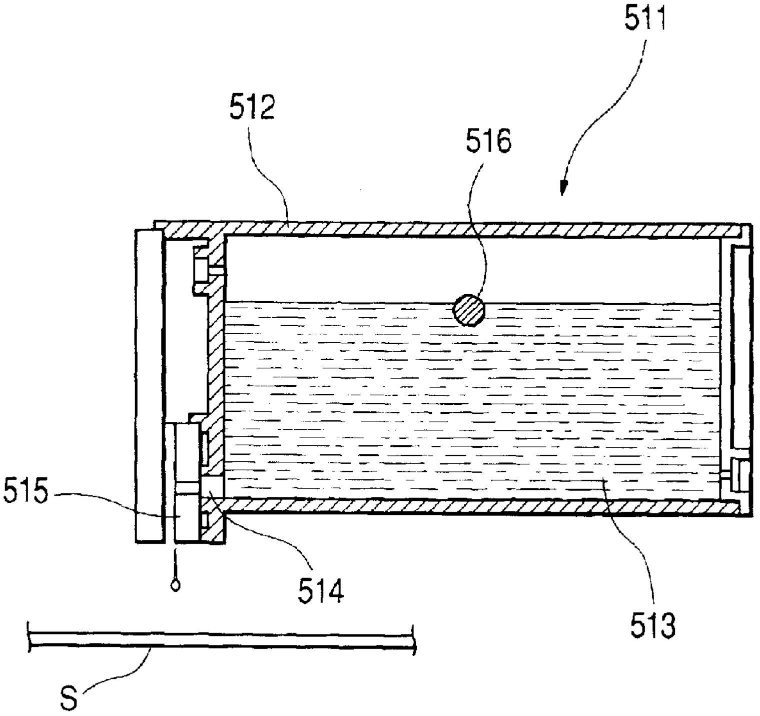
FIG. 23 is a diagram showing an example of the preferred ink tank in which the solid semiconductor element is disposed according to various embodiments of the present invention.

Moreover, in an ink tank 511 shown in FIG. 23, an ink jet head 515 for ejecting the recording ink to a recording sheet S is attached to an ink supply port 514 of a housing 512 in which an ink 513 is contained. A solid semiconductor element 516 of the present invention is disposed in the ink 513 in the ink tank 511, and the information of the ink 513 in the housing 512 can be detected.

Figure 24:
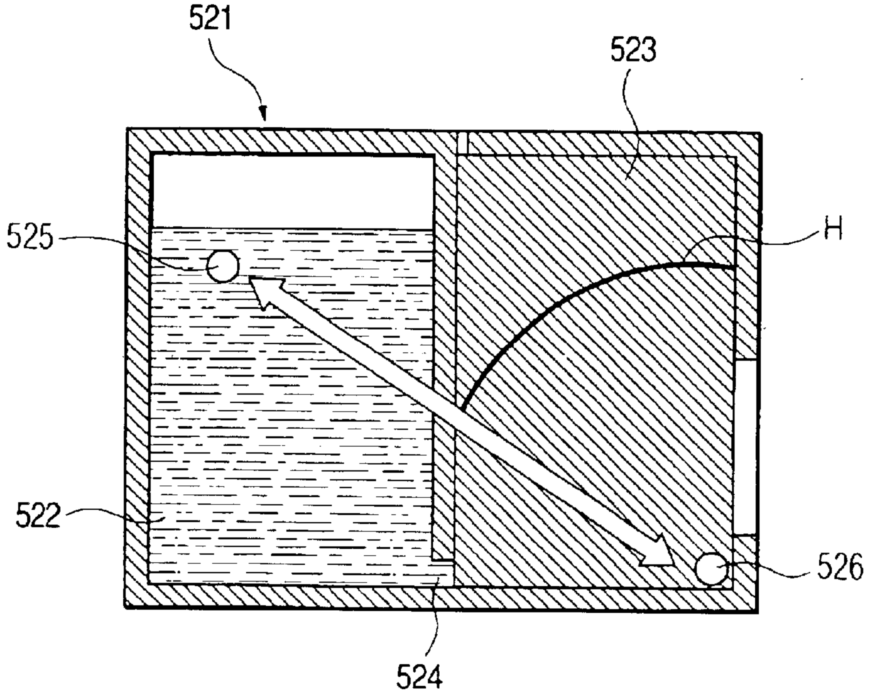
FIG. 24 is a diagram showing an example of the preferred ink tank in which the solid semiconductor element is disposed according to various embodiments of the present invention.

Moreover, an ink tank 521 shown in FIG. 24 has a constitution similar to that of the ink tank shown in FIG. 6, and the like, and includes: an ink chamber in which an ink 522 is contained and which is substantially in a sealed state excluding a communication path 524; a negative pressure generating chamber in which a negative pressure generating member 523 is contained and which is in an atmosphere connected state; and the communication path 524 for connecting the ink chamber to the negative pressure generating chamber in a lowermost portion of the tank. In the ink tank 521 constituted as described above, solid semiconductor elements 525, 526 of the present invention are disposed in the ink chamber and negative pressure generating chamber, respectively, so that the information about the ink of each divided chamber may be exchanged.

Figure 25:
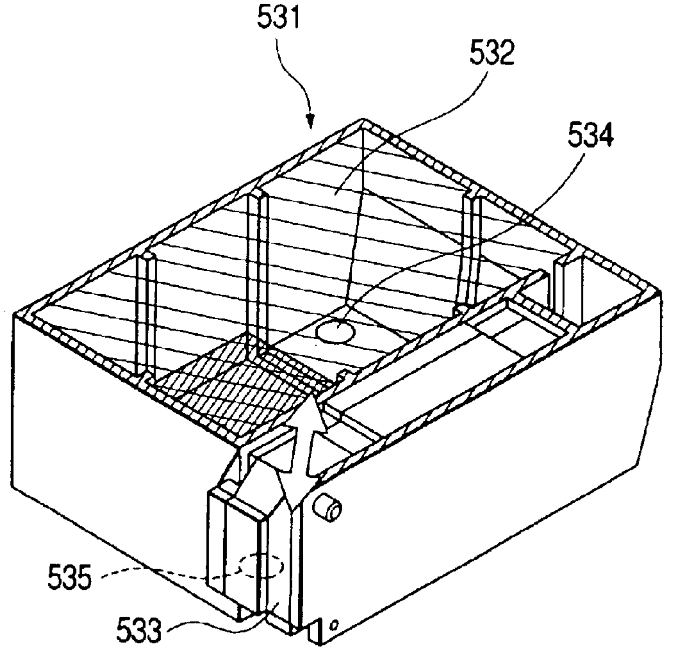
FIG. 25 is a diagram showing an example of the preferred ink tank in which the solid semiconductor element is disposed according to various embodiments of the present invention.

Moreover, for an ink tank 531 shown in FIG. 25, a porous member 532 for absorbing/holding the ink is contained inside, and an ink jet head 533 in which the contained ink is used for a recording purpose is attached. Even in the tank 531 constituted in this manner, similarly as the constitution shown in FIG. 17, 18, solid semiconductor elements 534, 535 of the present invention are disposed on an ink tank 531 side and ink jet head 533 side, respectively, and the information about the ink in the respective divided constitutional portions may be exchanged.

<Ink Jet Recording Apparatus>

Figure 26:
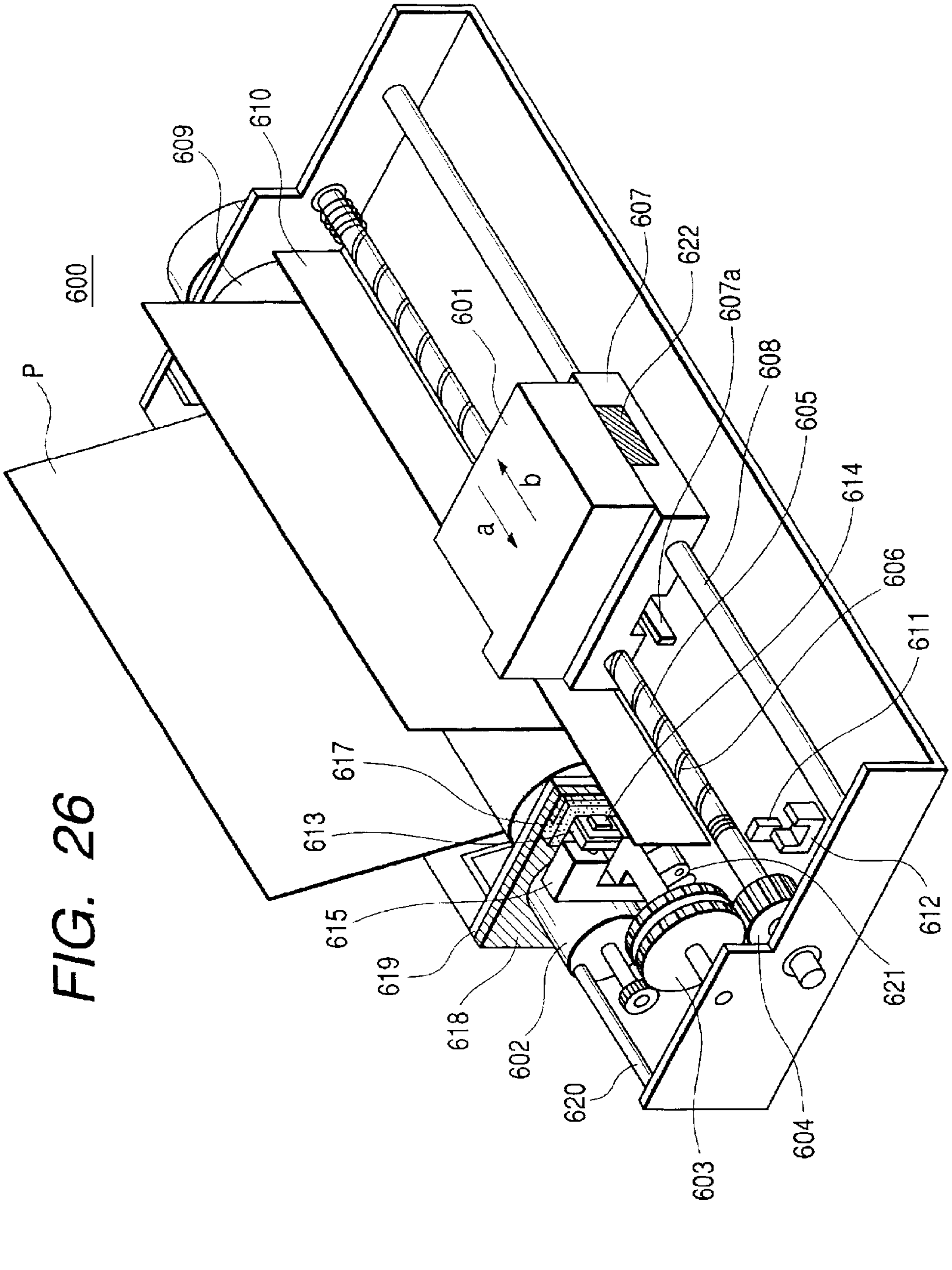
FIG. 26 is a schematic perspective view showing one example of an ink jet recording apparatus on which the ink tank provided with the solid semiconductor element of the present invention is mounted.

FIG. 26 is a schematic perspective view showing the ink jet recording apparatus on which the ink tank provided with the solid semiconductor element of the present invention is mounted. A head cartridge 601 mounted on an ink jet recording apparatus 600 shown in FIG. 26 has a liquid ejection head for ejecting the printing/recording ink, and an ink tank for holding the liquid supplied to the liquid ejection head as shown in FIG. 22 to FIG. 25. Moreover, outside energy supply means 622 for supplying the electromotive force as an outside energy to the solid semiconductor element (not shown) disposed in the ink tank, and means (not shown) for bidirectionally communicating the information with the solid semiconductor element are disposed in the recording apparatus 600.

As shown in FIG. 26, the head cartridge 601 is mounted on a carriage 607 engaged with a spiral groove 606 of a lead screw 605 rotated with forward/reverse rotation of a drive motor 602 and via drive force transmission gears 603 and 604. The head cartridge 601 reciprocates/moves with the carriage 607 along a guide 608 by the drive power of the drive motor 602 in directions of arrows a and b. The ink jet recording apparatus 600 is provided with recording material conveying means (not shown) for conveying a printing sheet P as a recording material which receives the ink or another liquid ejected from the head cartridge 601. By the recording material conveying means, a sheet press plate 610 of the printing sheet P conveyed on a platen 609 presses the printing sheet P onto the platen 609 in the movement direction of the carriage 607.

Photocouplers 611 and 612 are disposed in the vicinity of one end of the lead screw 605. The photocouplers 611 and 612 are home position detection means for checking presence of a lever 607*a* of the carriage 607 in regions of the photocouplers 611 and 612 and changing a rotation direction of the drive motor 602. A support member 613 for supporting a cap member 614 to cover a front surface including an ejection port of the head cartridge 601 is disposed in the vicinity of one end of the platen 609. Moreover, ink suction means 615 is disposed to suck the ink accumulated in the cap member 614 by empty ejection from the head cartridge 601. The head cartridge 601 is sucked/recovered by this ink suction means 615 via an opening of the cap member 614.

A main body support 619 is disposed in the ink jet recording apparatus 600. A moving member 618 is supported by the main body support 619 to be movable in a back to forth direction, that is, in a direction crossing at right angles to the movement direction of the carriage 607. A cleaning blade 617 is attached to the moving member 618. The cleaning blade 617 is not limited to this mode, and another known cleaning blade may be used. Furthermore, a lever 620 for starting suction during the suction/recovery operation by the ink suction means 615 is disposed. The lever 620 moves with movement of a cam 621 which meshes with the carriage 607, and is moved/controlled by known transmission means for transmitting the drive force from the drive motor 602 by changing a clutch. An ink jet recording controller for transmitting a signal to a heat generator disposed in the head cartridge 601 and driving/controlling the aforementioned respective mechanisms is disposed on a recording apparatus main body side, and is not shown in FIG. 24.

In the ink jet recording apparatus 600 having the aforementioned constitution, the head cartridge 601 reciprocates/moves over a whole width of the printing sheet P with respect to the printing sheet P conveyed on the platen 609 by the recording material conveying means. During the movement, when the drive signal supply means (not shown) supplies the drive signal to the head cartridge 601, the ink (recording liquid) is ejected to the recording material from the liquid ejection head portion and the sheet is recorded.

Additionally, in FIG. 26 an outer covering of the ink jet recording apparatus is not shown, but a translucent covering may be used such that an inside state can be seen. When a translucent ink tank is used together, and light is fused as transmission means, a user can see tank light. For example, it can easily be seen that "tank needs to be replaced", and the user can be reminded of the need for tank replacement. In a conventional art, the light emitting means is disposed in an operation button of the recording apparatus main body. When the light emitting means emits light, the user is notified of the tank replacement. However, the light emitting means frequently performs several display functions. Therefore, even when the light emitting means emits the light, the user cannot easily understand a meaning of emitted light in many cases.

<Stabilization of Floating Type Solid Semiconductor Element on Liquid Surface>

When the solid semiconductor element has a hollow portion as shown in FIGS. 9A to 9G, and the power is supplied to the solid semiconductor element by the oscillation circuit and outside resonance circuit shown in FIG. 5, even in any state of the ink tank, a stable magnetic flux (magnetic field) needs to act between the oscillation circuit and outside resonance circuit formed in the element. That is, the direction of the element with respect to the outside resonance circuit needs to be stabilized. However, when the element floats in the ink or another liquid, the liquid surface vibrates by outside vibration, and element direction sometimes fluctuates. Even in this case, the gravity center of the floating type solid semiconductor element is determined as follows, so that the element holds its stable posture in the liquid.

Figure 27A:
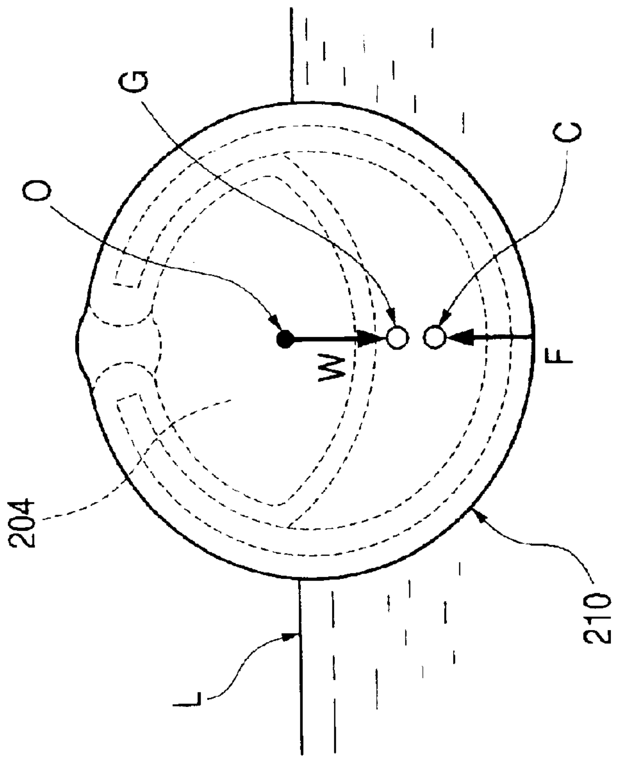
FIGS. 27A and 27B are explanatory views showing a condition for holding a stable state of the solid semiconductor element manufactured in the method shown in FIGS. 9A to 9G in the liquid.
Figure 27B:
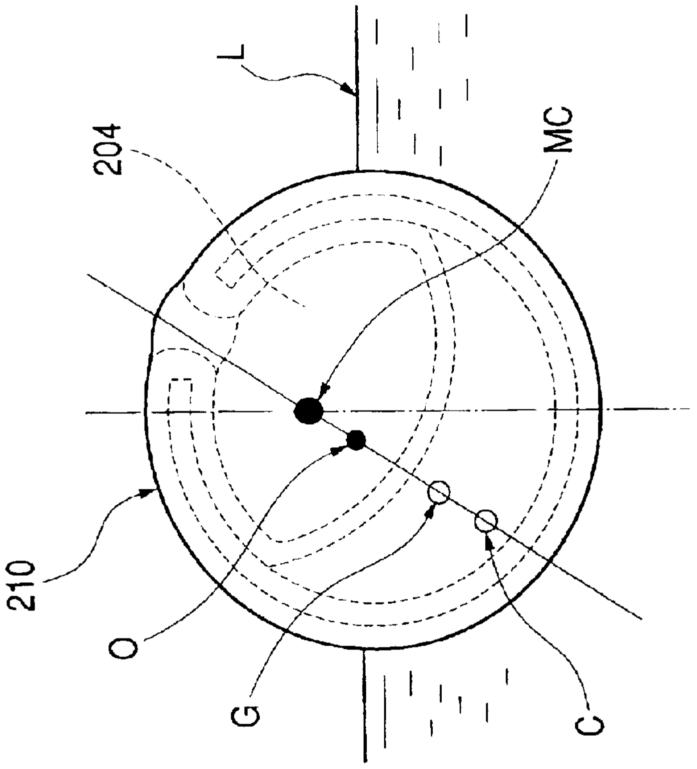

As shown in FIGS. 27A and 27B, when a solid semiconductor element 210 formed as a sphere is floated in the liquid, to obtain a balanced state as shown in FIG. 27A, the following relations need to be established:

(1) a buoyancy F=material weight W; and (2) a buoyancy action line meets with a weight action line (line passed through the gravity center). In FIGS. 27A and 27B, L denotes an ink surface, and MC denotes a metacenter.

Here, an intersection of the weight action line in the balanced state (dashed line in FIG. 27B) with the buoyancy action line during tilting (solid line in FIG. 27B) is the metacenter, and a distance h between the metacenter and the gravity center G is a height of the metacenter.

The metacenter of the solid semiconductor element 210 is positioned higher than the gravity center G, and a couple of forces (restoring force) acts in a direction to return the original balanced position. A restoring force T is represented by the following equation.

$$T=Wh\sin\theta=Fh\sin\theta=\rho gVh\sin\theta(>0) \quad (18)$$

Here, V denotes a volume of the liquid discharged by the solid semiconductor element 210, and $\mu g$ is a specific weight of the solid semiconductor element 210.

In order to set the restoring force T to be positive, h>0 is a necessary and sufficient condition.

Then, the following equation results from FIG. 27B.

$$h=(I/V)-\overline{CG} \quad (19)$$

Here, I denotes an inertia moment around an 0 axis. Therefore, the following relation is a necessary condition, such that the solid semiconductor element 210 steadily floats in the ink, supplies the induced electromotive force from the outside resonance circuit and bidirectionally communicates with communication means outside the element.

$$(I/V)>\overline{CG} \quad (20)$$

<Pressure Sensor>

Here, one example of the pressure sensor described in the first embodiment and utilized for detecting the liquid density will be described in detail.

Figure 28:
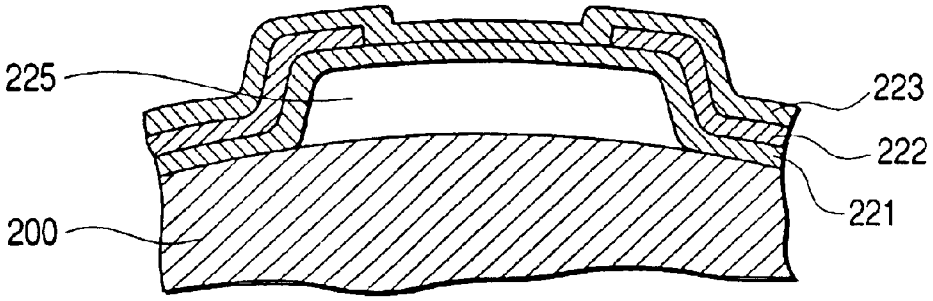
FIG. 28 is an explanatory view showing one example of a structure of a pressure sensor disposed in the solid semiconductor element of the present invention.

The pressure detecting sensor shown in FIG. 28 is a semiconductor strain gauge in which a piezo resistance effect in the polysilicon film is utilized. The sensor is formed in a constantly ink contacting position of the surface of the solid semiconductor element formed of the spherical silicon. A polysilicon resistance layer 221 is formed as a partially raised diaphragm via a hollow portion 225 on the surface of a spherical silicon 200. A wiring 222 formed of Cu or W is disposed in opposite ends of the raised region of the polysilicon resistance layer 221. Moreover, the polysilicon resistance layer 221 and wiring 222 are coated with a protective film 223 formed of SiN, and constitute pressure adjustment means.

Figure 29:
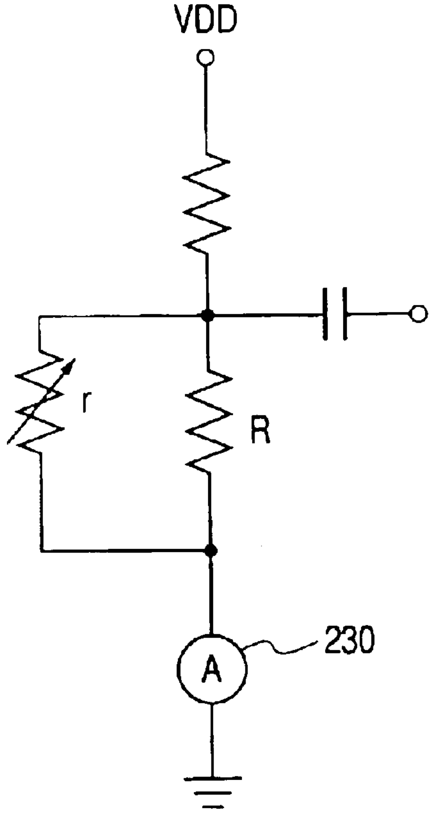
FIG. 29 is a circuit diagram of a circuit for monitoring an output from a polysilicon resistance layer shown in FIG. 28.

A pressure detection principle by the pressure detecting sensor shown in FIG. 28 will next be described with reference to FIGS. 28 and 29. FIG. 29 is a circuit diagram of a circuit for monitoring an output from the polysilicon resistance layer shown in FIG. 28.

In FIG. 29, it is assumed that a normal resistance value of the polysilicon resistance layer 221 is r. Then, the following current flows through an ammeter 230.

$$VDD/(R_o+Rxr(R+r))\} \quad (21)$$

Moreover, polysilicon has a property such that the resistance value increases in proportion to displacement. Therefore, when the polysilicon resistance layer 221 is displaced by the pressure change of a channel 212, the resistance value r of the polysilicon resistance layer 221 changes, and as a result a current i measured by the ammeter 230 also changes. That is, the displacement amount of the polysilicon resistance layer 221 is known from the change of the current i, and the ink pressure can thereby be detected.

This respect will be described in further detail. When a length of the polysilicon resistance layer 221 is L, and a sectional area is S, resistivity ρ is used to represent a total resistance value R as follows.

$$R=\rho L/S \quad (22)$$

Here, when the polysilicon resistance layer 221 changes with the pressure change, a length is long, that is, L+ΔL, and the resistance value increases. On the other hand, the sectional area is small, that is, S−ΔS. Moreover, ρ changes to ρ'. A relation between an increase ΔR of the resistance value and an increase ΔL of the length is represented as follows.

$$\begin{aligned} R+\Delta R &= \frac{\rho'(L+\Delta L)}{S-\Delta S} \\ &\approx \frac{\rho L}{S}+\Delta L\frac{\rho'}{S-\Delta S} \end{aligned} \quad (23)$$

Furthermore, the following equation results.

$$\begin{aligned} \frac{\Delta R}{R} &= \frac{\rho'}{\rho}\times\frac{S}{S-\Delta S}\times\frac{\Delta L}{L} \\ &= kg\times\frac{\Delta L}{L} \end{aligned} \quad (24)$$

Here, kg denotes a change coefficient of the resistance value with respect to the strain.

Moreover, when a bridge circuit or the like is used to detect a change ΔR of the resistance value, the pressure fluctuation can be obtained.

Polysilicon has a property such that strain pressure changes with temperature. Therefore, the pressure detecting sensor including the polysilicon resistance layer 221 preferably further comprises a temperature sensor for monitoring the temperature of the polysilicon resistance layer 221. That is, when a voltage VDD is supplied to the polysilicon resistance layer 221 via the temperature sensor, the resistance change of the polysilicon resistance layer 221 by an environmental temperature change is compensated, and the ink pressure can be detected more accurately.

<Application of Solid Semiconductor Element to Apparatus other than Ink Tank>

The present invention has been described above by way of an example in which the ink information of the ink tank for use in the ink jet recording apparatus is detected. The present invention is not limited to this, and effective in detecting the information about the liquid contacting the element from the outside.

Here, an example will be described in which the solid semiconductor element of the present invention is applied to an apparatus other than the ink tank.

Figure 30:
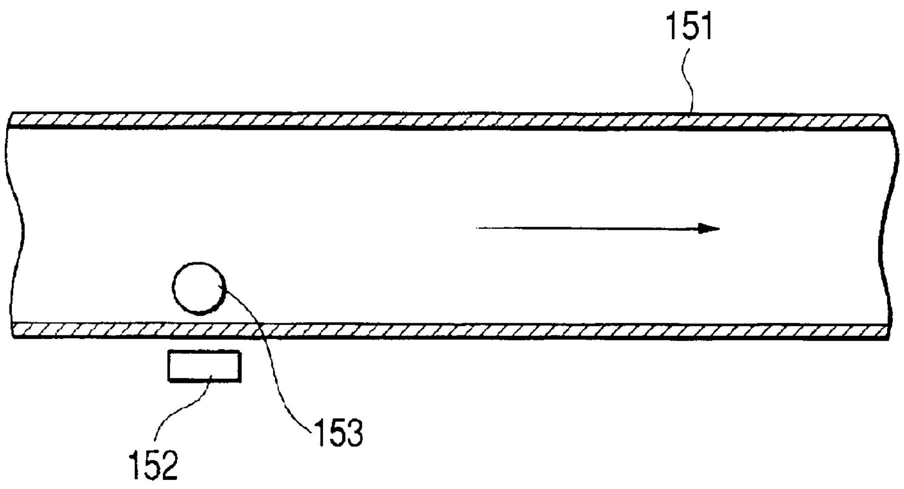
FIG. 30 is a sectional view of a water tube in which the solid semiconductor element of the present invention is disposed.

FIG. 30 is a sectional view of a water tube in which the solid semiconductor element of the present invention is disposed. In the example shown in FIG. 30, a solid semiconductor element 153 of the present invention is fixed in a water tube 151 through which the liquid flows in a shown arrow direction. The solid semiconductor element 153 has the oscillation circuit (not shown) as the energy converting means, and the outside resonance circuit 152 for supplying the power to the solid semiconductor element 153 via the resonance circuit is disposed in the vicinity of the solid semiconductor element 153 outside the water tube 151. When the solid semiconductor element 153 is disposed in the water tube 151, the resonance frequency range by the outside resonance circuit 152 is varied, and a liquid property change can be read along the liquid flow in the water tube 151 from the output generated from the oscillation circuit in the solid semiconductor element 153.

Figure 31:
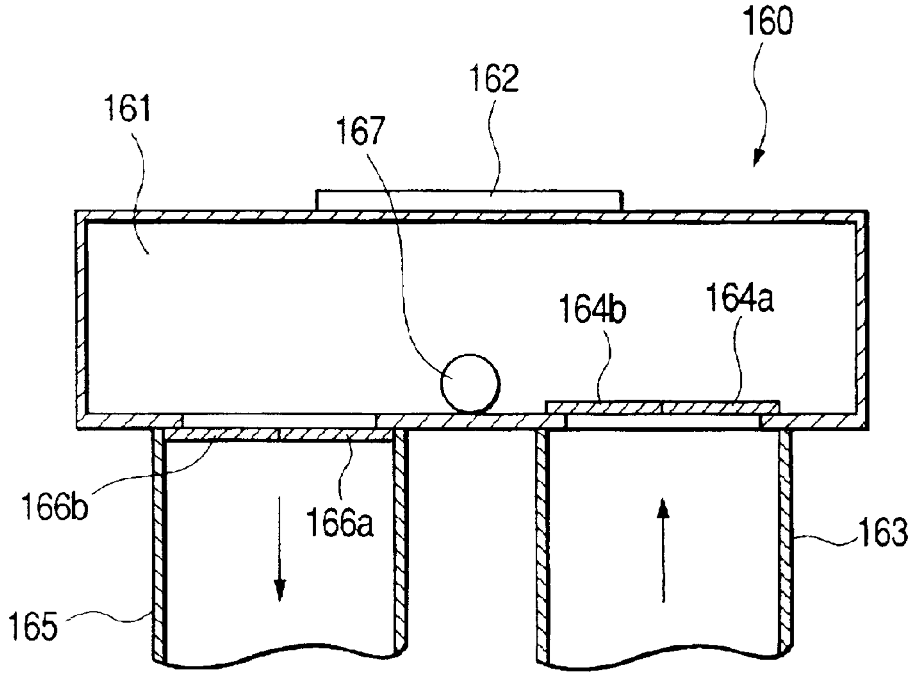
FIG. 31 is a schematic sectional view of a micro valve in which the solid semiconductor element of the present invention is disposed.

FIG. 31 is a schematic sectional view of a micro valve in which the solid semiconductor element of the present invention is disposed. As shown in FIG. 31, in a micro valve 160, a piezoelectric element 162 is attached to a wall surface. The valve includes: a liquid chamber 161 with a inflow port and outflow port of the liquid formed therein; inflow valves 164*a*, 164*b* which are disposed in the inflow port of the liquid chamber 161 and which open only inwardly in the liquid chamber 161; and outflow valves 166*a*, 166*b* which are disposed in the outflow port of the liquid chamber 161 and which open only outwardly from the liquid chamber 161. The inflow port is connected to an inflow tube 163, and the outflow port is connected to an outflow tube 165. Moreover, a solid semiconductor element 167 of the present invention is fixed in the liquid chamber 161.

Figure 32A:
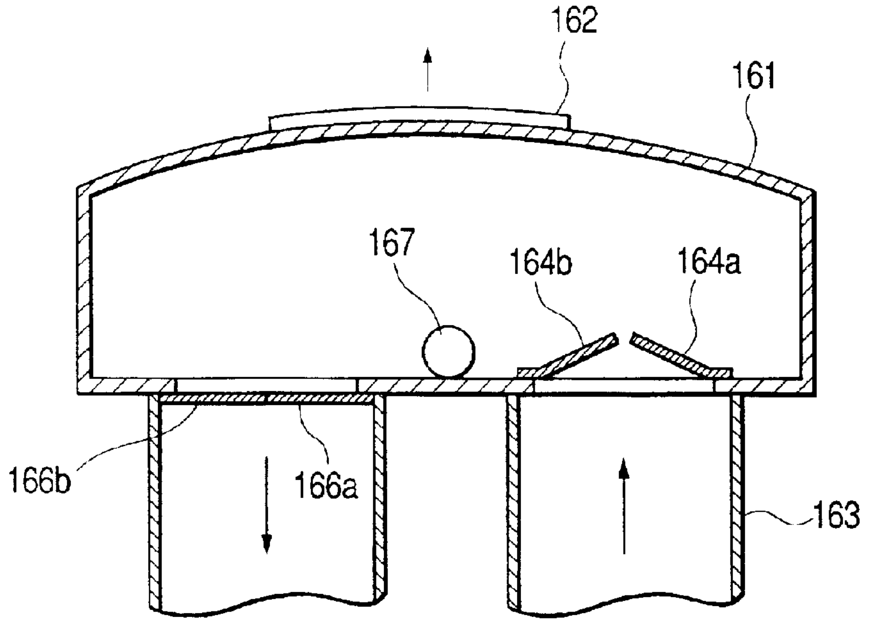
FIGS. 32A and 32B are explanatory views showing an operation of the micro valve shown in FIG. 31.
Figure 32B:
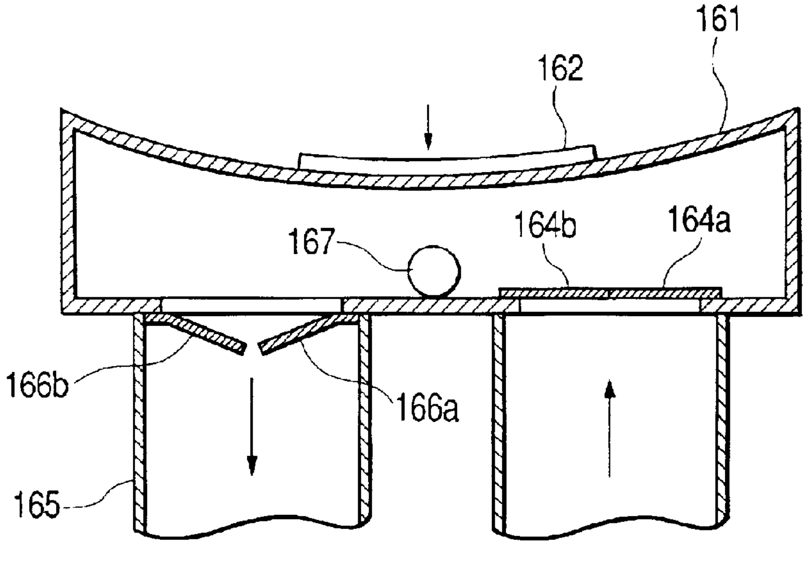

In the micro valve 160 shown in FIG. 31, deflection/deformation of the piezoelectric element 162 caused by applying the voltage to the piezoelectric element 162 is utilized to change a volume of the liquid chamber 161 as shown in FIGS. 32A and 32B. That is, when the piezoelectric element 162 is deformed as shown in FIG. 32A, the volume of the liquid chamber 161 increases, the inflow valves 164*a*, 164*b* then open, and the liquid flows into the liquid chamber 161 via the inflow tube 163. Thereafter, when the piezoelectric element 162 is deformed as shown in FIG. 32B, the volume of the liquid chamber 161 decreases, the outflow valves 166*a*, 166*b* then open, and the liquid flows to the outflow tube 165 out of the liquid chamber 161. When this operation is repeated, the liquid can be transmitted to the outflow tube 165 from the inflow tube 163 via the liquid chamber 161.

The solid semiconductor element 167 disposed in the liquid chamber 161 can detect a chemical property change of the liquid in the liquid chamber 161 with time. The physical property is estimated from the detected chemical property change, and a driving condition of the piezoelectric element 162 can be optimized. As a result, the micro vale 160 shown in FIG. 31 can also be applied to a quantitative pump, an ink jet head, and other devices for ejecting a constant amount of liquid droplets.

Figure 33:
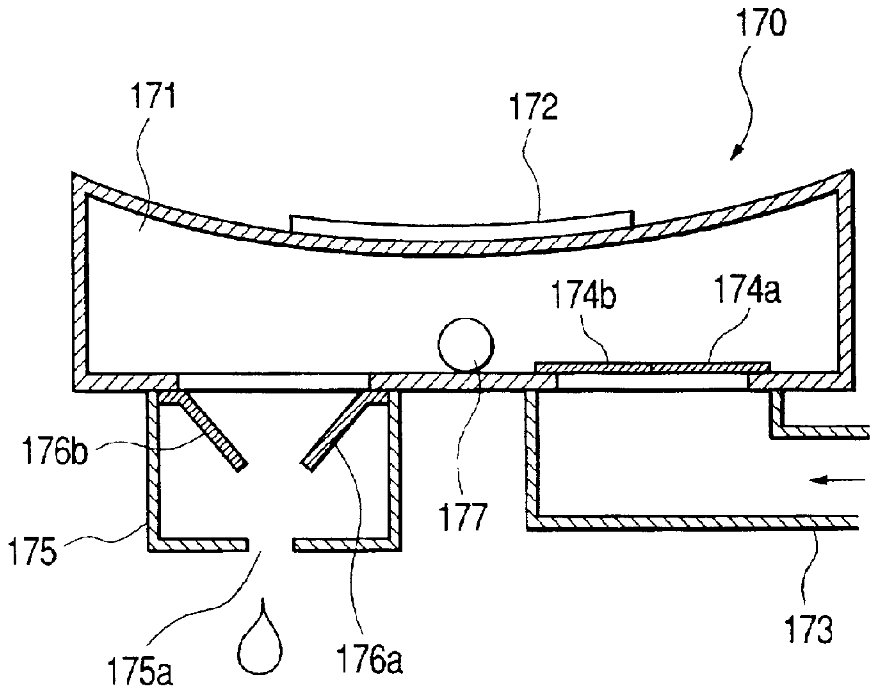
FIG. 33 is a schematic sectional view of an ink jet device to which the micro valve shown in FIG. 31 is applied.

FIG. 33 is a schematic sectional view of an ink jet device to which the micro valve shown in FIG. 31 is applied. An ink jet device 170 shown in FIG. 33 comprises: a liquid chamber 171 to which a piezoelectric element 172 is attached; a supply tube 173 connected to an inflow port of the liquid chamber 171; and an ejecting portion 175 connected to an outflow port of the liquid chamber 171 and having an orifice 175*a* formed therein. Inflow valves 174*a*, 174*b* which open only inwardly in the liquid chamber 171 are disposed in the inflow port of the liquid chamber 171, and outflow valves 176*a*, 176*b* which open only outwardly from the liquid chamber 171 are disposed in the outflow port of the liquid chamber 171. A solid semiconductor element 177 is fixed in the liquid chamber 171.

A basic operation of the ink jet device 170 shown in FIG. 33 is similar to that of the micro valve 160 shown in FIGS. 32A and 32B. When the piezoelectric element 172 is driven, the liquid supplied via the supply tube 173 is ejected as a liquid droplet from the orifice 175*a* of the ejecting portion 175 via the liquid chamber 171. Even in the ink jet device 170, the driving of the piezoelectric element 172 is optimized based on the detection result of the solid semiconductor element 177, and a liquid droplet ejection property can be optimized.

As described above, the present invention is effective in obtaining the information about the liquid in any apparatus in which the liquid is handled. In a most preferable case, as described in the aforementioned embodiments, the present invention is applied to the apparatus for supplying the ink contained in the detachably attached ink tank to the ink jet recording head, detecting the ink information about an ink jet printer for printing the recording sheet with the ink droplet ejected from the recording head, transmitting the information to the ink jet printer, and controlling the printer in an optimum method, or maintaining the inside of the tank in an optimum state.

Moreover, in the aforementioned respective embodiments, the example in which the solid semiconductor element is disposed in the ink tank, water tube, micro valve, or another apparatus for handling the liquid has been described, but the function of the solid semiconductor element may directly be imparted to the apparatus.

As described above, according to the present invention, since the function of acquiring the information about the liquid (ink) and function of transmitted the acquired information to the outside are formed in the element itself, the acquiring of the information about the liquid and transmitting of the information to the outside can efficiently be performed. Particularly, when the solid semiconductor element of the present invention is applied to the ink tank, the driving of the recording head is controlled based on the information acquired by the solid semiconductor element, and high-quality recording can be performed. Concretely, even when the ink tank is replaced with another ink tank, or a different type of ink is inserted, this can be detected. Moreover, the ink viscosity and surface tension changes are estimated, the driving condition of the recording head is optimized/controlled based on the estimation result, and the stable ejection property can be kept.

A constitution in which the solid semiconductor element is utilized in respective color ink tanks for achieving color recording will next be described.

(Fifth Embodiment)

Figure 34:
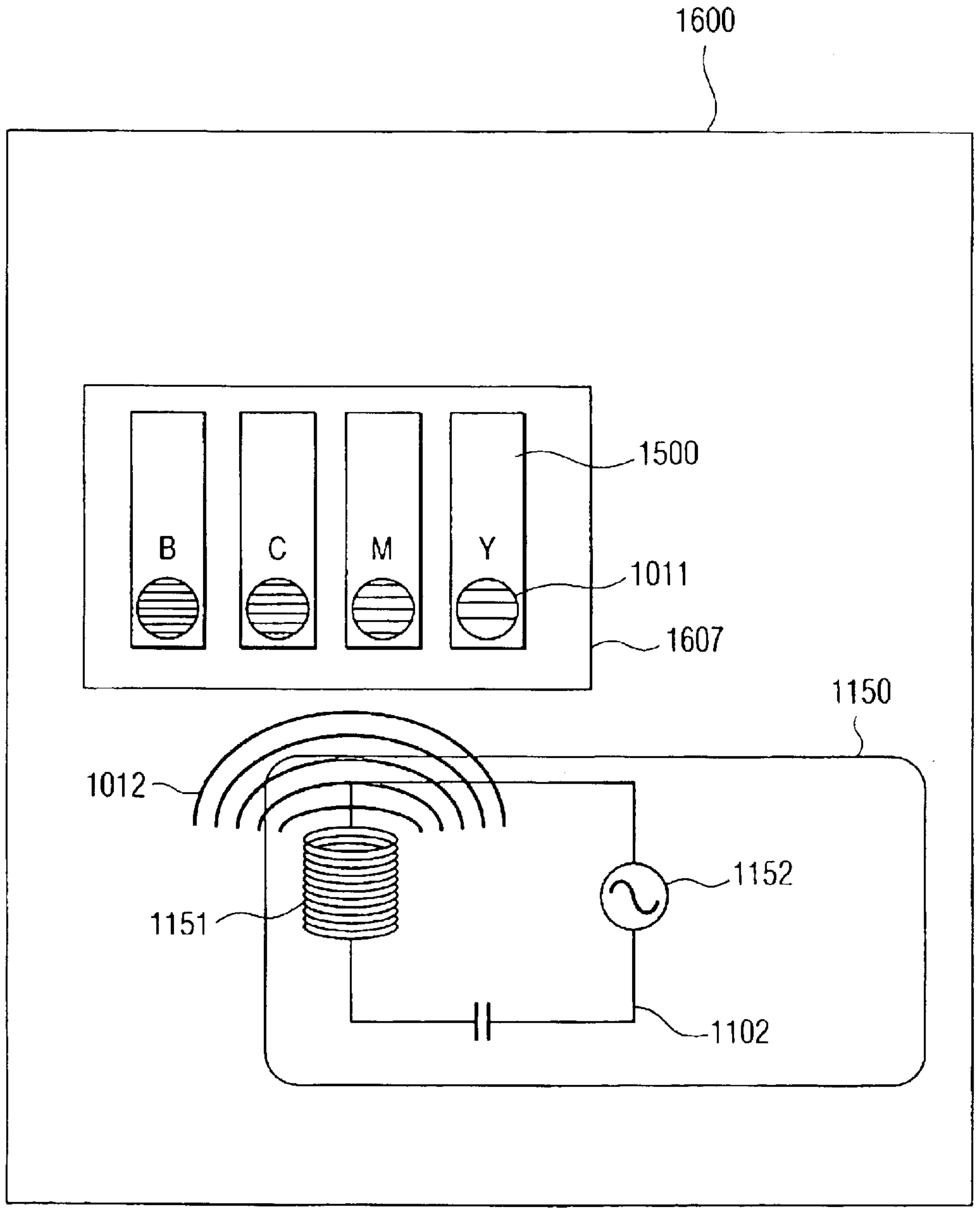
FIG. 34 is a schematic constitution diagram showing the ink jet recording apparatus according to a fifth embodiment of the present invention.

FIG. 34 is a schematic constitution diagram showing the ink jet recording apparatus according to a fifth embodiment of the present invention. An ink jet recording apparatus 1600 shown in FIG. 34 is provided with a carriage 1607 on which a liquid ejection head (not shown) for ejecting the printing/recording ink droplet and respective color ink tanks 1500 for holding the liquid to be supplied to the liquid ejection head are mounted. As the respective color ink tanks 1500, four color tanks of black B, cyan C, magenta M, yellow Y are mounted.

Respective solid semiconductor elements 1011 having communication functions with different response conditions are disposed in the respective color ink tanks, and can communicate with a communication circuit 1150 of the ink jet recording apparatus 1600 disposed outside the ink tank 1500.

Figure 35:
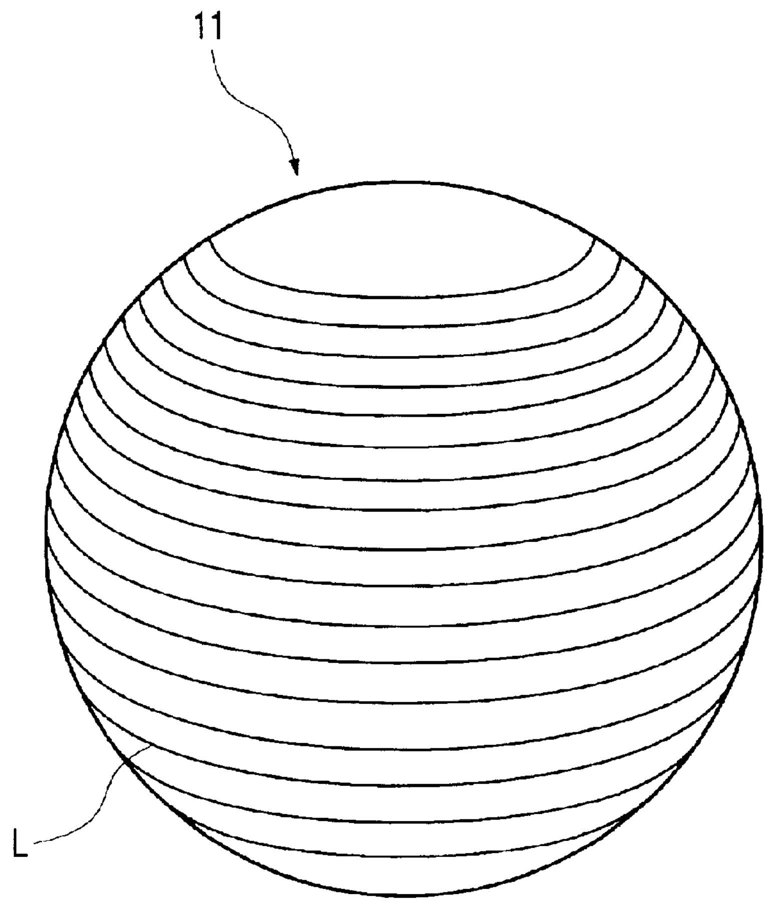
FIG. 35 is a diagram showing a conductor coil wound around a surface of the solid semiconductor element of the present invention to constitute receiving and energy converting means.

The communication circuit 1150 can communicate with communication means of the solid semiconductor element 1011 disposed in the ink tank 1500 by a resonance circuit 1102 constituted of a frequency modulator 1152 and induction coil 1151. The solid semiconductor element 1011 can communicate by resonance by electromagnetic induction of the resonance circuit 1102. In order to achieve the communication function, an induction coil L is wound around the surface of the solid semiconductor element 1011 as shown in FIG. 35. Moreover, to change the response condition of the element for each color, the winding number, length, and the like of the coil L on the solid semiconductor element for each color are changed particularly in the present example, so that the resonance frequency differs in the solid semiconductor element 1011 with each color. The communication circuit 1150 can modulate the electromagnetic induction frequency by the frequency modulator 1152. The resonance frequency of the solid semiconductor element corresponding to the color for the communication is synchronized (tuned), and independent communication for each color is enabled. For example, when the communication circuit 1150 is in synchronization with the resonance frequency for a cyan color, a synchronous signal is received only from the solid semiconductor element disposed in the cyan-color ink tank, the circuit can communicate with the element only with respect to cyan-color tank inside information (when the synchronized signal is transmitted, only the element in the cyan color tank responds to the signal).

Moreover, the solid semiconductor element 1011 is provided with the induction coil L. Therefore, when the coil is used to assemble the oscillation circuit, the electromagnetic induction by the resonance circuit 1102 of the communication circuit 1150 can be converted to the power. Therefore, the power for starting the circuit formed in the element can be supplied in the non-contact manner.

In the aforementioned ink jet recording apparatus, for example, the communication circuit 1150 transmits a signal with a frequency equal to the resonance frequency for the cyan color to the tank via an electromagnetic wave 1012 in order to exchange the information with the cyan-color tank. Then, the power is generated in the coil of the element in the cyan-color tank by the electromagnetic induction, and the circuit in the element can be started. Therefore, when means for acquiring the environmental information of the element or the means for transmitting the environmental information to the outside are disposed in the circuit in the element, the cyan-color tank inside information can be detected and notified to the outside.

Figure 36:
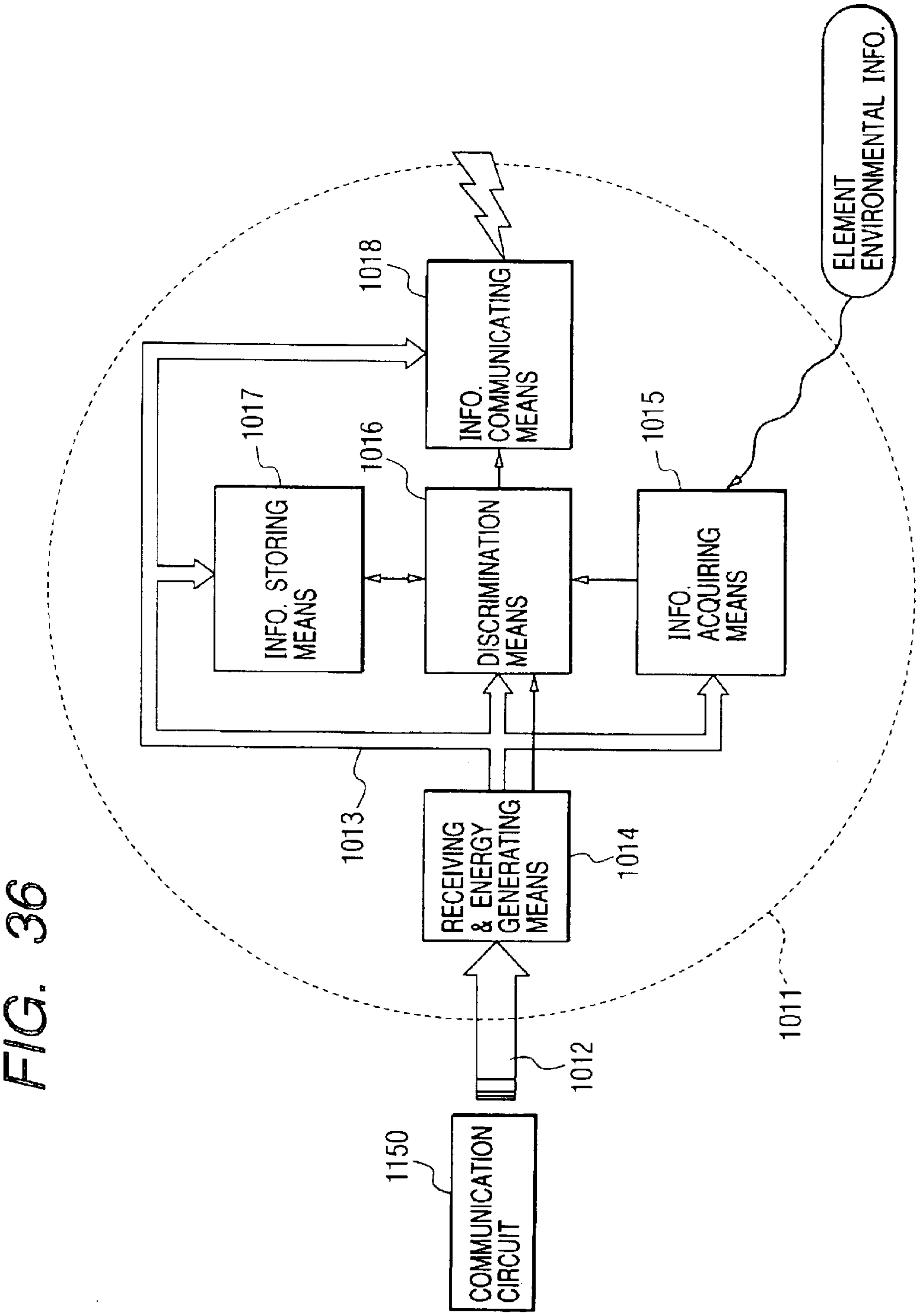
FIG. 36 is a block diagram showing the inner constitution of the solid semiconductor element of the present invention and the exchange of the element with the outside.

FIG. 36 is a block diagram showing the inner constitution of the solid semiconductor element 1011 disposed for each color and the exchange with the outside.

The solid semiconductor element 1011 includes: receiving and energy converting means (oscillation circuit provided with the coil) 1014 for receiving a signal of the electromagnetic wave 1012 transmitted from the communication circuit 1150 in the recording apparatus 1600 and converting the electromagnetic wave 1012 to a power 1013; and information acquiring means 1015, discrimination means 1016, information storing means 1017, and information transmission means 1018 started by the power obtained by the receiving and energy converting means 1014. The receiving and energy converting means 1014, information acquiring means 1015 and information transmission means 1018 are preferably formed on the surface of the element 1011 or in the vicinity of the surface.

The discrimination means 1016 receives the signal of the electromagnetic wave 1012 when the receiving and energy converting means (oscillation circuit provided with the coil) 1014 resonates by the received electromagnetic wave 1012, and does not receive the signal when the means does not resonate. Subsequently, upon receiving of the signal of the electromagnetic wave 1012, the means allows the information acquiring means 1015 to acquire the ink tank inside information (e.g., the ink residual amount, ink color material concentration, pH, temperature, and the like) as the environmental information of the element 1011. The discrimination means compares the acquired tank inside information with the information stored in the information storing means 1017, and judges whether or not it is necessary to transmit the acquired tank inside information to the outside. The information storing means 1017 stores various conditions for comparison with the acquired tank inside information and tank inside information acquired from the information acquiring means 1015. Here, based on the condition set beforehand in the information storing means 1017, the discrimination means 1016 discriminates the need for the tank replacement, for example, when the ink residual amount is 2 ml or less or when the ink pH largely changes.

The information transmission means 1018 converts the power to the energy for transmitting the tank inside information to the outside, and displays/transmits the tank inside information to the outside based on the command of the discrimination means 1016. The magnetic field, light, shape, color, radio wave, sound, and the like can be used as the transmitting energy. For example, when it is judged that the ink residual amount is 2 ml or less, a sound is emitted to transmit the need for tank replacement to the outside. Moreover, the transmission destination is not limited to the communication circuit 1150 of the ink jet recording apparatus, and particularly the light, shape, color, sound, and the like may be transmitted to the human senses of sight and hearing. Furthermore, when it is judged that the raw ink residual amount is 2 ml or less, the sound is emitted. When the ink pH largely changes, light is emitted. The transmission method may be changed in accordance with the information in this manner.

According to the fifth embodiment, the solid semiconductor element having the communication function of responding to the respective color ink tanks with different frequencies is disposed, and the element can individually exchange the information with the desired-color tank.

Moreover, the solid semiconductor element for each color converts the electromagnetic wave from the communication circuit disposed on the recording apparatus main body side to the power for starting the discrimination means, information acquiring means, and information transmission means in the element. Therefore, the electric wiring does not have to be directly connected to the outside, and the element can be used in any position in the object, for example, in the ink in which it is difficult to connect the electric wiring directly to the outside. When the element is disposed in the ink, the ink state can accurately be grasped in real time. Furthermore, it is unnecessary to dispose means (power source in the present example) for storing the electromotive force for operating the element, and the element can therefore be miniaturized and used even in the narrow place.

(Sixth Embodiment)

Another embodiment will next be described. The basic constitution of the solid semiconductor element is similar to the constitution shown in FIG. 36, but the response condition in the communication is different. Therefore, in the description, the same component as that of the fifth embodiment is denoted with the same reference numeral. In the sixth embodiment, different from the fifth embodiment, the frequency to be tuned for the communication is the same with respect to all the elements in the respective color ink tanks (the resonance frequency determined by the winding number, length, and the like of the coil L on the element is the same for the respective color elements). Different digital ID identification functions are imparted to the respective elements in the respective color tanks, the tank of the color for the communication is identified by digital ID, and it is judged whether the communication is enabled or disabled.

Figure 37:
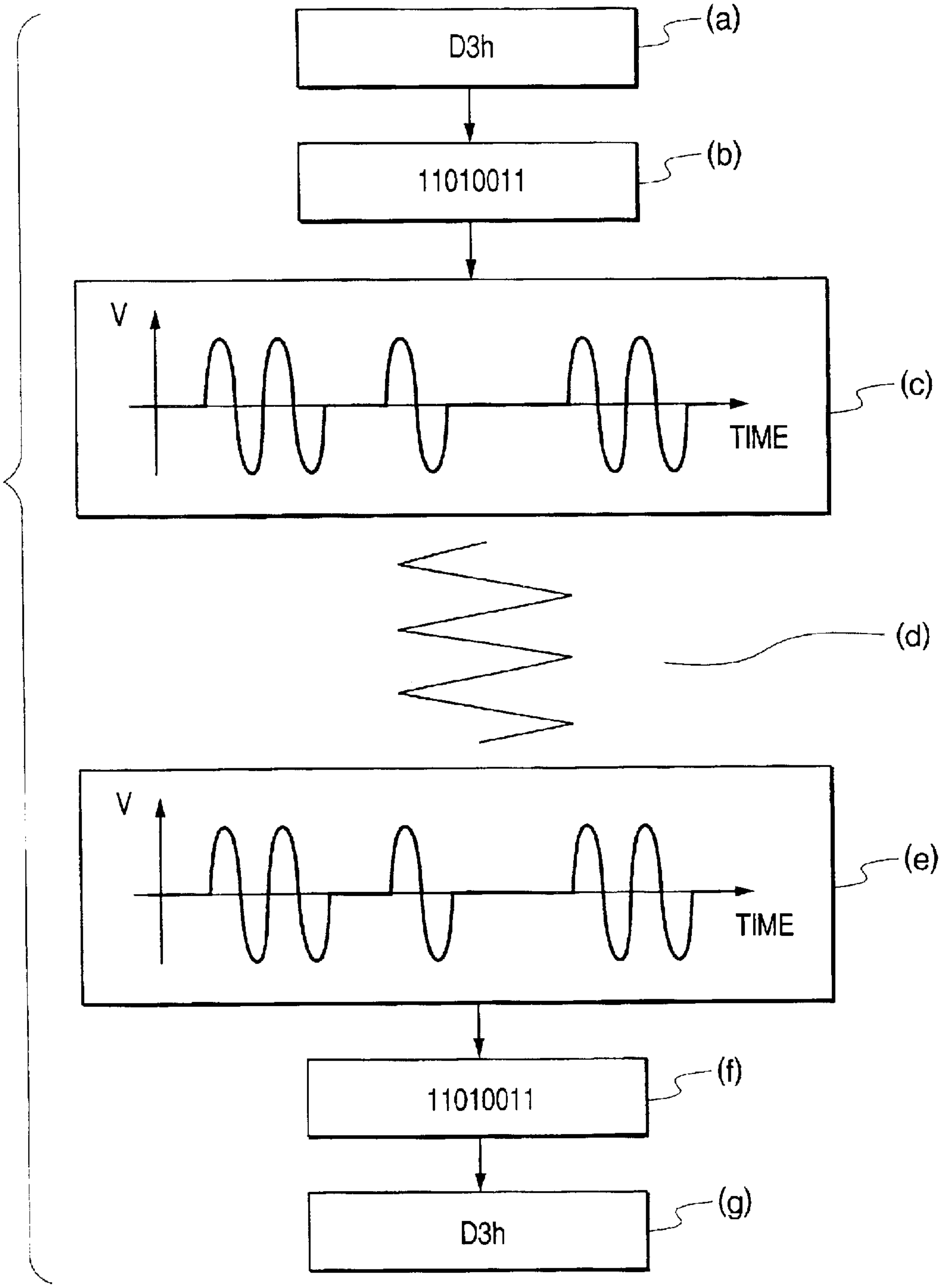
FIG. 37 is an explanatory view of a concept by which digital ID is exchanged between an apparatus main body and the solid semiconductor element in the tank by electromagnetic induction in the ink jet recording apparatus according to a sixth embodiment of the present invention.

FIG. 37 is an explanatory view of a concept by which the digital ID is exchanged between the communication circuit 1150 on the recording apparatus main body side and the solid semiconductor element 1011 by electromagnetic induction. Referring to FIG. 37, first when the digital ID is set to D3h (h is an affix indicating that D3 is a hexadecimal number) (FIG. 37A), the communication circuit 1150 converts this to a binary number "11010011" (FIG. 37B), and a corresponding electromagnetic induced waveform is formed (FIG. 37C). It is assumed that a digital value 1 is a sine wave of one period, and 0 is an output 0. When the communication circuit 1150 transmits the waveform to the solid semiconductor element 1011 by electromagnetic induction (FIG. 37D), the element in the ink tank is tuned and obtains the similar waveform with the coil L on the element 1011 (FIG. 37E). The element 1011 converts the waveform to a digital binary number string by a comparator circuit, and the like (FIG. 37F), and can obtain D3h as the digital ID (FIG. 37G).

Figure 38:
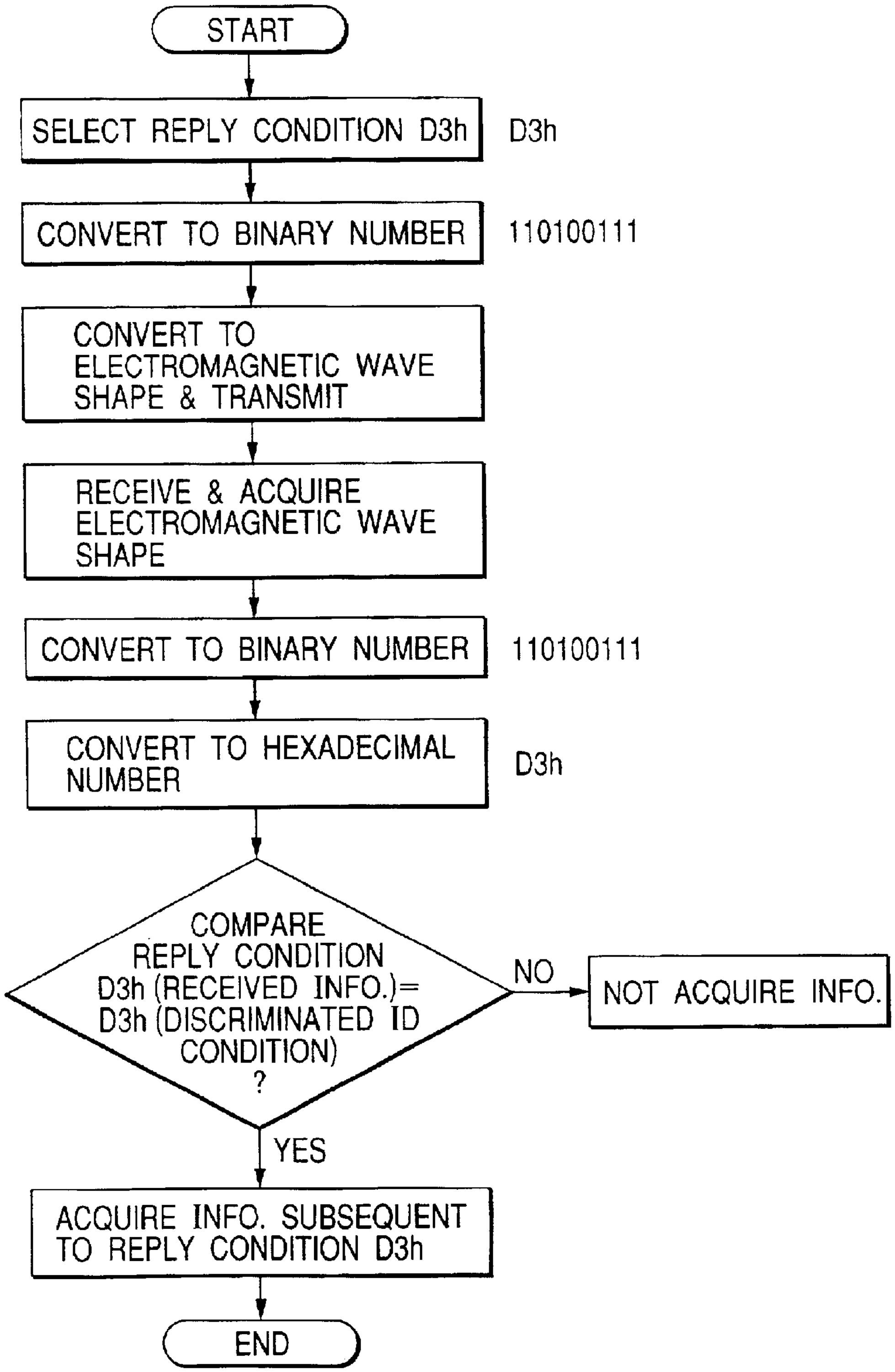
FIG. 38 is a diagram showing an operation flow for using the exchange of the digital ID shown in FIG. 37 to acquire tank inside information of a specific color.

FIG. 38 shows an operation flow for using the exchange of the digital ID to acquire the tank inside information of the specific color. First, when the ID of the response condition of the ink tank for the communication (D3h as the digital ID in this case) is selected, the communication circuit 1150 converts the ID to a binary number arrangement by a shift register (not shown) or the like, converts the arrangement to the corresponding electromagnetic waveform and transmits the waveform. During the conversion, for example, the binary number arrangement is multiplied by the sine wave of the same period in AND gate. The solid semiconductor element 1011 acquires the same waveform as the transmitted electromagnetic induction waveform with the coil. The waveform is converted to a binary number, and a hexadecimal number is then obtained by a converter disposed in the discrimination means 1016 of the solid semiconductor element 1011.

Subsequently, the discrimination means 1016 compares the acquired ID of hexadecimal number with the identification ID of hexadecimal number pre-stored in the information storing means 1017. When the compared IDs agree with each other, the information subsequent to the ID is received. In case of disagreement, the information is not accepted.

When the information is accepted as described above, the discrimination means 1016 allows the information acquiring means 1015 to acquire the ink tank inside information (e.g., the ink concentration, residual amount, physical property, and the like) as the environmental information of the element 1011 in accordance with the accepted information as shown in FIG. 36. The discrimination means compares the acquired tank inside information with the information stored in the information storing means 1017, and judges whether the acquired tank inside information needs to be transmitted to the outside. The information transmission means 1018 converts the power to the energy for transmitting the tank inside information to the outside by the command of the discrimination means 1016, and displays/transmits the tank inside information to the outside.

According to the sixth embodiment, the solid semiconductor element having the communication function for a response with the communication protocol using the different ID identification for the respective color ink tanks is disposed. Therefore, similarly as the first embodiment, the element can individually exchange the information with the desired color tank. Moreover, the power for starting the circuit in the element can be supplied in the non-contact manner, and therefore the element can be used even in the ink in which wiring is difficult.

Furthermore, since each color ink tank is identified by the digital ID in the sixth embodiment, a large number of types of tanks can be handled as compared with the constitution of the fifth embodiment.

Additionally, the detection of the ink type stored in the ink tank will be described as one constitution example in which the aforementioned solid semiconductor element is utilized.

Figure 39:
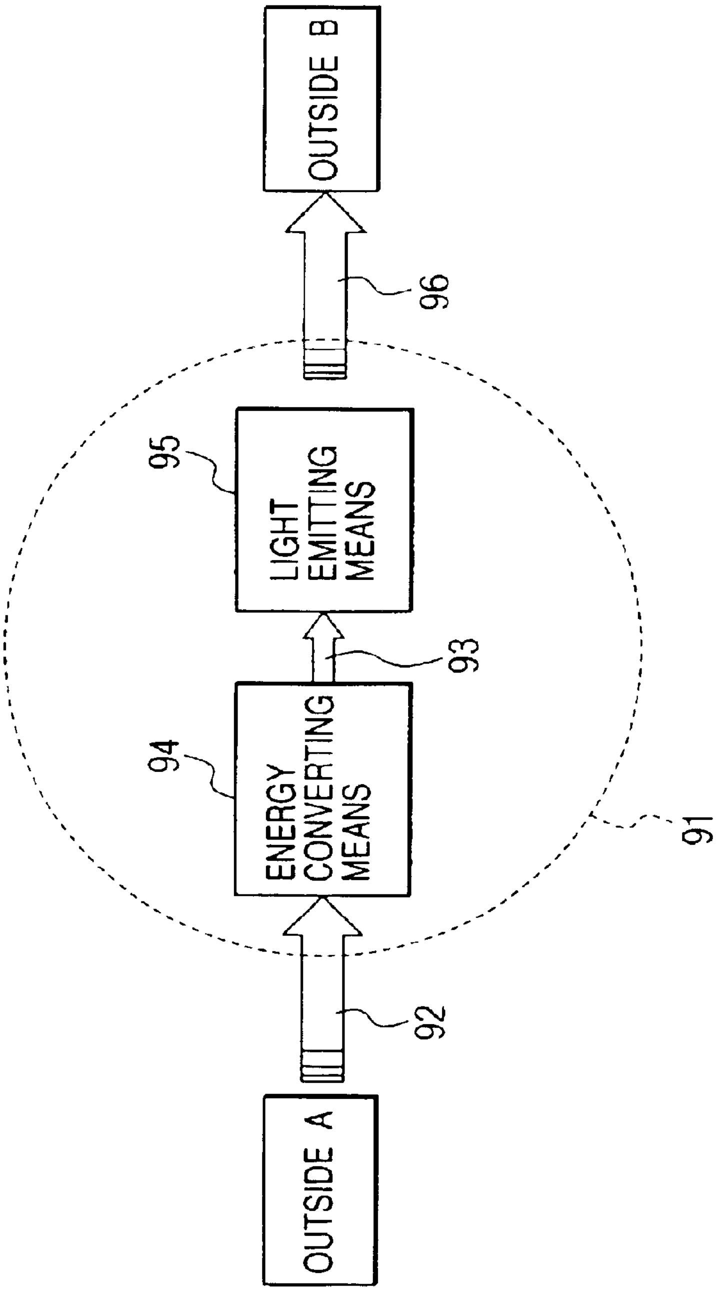
FIG. 39 is a block diagram showing the inner constitution of the solid semiconductor element according to one embodiment of the present invention and the exchange of the element with the outside.

FIG. 39 is a block diagram showing the inner constitution of the solid semiconductor element according to one embodiment of the present invention and the exchange with the outside. A solid semiconductor element 91 shown in FIG. 39 comprises: energy converting means 94 for converting an electromotive force 92 as the outside energy supplied to the element 91 from the outside A in the non-contact manner to a power 93; and light emitting means 95 for using the power obtained by the energy converting means 94 to emit light. The element is disposed in the ink in the ink tank. The light emitting means 95 is constituted of the photodiode, and the like.

Additionally, the electromagnetic induction, heat, light, ray, and the like can be applied as the electromotive force supplied to operate the element. Moreover, the energy converting means 94 and light emitting means 95 are preferably formed on the element surface or in the vicinity of the surface.

In this embodiment, when the electromotive force 92 is applied to the element 91 from the outside A, the energy converting means 94 converts the electromotive force 92 to the power 93, and the light emitting means 95 uses the power 93 to emit light 96. A strength of the light 96 emitted from the light emitting means 95 is detected by the outside B.

Moreover, in the method of supplying the outside energy, for use in the ink jet recording apparatus, the means for supplying the electromotive force to the element as the outside energy may be disposed in the recovery position, return position, carriage, recording head, and the like. Additionally, when the apparatus including the electromotive force supplying means is used, the ink tank inside state can be known without the ink jet recording apparatus. For example, the element may be used for a test purpose in a plant, store, and the like (quality control).

Figure 40:
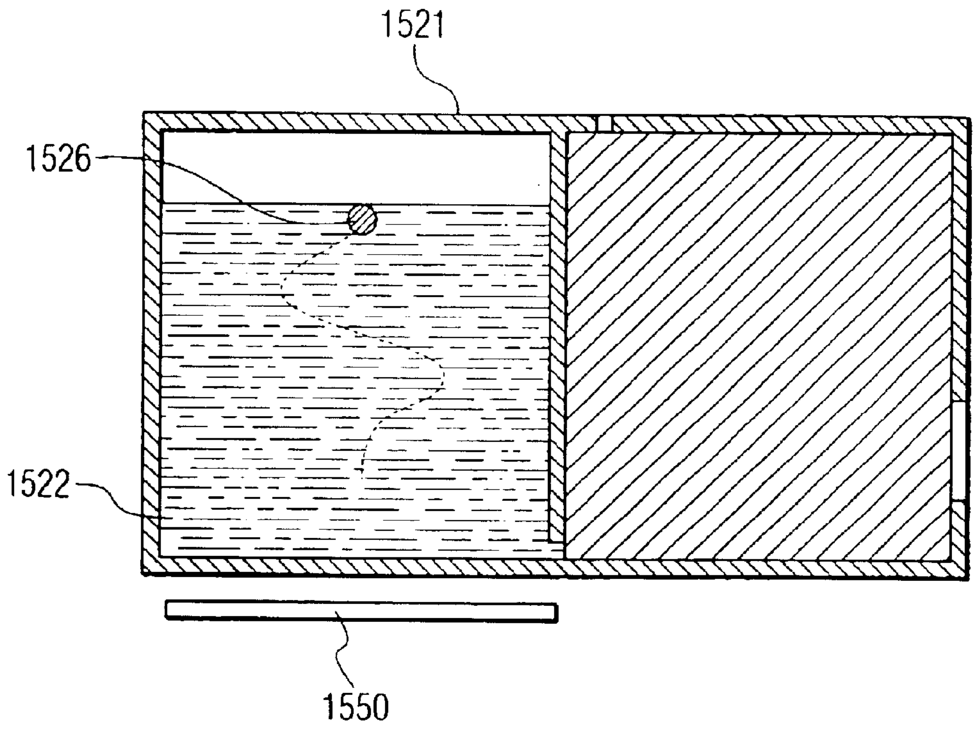
FIG. 40 is a schematic constitution diagram of the ink tank using the solid semiconductor element of the present invention.

FIG. 40 is a schematic constitution diagram of the ink tank using the solid semiconductor element of the present invention. A solid semiconductor element 1526 shown in FIG. 40 floats in the vicinity of the liquid surface of a raw ink 1522 in an ink tank 1521. An electromotive force is induced by an outside resonance circuit (not shown) disposed outside the ink tank 1521 by electromagnetic induction. The photodiode disposed in the vicinity of the solid semiconductor element 1526 is driven to emit light. The light is transmitted through the ink 1522 and received by an outside light sensor 1550 of the ink tank 1521.

Figure 41:
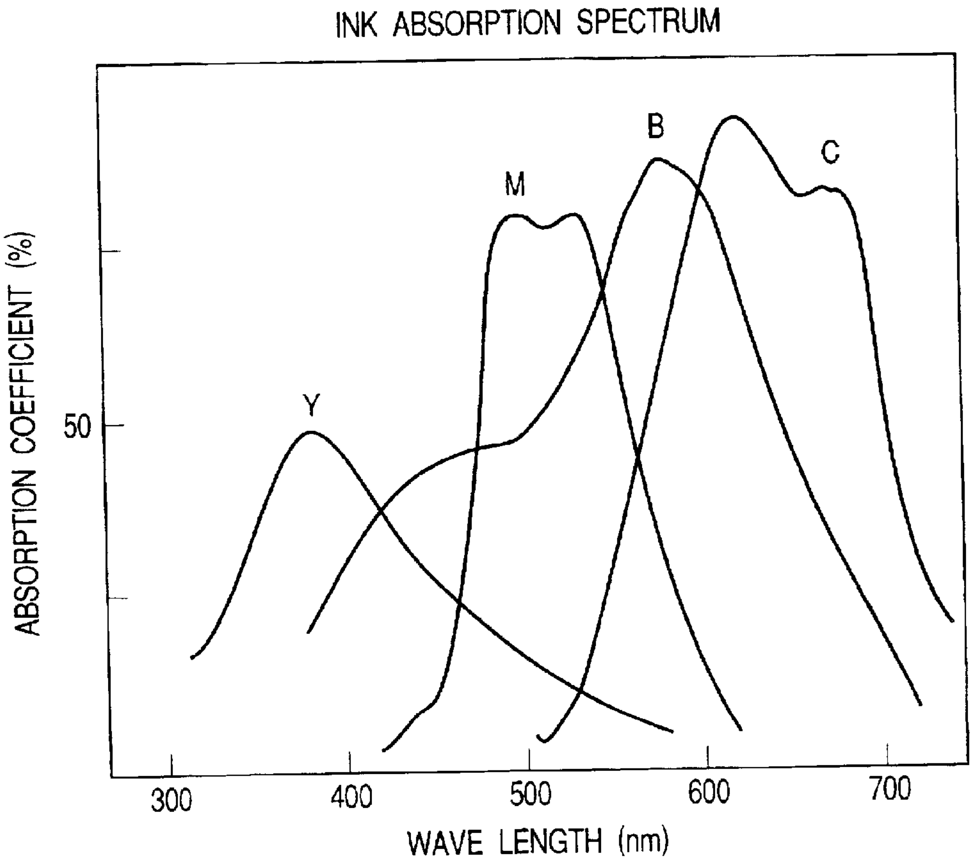
FIG. 41 is a graph showing an absorption wavelength of an representative ink (yellow, magenta, cyan, black).

FIG. 41 shows an absorption wavelength of an representative ink (yellow (Y), magenta (M), cyan (C), black (B)). As seen from FIG. 41, in the respective yellow, magenta, cyan, and black color inks, absorption coefficient peaks are dispersed in a wavelength band of 300 to 700 nm. The peak of the absorption coefficient of a yellow ink is about 390 nm, that of a magenta ink is about 500 nm, that of a black ink is about 590 nm, and that of a cyan ink is about 620 nm. Therefore, the light including the wavelength in a range of 300 to 700 nm is emitted from the solid semiconductor element, transmitted through the ink, and received by the light sensor 1550 (see FIG. 40) disposed outside the ink tank. Then, the most absorbed wavelength is detected, and the color of the ink through which the light is transmitted can be identified.

Moreover, as seen from FIG. 41, the respective yellow, magenta, cyan and black inks are clearly different from each other in the absorption coefficient in a wavelength of 500 nm. For the absorption coefficient of the respective color inks in the wavelength of 500 nm, magenta has about 80%, black about 50%, yellow about 20%, and cyan about 5%. Therefore, the ratio of the strength of the ink transmitted light (transmittance) to the strength of light emitted by the solid semiconductor element with respect to the light having the wavelength of 500 nm is detected, and therefore the color of the ink through which the light is transmitted can be identified.

Additionally, in any case, when one type of the solid semiconductor element is disposed in the different ink tanks, a plurality of ink types can be distinguished.

Moreover, in the ink jet recording apparatus, a plurality of respective ink tanks are attached to predetermined positions in accordance with the ink type contained in each ink tank. This constitution may include means for issuing a warning to the user when the light sensor 1550 having received the light transmitted through the ink in the ink tank detects that the ink tank is attached to an inappropriate position. In this case, examples of the warning means include light emitting means such as a lamp, sounding means such as a buzzer, and the like. The user can be informed by the warning of the warning means that the ink tank is attached to the incorrect position, and can again attach the ink tank to the original position.

Alternatively, the ink jet recording apparatus may include control means for controlling the recording head with the ink supplied thereto from the attached ink tank in accordance with the ink type, when the light sensor having received the light transmitted through the ink in the ink tank detects the attachment of the ink tank to the inappropriate position. In this case, even when the user attaches the ink tank to the wrong position, an image is automatically and appropriately recorded. Therefore, the user does not have to pay attention to the attachment position of the ink tank.

As described above, the solid semiconductor element of the present invention includes the energy converting means for converting the energy from the outside to the different type of energy, and light emitting means for emitting light by the energy converted by the energy converting means. Therefore, the light emitted from the solid semiconductor element is transmitted through the ink, the strength of the transmitted light in the certain wavelength is detected, and thereby the ink type can be identified.

According to the present invention, the solid semiconductor element has a communication function of acquiring the environmental information and transmitting the information to the outside, only when the signal of the electromagnetic wave from the outside meets the predetermined response condition. Therefore, the environmental information for each element can independently be obtained. Moreover, since the information can three-dimensionally be acquired/transmitted, as compared with the use of the planar semiconductor element, little restriction is imposed on the information transmission direction. Therefore, the environmental information can efficiently be acquired and transmitted to the outside.

Moreover, when at least one solid semiconductor element is disposed in the ink tank, the information about the ink contained in the ink tank, pressure in the tank, and the like can be transmitted, for example, to the ink jet recording apparatus disposed outside in real time. This is advantageous in controlling the negative pressure amount in the tank which changes with the ink consumption every moment, and in stabilizing the ink ejection.

Particularly when the respective solid semiconductor elements are disposed in a plurality of ink tanks, and only when the signal of the received electromagnetic wave meets the predetermined response condition, the information is acquired in response to the received signal. The discriminated result of comparison with the stored information can be transmitted to the outside together with the acquired information. When the response condition is changed for each tank, the information for each ink tank can independently be obtained. Therefore, the user can replace the ink tank in which the ink is used up without any mistake.

Furthermore, the power for operating the solid semiconductor element is supplied to the element in the non-contact manner. In this constitution, it is unnecessary to dispose the power source for starting the element in the ink tank, or to connect the power supplying wiring to the element. The element can be used in the place where it is difficult to directly connect the wiring to the outside. Moreover, since the element functions in the vicinity of the tank in the non-contact manner, the element can handle a plurality of colors in one position. Moreover, the information can be transmitted even during printing.

For example, the conductor coil of the oscillation circuit is wound around the outer surface of the solid semiconductor element, and the power is generated in the conductor coil by electromagnetic induction with the outside resonance circuit, so that the power can be supplied to the element in the non-contact manner.

In this case, since the coil is wound around the element outer surface, the size of inductance of the coil changes in accordance with the ink residual amount, ink concentration, and ink pH in the ink tank. Therefore, since the oscillation circuit can change the oscillation frequency in accordance with the inductance change, the ink residual amount in the ink tank, and the like can also be detected based on the changed oscillation frequency.

Moreover, since the solid semiconductor element has the hollow portion for floating in the liquid and the gravity center of the element is positioned below the center of the element, for example, the recording head and ink tank mounted on the ink jet recording apparatus serially operate. Even when the ink in the ink tank vertically and horizontally rocks, the element floats steadily in the ink in the ink tank, and the information about the ink, pressure in the tank, and the like can precisely be detected. Additionally, the coil of the oscillation circuit formed on the element is held in the stable position with respect to the coil of the outside resonance circuit, and stable bidirectional communication is also constantly enabled.

A constitution in which the solid semiconductor element is utilized as inner pressure adjustment means of the ink tank will next be described.

(Seventh Embodiment)

A seventh embodiment of the ink tank of the present invention will next be described. Here, in a constitution example, the ink can be supplied to the outside via the ink supply port of an ink tank having a double chamber structure as shown in FIG. 6 with high reliability.

In the ink tank having the double chamber structure shown in FIG. 6, as described above, while the ink is supplied via the ink supply port 53, first the ink is isotropically consumed from the negative pressure generating member of the negative pressure generating chamber 51 with respect to the ink supply port 53. When the ink surface reaches the connection path **50*b*, the atmosphere having entered the negative pressure generation chamber 51 flows into the ink chamber 52 via the connection path 50*b*. The corresponding amount of ink is introduced into the negative pressure generation chamber 51 from the ink chamber 52, and the ink in the ink chamber 52 is consumed instead of consuming the ink in the negative pressure generating member. Since the ink surface hardly changes in the negative pressure generating member in this state (hereinafter referred to also as "during gas-liquid exchange"), the negative pressure amount becomes constant with respect to the ink jet head, and the ink jet head can constantly be operated with a stable ejection amount. However, when the ink consumption amount from the ink supply port 53 is larger than the ink supply amount to the negative pressure generation chamber 51 from the ink chamber 52 during gas-liquid exchange, an ink path between the ink chamber 52 and the ink supply port 53 of the negative pressure generation chamber 51 is interrupted, or the negative pressure generation chamber 51 cannot be refilled with a sufficient amount of ink in some case. This problem is solved by changing the material of the negative pressure generating member around the ink supply port 53 to a material having an ink absorption force higher than that of a place other than the periphery of the ink supply port 53 (e.g., PP pressed material). However, in this measure, it is impossible to expect the occurrence of the problem and momentarily (digitally) handle the problem. Therefore, there is a demand for a function of momentarily handling the problem when the occurrence of the problem is expected. Therefore, an ink tank having the double chamber structure similar to that of FIG. 6** and having such inventive function is proposed here.

Figure 42:
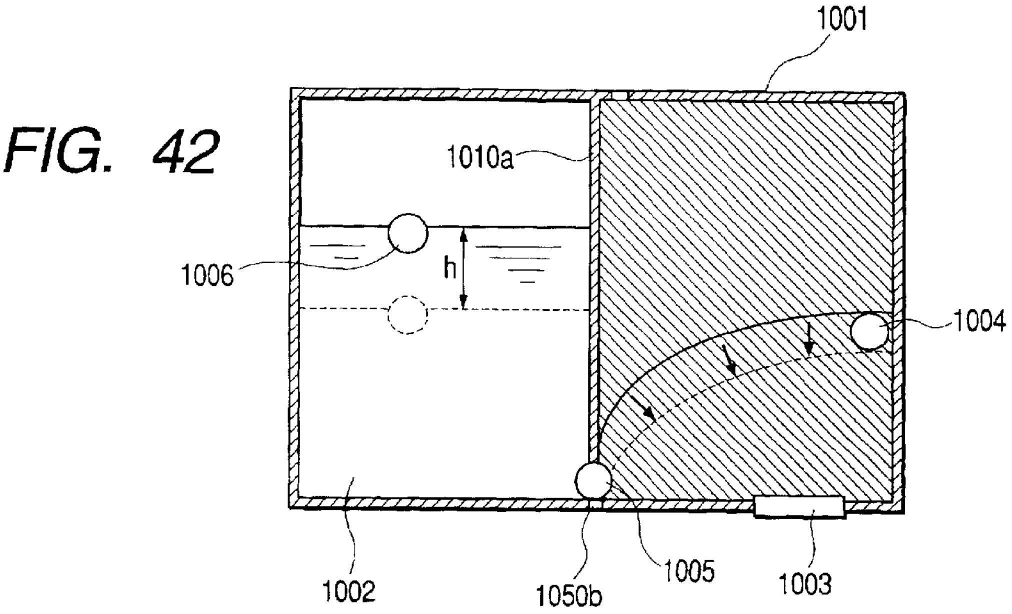
FIG. 42 is a schematic sectional view showing a seventh embodiment of the ink tank of the present invention.

FIG. 42 is a schematic sectional view showing the seventh embodiment of the ink tank of the present invention. In the ink tank having the double chamber structure (similarly as FIG. 6) shown in FIG. 42, a solid semiconductor element 1004 (first monitor means) having a pressure sensor (pressure detecting means) for detecting the pressure fluctuation is disposed in a negative pressure generation chamber 1001. A solid semiconductor element 1005 (flow rate adjustment apparatus) having an open/close valve is disposed in a connection path 1050*b*, receives a pressure signal from the solid semiconductor element 1004, and adjusts a flow rate of connection path 1050*b* by the open/close valve. Additionally, the solid semiconductor element 1004 needs to be disposed on a limit line at which ink shortage occurs (gas-liquid interface shown by a dotted line in FIG. 42) in order to prevent the ink shortage beforehand. Reference numeral 1010*a* denote a partion wall.

Moreover, the first or second embodiment (constitution of FIG. 3 or FIG. 11) can be applied to the solid semiconductor element 1004. In this case, the information acquiring means in the element 1004 is a pressure sensor. On the other hand, the solid semiconductor element 1005 can be constituted by replacing the information transmission means of the second embodiment (constitution of FIG. 11) with the open/close valve and omitting the information acquiring means. The solid semiconductor element of the second embodiment is utilized as an open/close valve apparatus disposed in the connection path 1050*b* in this manner. However, the valve apparatus is not limited to the solid semiconductor element, as long as the valve apparatus can adjust the flow rate of the connection path in the non-contact manner without any power source in the present invention.

Furthermore, a solid semiconductor element 1006 (second monitor means) having control means for detecting the ink residual amount and fully opening the open/close valve of the element 1005 when the amount drops to a given amount level is floated on the ink surface in the ink chamber 1002 if necessary. The method of detecting the ink residual amount and generating the buoyancy by the solid semiconductor element 1006 can be the same as that of the first embodiment.

Furthermore, it is considered that the solid semiconductor elements 1004, 1005, 1006 are started by the induced electromotive force described with reference to FIG. 5.

An ink supply operation by the ink tank of the seventh embodiment will next be described.

Referring to FIG. 42, the liquid surface of the negative pressure generation chamber 1001 drops to the limit line (dotted line of FIG. 42) below which an ink path is possibly interrupted during the gas-liquid exchange, and then the solid semiconductor element 1004 moves above the liquid surface and is exposed to the atmosphere. A state in which the liquid is present in the negative pressure generating member around the element 1004 changes to a state in which the liquid is eliminated, and then the pressure fluctuation is caused. The pressure sensor of the element detects the pressure fluctuation, and the state in which the ink path to an ink supply port 1003 from the ink chamber 1002 is interrupted can be detected beforehand. Subsequently, the solid semiconductor element 1004 transmits pressure fluctuation information obtained by the pressure sensor to the solid semiconductor element 1005 of the connection path 1050*b*.

The solid semiconductor element 1005 receives the pressure fluctuation information from the element 1004, and controls the open/close valve in accordance with the pressure fluctuation information. That is, when the liquid surface of the negative pressure generation chamber 1001 drops to the limit line having a possibility of occurrence of ink path interruption, the open/close valve of the element 1005 of the connection path 1050*b* is further opened, and the ink supply amount to the negative pressure generation chamber 1001 from the ink chamber 1002 is increased. Moreover, the pressure value of the periphery of the element 1004 is obtained by the pressure sensor, and it can be judged by the value that the liquid surface returns to the state having no occurrence of ink path interruption. In this case, the open/close valve of the solid semiconductor element 1005 of the connection path 1050*b* is closed, and the normal flow rate is obtained.

As described above, in the ink tank having the double chamber structure equal to that of FIG. 3, the function of detecting the possibility of interruption of the ink path to the ink supply port 1003 of the negative pressure generation chamber 1001 from the ink chamber 1002 and momentarily preventing the interruption can be disposed.

Additionally, when the solid semiconductor element 1006 is disposed in the ink chamber 1002, the solid semiconductor element 1005 receives the ink residual amount information in the ink chamber 1002 obtained by the solid semiconductor element 1006, and controls and fully opens the open/close valve upon discriminating the ink residual amount of the given amount level or less. Thereby, even when the ink residual amount in the ink chamber 1002 decreases, the sufficient supply amount to the negative pressure generation chamber 1001 can be secured. There can be provided the double chamber structure tank with a higher reliability of ink supply.

The detection of the ink residual amount in the ink chamber 1002 by the solid semiconductor element 1006 is not limited to the method of utilizing the change of the amplitude value in the resonance frequency range in accordance with the distance between the element and the outside resonance circuit as described in the first embodiment. That is, another method may comprise: disposing the pressure sensor for detecting the pressure of the ink chamber 1002 in the solid semiconductor element 1006; detecting an initial pressure $P_o$ in the ink chamber 1002 before the liquid is consumed in the ink chamber 1002 and pressure P of a certain point at which the liquid of the ink chamber 1002 is consumed, and obtaining a pressure loss h (see FIG. 42); and transmitting the information of pressure loss h to the solid semiconductor element 1005. The pressure loss h is obtained by $h=(P_o-P)/\rho g$ (here, ρg denotes the specific weight of the solid semiconductor element). An upper limit value of the pressure loss is set in accordance with respective recording head specifications (e.g., nozzle number, ejection amount, drive frequency, size between the ink tank and the recording head ink supply port, and the like). When the upper limit value is exceeded during use of the recording head, an emergency signal is transmitted to the recording head and recording apparatus from the solid semiconductor element of the present invention. Thereby, the drive signal for controlling the image data and recording head is stopped from being transferred to the recording head from the recording apparatus, and thereby the image can be prevented from being deteriorated because of ink supply shortage to the recording head.

<Open/Close Valve>

One concrete structure example of the open/close valve in the seventh embodiment will be described together with manufacturing steps.

Figure 43:
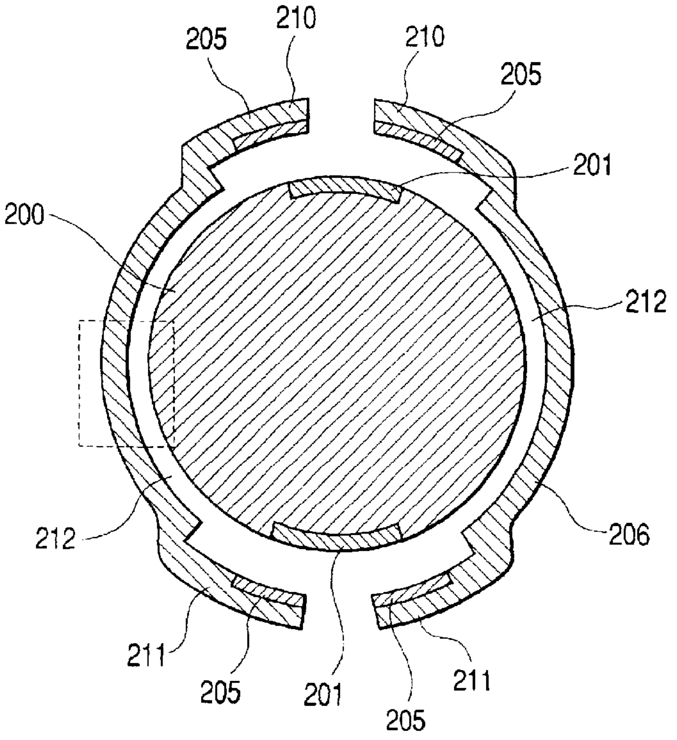
FIG. 43 is an explanatory view of one example of the pressure valve structure of the solid semiconductor element disposed in the connection path of the ink tank of FIG. 42.

FIG. 43 is an explanatory view of one example of the solid semiconductor element in which the open/close valve of the seventh embodiment is formed. The element is formed in spherical silicon for use in the ball semiconductor. FIGS. 44A to 44G are explanatory views of the manufacturing steps of the pressure adjustment means shown in FIG. 43. Additionally, FIGS. 43 and 44 show sections taken along the center of the spherical silicon.

As shown in FIG. 43, base electrodes 201 are formed in two opposite portions of the spherical silicon 200. Moreover, an SiN film 206 is formed to surround the spherical silicon 200. The Sin film 206 constitutes movable portions 210, 211 in which portions disposed opposite to the base electrodes 201 are supported in a cantilever manner at an interval from the surface of the spherical silicon 200. Valve electrodes 205 are disposed opposite to the base electrodes 201 in the respective movable portions 210, 211. Moreover, in a portion extending to the other base electrode 201 from one base electrode 201, the SiN film 206 is formed at an interval from the spherical silicon 200. This portion forms a path 212 in which gas can circulate between one movable portion 210 and the other movable portion 211.

A method of manufacturing the open/close valve shown in FIG. 43 will next be described with reference to FIGS. 44A to 44G.

Figure 44A:
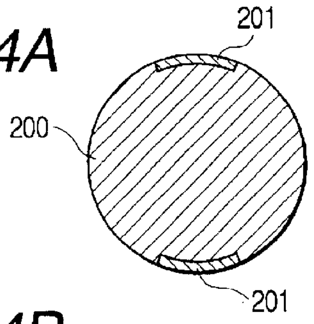
FIGS. 44A, 44B, 44C, 44D, 44E, 44F and 44G are explanatory views of manufacturing steps of the pressure valve shown in FIG. 43.
Figure 44B:
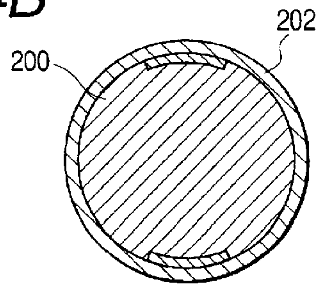
Figure 44C:
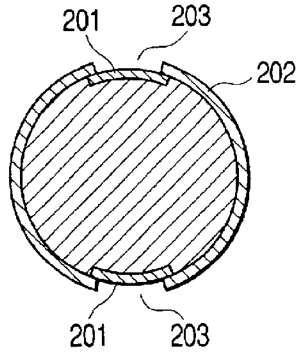

First, as shown in FIG. 44B, a phospho silicate glass (PSG) film 202 is formed on the whole surface of the spherical silicon 200 shown in FIG. 44A. Additionally, the base electrodes 201 are formed beforehand in two opposite portions symmetrical with each other via the center of the spherical silicon 200, before the PSG film 202 is formed. Thereafter, as shown in FIG. 44C, the photolithography process is used to pattern the PSG film 202 excluding a portion forming the path, in order to form at least an opening 203 for exposing the base electrode 201 in the PSG film 202, and to form the path described later.

Figure 44D:
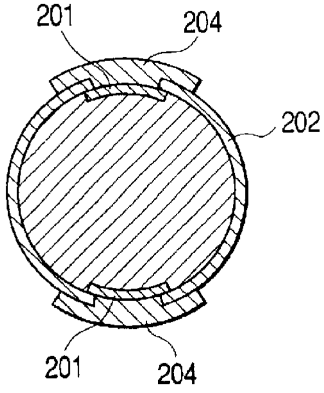
Figure 44E:
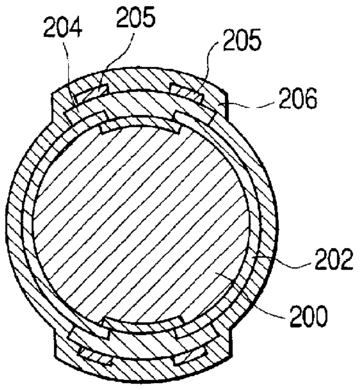

Subsequently, as shown in FIG. 44D, a Cu film 204 is formed to coat the base electrode 201 and PSG film 202 by a metal CVD process, and removed leaving upper and peripheral portions of the base electrode 201. Thereafter, as shown in FIG. 44E, the valve electrode 205 is formed in a portion which is to form the movable portion on the Cu film 204. Furthermore, PECVD process is used to form an SiN film 206 on the whole periphery of the spherical silicon 200, so that the PSG film 202, Cu film 204 and valve electrode 205 are coated.

Figure 44F:
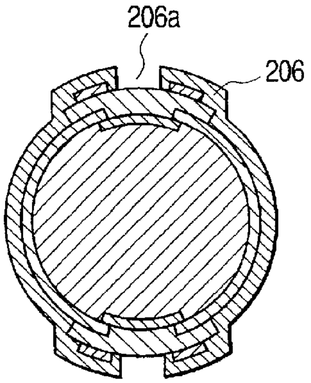
Figure 44G:
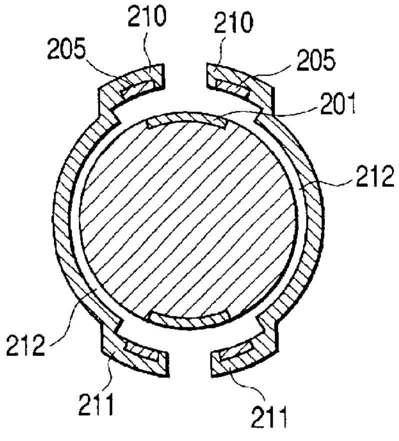
Figure 45:
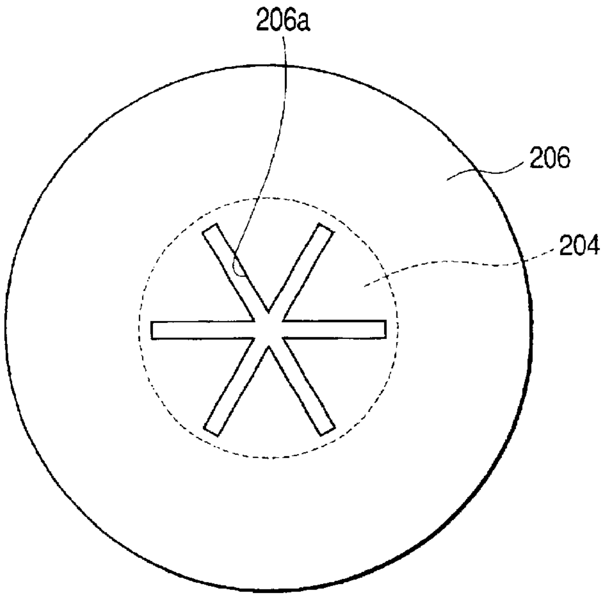
FIG. 45 is a plan view of the solid semiconductor element in a state shown in FIG. 44F.

Furthermore, as shown in FIG. 44F, the SiN film 206 is patterned in a movable portion shape. A schematic plan view of the element in this stage is shown in FIG. 45. The SiN film 206 is patterned, and as shown in FIG. 45, radial slits 206*a* are formed in the Cu film 204 on the SiN film 206. Subsequently, the Cu film 204 and PSG film 202 are appropriately dissolved by a solvent and removed. Thereby, as shown in FIG. 44G, the solid semiconductor element is obtained. In the element, a plurality of movable portions 210, 211 acting as valves are disposed in two upper and lower portions, and supported at an interval from the spherical silicon 200. Moreover, a space between the upper movable portion 210 and the spherical silicon 200 is connected to a space between the lower movable portion 211 and the spherical silicon 200 via a plurality of paths 212.

When the solid semiconductor element is disposed in the ink tank connection path 1050*b* shown in FIG. 42, one movable portion 210 is positioned on the ink chamber 1002 side of the ink tank shown in FIG. 42, and the other movable portion 211 is positioned on the negative pressure generation chamber 1001 side of the ink tank of FIG. 42.

A method of adjusting the ink supply amount in the ink tank with the solid semiconductor element having the open/close valve attached thereto will next be described with reference to FIGS. 43, 46 and 47.

Figure 46:
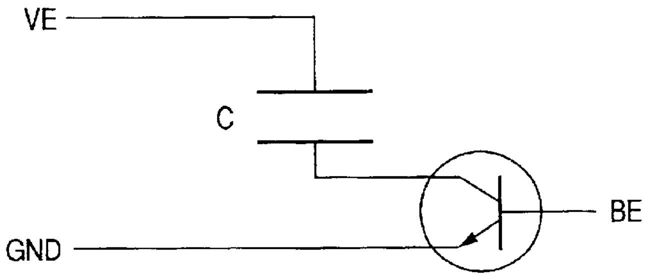
FIG. 46 is an equivalent circuit diagram of an electric constitution of the pressure valve shown in FIG. 43.

FIG. 46 is an equivalent circuit diagram of an electric constitution of the open/close valve shown in FIG. 43. As clearly seen from FIG. 46, a capacitor C is constituted between the valve electrode (VE) and base electrode (BE) disposed opposite to each other.

Figure 47:
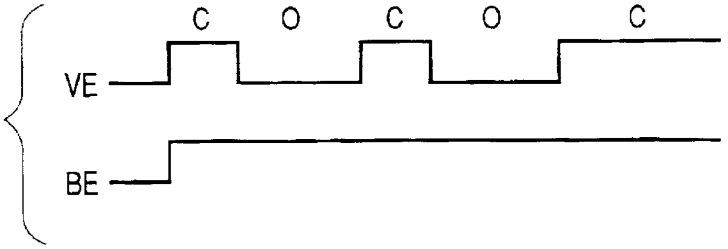
FIG. 47 is a timing chart of one example of an applied signal to a valve electrode and base electrode in the pressure valve shown in FIG. 46.

Moreover, FIG. 47 is a timing chart of one example of an applied signal to the valve electrode (VE) and base electrode (BE) in the pressure adjustment means shown in FIG. 46. In FIG. 47, C denotes close, and O denotes open.

First, the base electrode 201 and valve electrode 205 are set to GND level. Subsequently, a high level signal is applied to the base electrode 201, and further to the valve electrode 205. Thereby, an electrostatic attracting force acts between the valve electrode 205 and base electrode 201. Since the valve electrode 205 is attracted to the base electrode 201, as a result, the movable portions 210, 211 disposed in opposite ends of the path 212 are displaced toward the spherical silicon 200 to contact the spherical silicon 200, and the opposite ends of the path 212 are closed excluding gaps formed by the slits 206*a*. When the high level signal is applied to all the valve electrodes 205 of the movable portions 210, 211 in the opposite ends of the path 212, outlet/inlet ports of all the paths 212 are minimized.

This state is regarded as an initial state. When the flow rate is increased, a low level signal is applied to the valve electrodes 205 of the movable portions 210, 211 in the opposite ends of the desired number of paths 212. Thereby, the movable portions 210, 211 are detached from the spherical silicon 200, and the outlet/inlet ports of the path 212 largely open. The flow rate can be adjusted in accordance with the number of open paths. Moreover, when the flow rate is again reduced, the high level signal is applied again to the valve electrode 205 to displace the movable portions 210, 21 and close the paths 212. Even in this case, the flow rate to be reduced can be adjusted by the number of closed paths.

As described above, according to the present invention, there is provided the double chamber structure liquid container in which a closed liquid container chamber is connected to an absorber container chamber partially connected to the atmosphere, via the connection path in the bottom surface of the container, and the supply port to the liquid ejection head is disposed in the absorber container chamber. In the container, at least one element in which the function of acquiring the information about the liquid (ink) and function of transmitting the acquired information to the outside are formed is disposed. The information about the liquid can efficiently be acquired and transmitted to the outside. Particularly, the driving of the recording apparatus, ink supply amount, and the like are controlled based on the information acquired by the solid semiconductor element, and high-quality recording can be achieved.

What is claimed is:

1. A liquid container in which an ink to be supplied to a liquid ejection head for ejecting a liquid droplet is contained, comprising:

a first chamber which is partially connected to atmosphere and in which an absorber for absorbing a liquid is contained;

a second chamber which is closed from the outside and in which said liquid is contained;

a connection path, disposed in the vicinity of a bottom portion of the container, for connecting said first chamber to said second chamber;

a supply port which is disposed in said first chamber, and via which the liquid is supplied to said liquid ejection head;

first monitor means, disposed in said first chamber, for monitoring a liquid amount of said first chamber, said first monitor means comprising a first solid semiconductor element which includes: at least pressure detection means for detecting a pressure fluctuation of the liquid; information communicating means for transmitting pressure information obtained by the pressure detection means; and energy converting means for converting an energy applied from the outside to an energy different from said applied energy to operate said pressure detection means and said information communicating means; and a flow rate adjustment apparatus, disposed in said connection path, for adjusting a flow rate of said connection path in accordance with information from the first monitor means, wherein said flow rate adjustment apparatus is a second solid semiconductor element comprising: at least receiving means for receiving the pressure information transmitted from said first monitor means; an open/close valve which operates in response to said received pressure information; and energy converting means for converting an energy applied from the outside to an energy different from said applied energy to operate said receiving means and said open/close valve.

2. The liquid container according to claim 1, wherein second monitor means for monitoring the liquid amount of said second chamber is disposed in said second chamber, and said flow rate adjustment apparatus is controlled in accordance with the information from the second monitor means.

3. The liquid container according to claim 1, wherein said first solid semiconductor element is disposed above a liquid surface of said first chamber when a liquid supply to said first chamber from said second chamber is possibly interrupted, and in a position in which a pressure fluctuation can be detected.

4. The liquid container according to claim 1, wherein said second monitor means is a third solid semiconductor element comprising: at least residual amount detection means for detecting a liquid residual amount; information communicating means for transmitting residual amount information obtained by the residual amount detection means to said flow rate adjustment apparatus; and energy converting means for converting an energy applied from the outside to an energy different from said applied energy to operate said residual amount detection means and said information communicating means.

5. The liquid container according to claim 4, wherein said solid semiconductor element floats on a liquid surface or in the liquid.

6. The liquid container according to claim 5, wherein a gravity center of the solid semiconductor element floating in the liquid is positioned below a center of the element, and the floating element rocks stabily without rotating in the liquid.

7. The liquid container according to claim 6, wherein a metacenter of the solid semiconductor element is constantly positioned above the gravity center of the solid semiconductor element.

8. A liquid ejection recording apparatus comprising:

a liquid ejection head for ejecting a recording liquid droplet; and the liquid container according to any one of claims 1, 2, 3, 4, 5 in which the liquid to be supplied to the liquid ejection head is contained.

9. The liquid ejection recording apparatus according to claim 8, wherein said liquid ejection head utilizes a film boiling caused when the heat energy is applied to the liquid to eject the liquid droplet via a nozzle.

* * * * *